US011911842B2

United States Patent
Donofrio et al.

(10) Patent No.: US 11,911,842 B2
(45) Date of Patent: *Feb. 27, 2024

(54) LASER-ASSISTED METHOD FOR PARTING CRYSTALLINE MATERIAL

(71) Applicant: Wolfspeed, Inc., Durham, NC (US)

(72) Inventors: Matthew Donofrio, Raleigh, NC (US); John Edmond, Durham, NC (US); Harshad Golakia, Morrisville, NC (US); Eric Mayer, Raleigh, NC (US)

(73) Assignee: WOLFSPEED, INC., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/572,137

(22) Filed: Jan. 10, 2022

(65) Prior Publication Data

US 2022/0126395 A1 Apr. 28, 2022

Related U.S. Application Data

(63) Continuation of application No. 16/792,261, filed on Feb. 16, 2020, now Pat. No. 11,219,966, which is a
(Continued)

(51) Int. Cl.
*B23K 26/03* (2006.01)
*H01L 21/02* (2006.01)
(Continued)

(52) U.S. Cl.
CPC ............ *B23K 26/032* (2013.01); *B23K 26/40* (2013.01); *B23K 26/53* (2015.10); *B28D 5/0064* (2013.01); *H01L 21/02686* (2013.01)

(58) Field of Classification Search
None
See application file for complete search history.

(56) References Cited

U.S. PATENT DOCUMENTS 3,105,623 A 10/1963 Hobbs
3,112,850 A 12/1963 Garibotti
(Continued)

FOREIGN PATENT DOCUMENTS

CN 1973375 A 5/2007
CN 101400475 A 4/2009
(Continued)

OTHER PUBLICATIONS

Author Unknown, "BrewerBOND® 220 Temporary Wafer Bonding Material," Aug. 27, 2014, Brewer Science, Inc., 1 page.
(Continued)

*Primary Examiner* — Asok K Sarkar
(74) *Attorney, Agent, or Firm* — Dority & Manning, P.A.

(57) ABSTRACT

A crystalline material processing method includes forming subsurface laser damage at a first average depth position to form cracks in the substrate interior propagating outward from at least one subsurface laser damage pattern, followed by imaging the substrate top surface, analyzing the image to identify a condition indicative of presence of uncracked regions within the substrate, and taking one or more actions responsive to the analyzing. One potential action includes changing an instruction set for producing subsequent laser damage formation (at second or subsequent average depth positions), without necessarily forming additional damage at the first depth position. Another potential action includes forming additional subsurface laser damage at the first depth position. The substrate surface is illuminated with a diffuse light source arranged perpendicular to a primary substrate flat and positioned to a first side of the substrate, and imaged with an imaging device positioned to an opposing second side of the substrate.

12 Claims, 37 Drawing Sheets

Related U.S. Application Data continuation of application No. 16/410,487, filed on May 13, 2019, now Pat. No. 10,562,130, which is a continuation-in-part of application No. 16/274,064, filed on Feb. 12, 2019, now Pat. No. 10,576,585.

(60) Provisional application No. 62/803,340, filed on Feb. 8, 2019, provisional application No. 62/786,333, filed on Dec. 29, 2018.

(51) Int. Cl.
*B28D 5/00* (2006.01)
*B23K 26/53* (2014.01)
*B23K 26/40* (2014.01)

(56) References Cited

U.S. PATENT DOCUMENTS

| | | |
|---|---|---|
| 3,970,819 A | 7/1976 | Gates et al. |
| 4,224,101 A | 9/1980 | Tijburg et al. |
| 5,597,767 A | 1/1997 | Mignardi et al. |
| 5,761,111 A | 6/1998 | Glezer |
| 5,786,560 A | 7/1998 | Tatah et al. |
| 5,912,477 A | 6/1999 | Negley |
| 5,916,460 A | 6/1999 | Imoto et al. |
| 5,922,224 A | 7/1999 | Broekroelofs |
| 5,968,382 A | 10/1999 | Matsumoto et al. |
| 6,087,617 A | 7/2000 | Troitski et al. |
| 6,555,781 B2 | 4/2003 | Ngoi et al. |
| 6,958,093 B2 | 10/2005 | Vaudo et al. |
| 6,992,026 B2 | 1/2006 | Fukuyo et al. |
| 7,547,578 B2 | 6/2009 | Agarwal et al. |
| 7,547,897 B2 | 6/2009 | Suvorov |
| 7,566,635 B2 | 7/2009 | Fujii et al. |
| 7,592,237 B2 | 9/2009 | Sakamoto et al. |
| 7,605,344 B2 | 10/2009 | Fukumitsu |
| 7,608,214 B2 | 10/2009 | Kuno et al. |
| 7,709,767 B2 | 5/2010 | Sakamoto |
| 7,718,510 B2 | 5/2010 | Sakamoto et al. |
| 7,749,867 B2 | 7/2010 | Fukuyo et al. |
| 7,754,583 B2 | 7/2010 | Sakamoto |
| 7,897,487 B2 | 3/2011 | Sugiura et al. |
| 7,902,636 B2 | 3/2011 | Sugiura et al. |
| 7,939,430 B2 | 5/2011 | Sakamoto et al. |
| 8,026,154 B2 | 9/2011 | Sakamoto |
| 8,058,103 B2 | 11/2011 | Fukumitsu et al. |
| 8,084,333 B2 | 12/2011 | Sakamoto |
| 8,110,422 B2 | 2/2012 | Kumagai et al. |
| 8,134,099 B2 | 3/2012 | Nakano et al. |
| 8,138,450 B2 | 3/2012 | Sakamoto et al. |
| 8,188,404 B2 | 5/2012 | Sakamoto |
| 8,247,311 B2 | 8/2012 | Sakamoto et al. |
| 8,247,734 B2 | 8/2012 | Fukuyo et al. |
| 8,263,479 B2 | 9/2012 | Fukuyo et al. |
| 8,278,592 B2 | 10/2012 | Sakamoto |
| 8,288,220 B2 | 10/2012 | Hull et al. |
| 8,389,384 B2 | 3/2013 | Sakamoto et al. |
| 8,436,273 B2 | 5/2013 | Sakamoto |
| 8,513,567 B2 | 8/2013 | Osajima et al. |
| 8,523,636 B2 | 9/2013 | Uchiyama |
| 8,541,251 B2 | 9/2013 | Uchiyama |
| 8,603,351 B2 | 12/2013 | Sakamoto et al. |
| 8,604,383 B2 | 12/2013 | Kuno et al. |
| 8,624,153 B2 | 1/2014 | Atsumi et al. |
| 8,685,838 B2 | 4/2014 | Fukuyo et al. |
| 8,722,516 B2 | 5/2014 | Yamada et al. |
| 8,728,914 B2 | 5/2014 | Sakamoto et al. |
| 8,735,770 B2 | 5/2014 | Kuno et al. |
| 8,735,771 B2 | 5/2014 | Kuno et al. |
| 8,755,107 B2 | 6/2014 | Sakamoto et al. |
| 8,790,997 B2 | 7/2014 | Nakagawa et al. |
| 8,816,245 B2 | 8/2014 | Iwaki et al. |
| 8,828,306 B2 | 9/2014 | Uchiyama |
| 8,828,891 B2 | 9/2014 | Sakamoto |
| 8,890,026 B2 | 11/2014 | Uchiyama et al. |
| 8,933,368 B2 | 1/2015 | Atsumi et al. |
| 8,946,055 B2 | 2/2015 | Sakamoto et al. |
| 8,950,217 B2 | 2/2015 | Iwaki et al. |
| RE45,403 E | 3/2015 | Kumagai |
| 8,969,752 B2 | 3/2015 | Fukumitsu et al. |
| 8,980,445 B2 | 3/2015 | Leonard et al. |
| 8,993,922 B2 | 3/2015 | Atsumi et al. |
| 9,012,805 B2 | 4/2015 | Atsumi et al. |
| 9,035,216 B2 | 5/2015 | Sugiura |
| 9,076,855 B2 | 7/2015 | Sugiura |
| 9,102,005 B2 | 8/2015 | Muramatsu et al. |
| 9,200,381 B2 | 12/2015 | Leonard et al. |
| 9,295,969 B2 | 3/2016 | Okuma et al. |
| 9,302,410 B2 | 4/2016 | Shimoi et al. |
| 9,481,051 B2 | 11/2016 | Hirata et al. |
| 9,517,530 B2 | 12/2016 | Hirata et al. |
| 9,764,420 B2 | 9/2017 | Hirata et al. |
| 9,764,428 B2 | 9/2017 | Hirata et al. |
| 9,768,259 B2 | 9/2017 | Suvorov et al. |
| 9,789,565 B2 | 10/2017 | Hirata et al. |
| 9,790,619 B2 | 10/2017 | Leonard et al. |
| 9,868,177 B2 | 1/2018 | Hirata |
| 9,878,397 B2 | 1/2018 | Hirata |
| 9,925,619 B2 | 3/2018 | Hirata et al. |
| 10,155,323 B2 | 12/2018 | Hirata |
| 10,201,907 B2 | 2/2019 | Hirata |
| 10,357,851 B2 | 7/2019 | Nishino et al. |
| 10,406,635 B2 | 9/2019 | Hirata |
| 10,562,130 B1 | 2/2020 | Donofrio et al. |
| 10,576,585 B1 | 3/2020 | Donofrio et al. |
| 10,611,052 B1 | 4/2020 | Bubel et al. |
| 10,867,797 B2 | 12/2020 | Suvorov et al. |
| 11,024,501 B2 | 6/2021 | Donofrio et al. |
| 11,219,986 B1 * | 1/2022 | Davila ............... B25B 13/06 |
| 2001/0054606 A1 | 12/2001 | Weishauss et al. |
| 2002/0104478 A1 | 8/2002 | Oguri et al. |
| 2005/0048738 A1 | 3/2005 | Shaheen et al. |
| 2006/0255341 A1 | 11/2006 | Pinnington et al. |
| 2010/0263794 A1 | 10/2010 | George et al. |
| 2010/0289189 A1 | 11/2010 | Lichtensteiger et al. |
| 2011/0266261 A1 | 11/2011 | Nakano et al. |
| 2011/0312115 A1 | 12/2011 | Kato |
| 2011/0316003 A1 | 12/2011 | Murphy et al. |
| 2012/0000415 A1 | 1/2012 | D'Evelyn et al. |
| 2012/0061356 A1 | 3/2012 | Fukumitsu |
| 2012/0234808 A1 | 9/2012 | Nakano et al. |
| 2012/0234887 A1 | 9/2012 | Henley et al. |
| 2014/0038392 A1 | 2/2014 | Yonehara et al. |
| 2014/0087504 A1 | 3/2014 | Li et al. |
| 2014/0197419 A1 | 7/2014 | Henley et al. |
| 2014/0251963 A1 | 9/2014 | Kawaguchi |
| 2014/0360988 A1 | 12/2014 | Sato |
| 2015/0068446 A1 | 3/2015 | Drachev et al. |
| 2015/0075221 A1 | 3/2015 | Kawaguchi et al. |
| 2015/0158117 A1 | 6/2015 | Munoz et al. |
| 2015/0171045 A1 | 6/2015 | Berger et al. |
| 2015/0174698 A1 | 6/2015 | Tajikara et al. |
| 2015/0217399 A1 | 8/2015 | Tajikara et al. |
| 2015/0217400 A1 | 8/2015 | Yamada |
| 2015/0221544 A1 | 8/2015 | Landru et al. |
| 2015/0221816 A1 | 8/2015 | Tajikara et al. |
| 2015/0298252 A1 | 10/2015 | Kawaguchi |
| 2016/0016257 A1 | 1/2016 | Hosseini |
| 2016/0039044 A1 | 2/2016 | Kawaguchi |
| 2016/0045979 A1 | 2/2016 | Kawaguchi et al. |
| 2016/0052083 A1 | 2/2016 | Kawaguchi et al. |
| 2016/0052084 A1 | 2/2016 | Kawaguchi et al. |
| 2016/0052085 A1 | 2/2016 | Kawaguchi et al. |
| 2016/0052088 A1 | 2/2016 | Kawaguchi et al. |
| 2016/0052090 A1 | 2/2016 | Tanigawa |
| 2016/0074960 A1 | 3/2016 | Hirata et al. |
| 2016/0158881 A1 | 6/2016 | Hirata et al. |
| 2016/0158882 A1 | 6/2016 | Hirata et al. |
| 2016/0158892 A1 | 6/2016 | Hirata et al. |
| 2016/0189954 A1 | 6/2016 | Kong et al. |
| 2016/0193690 A1 | 7/2016 | Hirata et al. |
| 2016/0193691 A1 | 7/2016 | Hirata et al. |
| 2016/0197698 A1 | 7/2016 | Oxenlowe et al. |
| 2016/0228983 A1 | 8/2016 | Hirata et al. |

(56) References Cited

U.S. PATENT DOCUMENTS

| | | |
|---|---|---|
| 2016/0228984 A1 | 8/2016 | Hirata et al. |
| 2016/0228985 A1 | 8/2016 | Hirata et al. |
| 2016/0288250 A1 | 10/2016 | Hirata et al. |
| 2016/0288251 A1 | 10/2016 | Hirata et al. |
| 2016/0293397 A1 | 10/2016 | Hirata et al. |
| 2016/0305042 A1 | 10/2016 | Hirata |
| 2016/0307763 A1 | 10/2016 | Hirata |
| 2016/0354862 A1 | 12/2016 | Hirata |
| 2016/0354863 A1 | 12/2016 | Hirata |
| 2017/0014944 A1 | 1/2017 | Hirata et al. |
| 2017/0015017 A1 | 1/2017 | Hirata |
| 2017/0025275 A1 | 1/2017 | Hirata et al. |
| 2017/0025276 A1 | 1/2017 | Hirata |
| 2017/0053829 A1 | 2/2017 | Hirata et al. |
| 2017/0053831 A1 | 2/2017 | Hirata et al. |
| 2017/0106476 A1 | 4/2017 | Sakamoto et al. |
| 2017/0113301 A1 | 4/2017 | Sakamoto et al. |
| 2017/0136572 A1 | 5/2017 | Hirata |
| 2017/0151627 A1 | 6/2017 | Hirata |
| 2017/0198411 A1 | 7/2017 | Hirata |
| 2017/0216973 A1 | 8/2017 | Sakamoto et al. |
| 2017/0250113 A1 | 8/2017 | Vanagas et al. |
| 2017/0291255 A1 | 10/2017 | Hirata |
| 2017/0301540 A1 | 10/2017 | Hashimoto et al. |
| 2017/0330800 A1 | 11/2017 | Beyer et al. |
| 2018/0043468 A1 | 2/2018 | Hirata |
| 2018/0056440 A1 | 3/2018 | Yamamoto et al. |
| 2018/0085851 A1 | 3/2018 | Hirata |
| 2018/0108568 A1 | 4/2018 | Wang et al. |
| 2018/0126484 A1 | 5/2018 | Richter et al. |
| 2018/0133834 A1 | 5/2018 | Beyer |
| 2018/0154543 A1 | 6/2018 | Hirata |
| 2018/0187332 A1 | 7/2018 | Powell et al. |
| 2018/0214976 A1 | 8/2018 | Iizuka et al. |
| 2018/0218896 A1 | 8/2018 | Hirata |
| 2018/0229331 A1 | 8/2018 | Hirata et al. |
| 2018/0243944 A1 | 8/2018 | Schilling et al. |
| 2018/0254223 A1 | 9/2018 | Hirata et al. |
| 2018/0290232 A1 | 10/2018 | Richter et al. |
| 2018/0308679 A1 | 10/2018 | Hirata |
| 2018/0315657 A1 | 11/2018 | Ikeno et al. |
| 2018/0354067 A1 | 12/2018 | Iizuka et al. |
| 2019/0001433 A1 | 1/2019 | Yamamoto |
| 2019/0006212 A1 | 1/2019 | Iizuka et al. |
| 2019/0019729 A1 | 1/2019 | Lichtensteiger et al. |
| 2019/0096746 A1 | 3/2019 | Drescher et al. |
| 2019/0148164 A1 | 5/2019 | Hirata et al. |
| 2019/0152019 A1 | 5/2019 | Hirata et al. |
| 2019/0160708 A1 | 5/2019 | Hinohara et al. |
| 2019/0160804 A1 | 5/2019 | Hinohara et al. |
| 2019/0181024 A1 | 6/2019 | Izuka et al. |
| 2019/0221436 A1 | 7/2019 | Hirata |
| 2019/0304769 A1 | 10/2019 | Hirata et al. |
| 2019/0304800 A1 | 10/2019 | Yamamoto |
| 2019/0362960 A1 | 11/2019 | Seddon et al. |
| 2020/0343139 A1 | 10/2020 | Wei |
| 2020/0388538 A1 | 12/2020 | Swoboda et al. |

FOREIGN PATENT DOCUMENTS

| | | |
|---|---|---|
| CN | 102947493 A | 2/2013 |
| CN | 106346148 A | 1/2017 |
| CN | 107107260 A | 8/2017 |
| CN | 107170668 A | 9/2017 |
| CN | 107438581 A | 12/2017 |
| CN | 108372434 A | 8/2018 |
| CN | 107454892 A | 8/2021 |
| EP | 1609558 A1 | 12/2005 |
| EP | 1707298 A1 | 10/2006 |
| EP | 2578349 A1 | 4/2013 |
| EP | 2230040 B1 | 5/2015 |
| EP | 2223770 B1 | 6/2015 |
| JP | S59152581 A | 8/1984 |
| JP | H02179708 A | 7/1990 |
| JP | H04116848 A | 4/1992 |
| JP | 3408805 B2 | 5/2003 |
| JP | 3624909 B2 | 3/2005 |
| JP | 3626442 B2 | 3/2005 |
| JP | 3670267 B2 | 7/2005 |
| JP | 3761565 B2 | 3/2006 |
| JP | 3761567 B2 | 3/2006 |
| JP | 8751970 B2 | 3/2006 |
| JP | 8761566 B2 | 3/2006 |
| JP | 3822626 B2 | 9/2006 |
| JP | 3867003 B2 | 1/2007 |
| JP | 3867100 B2 | 1/2007 |
| JP | 3867101 B2 | 1/2007 |
| JP | 3867102 B2 | 1/2007 |
| JP | 3867103 B2 | 1/2007 |
| JP | 3867104 B2 | 1/2007 |
| JP | 3867105 B2 | 1/2007 |
| JP | 3867107 B2 | 1/2007 |
| JP | 3867108 B2 | 1/2007 |
| JP | 3867109 B2 | 1/2007 |
| JP | 3867110 B2 | 1/2007 |
| JP | 3869850 B2 | 1/2007 |
| JP | 3935186 B2 | 6/2007 |
| JP | 3935187 B2 | 6/2007 |
| JP | 3935188 B2 | 6/2007 |
| JP | 3935189 B2 | 6/2007 |
| JP | 3990710 B2 | 10/2007 |
| JP | 3990711 B2 | 10/2007 |
| JP | 4050534 B2 | 2/2008 |
| JP | 4095092 B2 | 6/2008 |
| JP | 4128204 B2 | 7/2008 |
| JP | 4142694 B2 | 9/2008 |
| JP | 4146863 B2 | 9/2008 |
| JP | 4167094 B2 | 10/2008 |
| JP | 4358502 B2 | 11/2009 |
| JP | 4409840 B2 | 2/2010 |
| JP | 4440582 B2 | 3/2010 |
| JP | 4463796 B2 | 5/2010 |
| JP | 4509573 B2 | 7/2010 |
| JP | 4509719 B2 | 7/2010 |
| JP | 4509720 B2 | 7/2010 |
| JP | 4527098 B2 | 8/2010 |
| JP | 2010205900 A | 9/2010 |
| JP | 4584607 B2 | 11/2010 |
| JP | 4659301 B2 | 3/2011 |
| JP | 4663952 B2 | 4/2011 |
| JP | 4664140 B2 | 4/2011 |
| JP | 4703983 B2 | 6/2011 |
| JP | 4732063 B2 | 7/2011 |
| JP | 4762458 B2 | 8/2011 |
| JP | 4837320 B2 | 12/2011 |
| JP | 4851060 B2 | 1/2012 |
| JP | 4964376 B2 | 6/2012 |
| JP | 5025876 B2 | 9/2012 |
| JP | 5037082 B2 | 9/2012 |
| JP | 5094337 B2 | 12/2012 |
| JP | 5094994 B2 | 12/2012 |
| JP | 5117806 B2 | 1/2013 |
| JP | 5122161 B2 | 1/2013 |
| JP | 5148575 B2 | 2/2013 |
| JP | 5177992 B2 | 4/2013 |
| JP | 2013124206 A | 6/2013 |
| JP | 2013126682 A | 6/2013 |
| JP | 5255109 B2 | 8/2013 |
| JP | 5269356 B2 | 8/2013 |
| JP | 2013154604 A | 8/2013 |
| JP | 2013157450 A | 8/2013 |
| JP | 2013157451 A | 8/2013 |
| JP | 2013157454 A | 8/2013 |
| JP | 2013157545 A | 8/2013 |
| JP | 5312761 B2 | 10/2013 |
| JP | 5322418 B2 | 10/2013 |
| JP | 5451238 B2 | 3/2014 |
| JP | 5468627 B2 | 4/2014 |
| JP | 2014156687 A | 8/2014 |
| JP | 2014156688 A | 8/2014 |
| JP | 2014156689 A | 8/2014 |
| JP | 2014156690 A | 8/2014 |
| JP | 2014156692 A | 8/2014 |
| JP | 5597051 B2 | 10/2014 |

(56) References Cited

FOREIGN PATENT DOCUMENTS

| | | | |
|---|---|---|---|
| JP | 5597052 B2 | 10/2014 | |
| JP | 5620553 B2 | 11/2014 | |
| JP | 5670764 B2 | 2/2015 | |
| JP | 5670765 B2 | 2/2015 | |
| JP | 2015020187 A | 2/2015 | |
| JP | 5771391 B2 | 8/2015 | |
| JP | 5775312 B2 | 9/2015 | |
| JP | 2015199071 A | 11/2015 | |
| JP | 5844089 B2 | 1/2016 | |
| JP | 5863891 B2 | 1/2016 | |
| JP | 5864988 B2 | 2/2016 | |
| JP | 5894754 B2 | 3/2016 | |
| JP | 2016032062 | 3/2016 | |
| JP | 2016032828 A | 3/2016 | |
| JP | 5905274 B2 | 4/2016 | |
| JP | 5917862 B2 | 5/2016 | |
| JP | 2016111150 A | 6/2016 | |
| JP | 2017034255 | 2/2017 | |
| JP | 2017057103 A | 3/2017 | |
| JP | 2017189870 A | 10/2017 | |
| JP | 2017220631 A | 12/2017 | |
| JP | 6355540 B2 | 7/2018 | |
| JP | 2018-133484 A | 8/2018 | |
| JP | 6366485 B2 | 8/2018 | |
| JP | 6366486 B2 | 8/2018 | |
| JP | 2018147928 A | 9/2018 | |
| JP | 6418927 B2 | 11/2018 | |
| JP | 6444207 B2 | 12/2018 | |
| JP | 6494457 B2 | 4/2019 | |
| JP | 2019102676 A | 6/2019 | |
| JP | 2019161037 A | 9/2019 | |
| JP | 2020021878 A | 2/2020 | |
| JP | 2020027895 A | 2/2020 | |
| JP | 2020031134 A | 2/2020 | |
| JP | 2020035821 A | 3/2020 | |
| JP | 2020035873 A | 3/2020 | |
| JP | 2020047619 A | 3/2020 | |
| JP | 2020072098 A | 5/2020 | |
| JP | 2020077783 A | 5/2020 | |
| JP | 2020088097 A | 6/2020 | |
| JP | 2020092212 A | 6/2020 | |
| JP | 2021020242 A | 2/2021 | |
| KR | 100766727 B1 | 10/2007 | |
| KR | 101073183 B1 | 10/2011 | |
| KR | 101212875 B1 | 12/2012 | |
| KR | 101282459 B1 | 7/2013 | |
| KR | 101341675 B1 | 12/2013 | |
| KR | 101408491 B1 | 6/2014 | |
| KR | 20150021507 A | 3/2015 | |
| TW | 201243926 A | 11/2012 | |
| TW | 201334902 A | 9/2013 | |
| WO | 0032348 A1 | 6/2000 | |
| WO | 0032349 A1 | 6/2000 | |
| WO | WO 2018192689 | 10/2018 | |

OTHER PUBLICATIONS

Non-Final Office Action for U.S. Appl. No. 16/274,045, dated Jun. 11, 2019, 31 pages.
Notice of Allowance for U.S. Appl. No. 16/274,064, dated Jun. 6, 2019, 12 pages.
Author Unknown, "Application Bulletin: Low-Temperature Performance of Silicone Elastomers," Electronics Solutions, 2003, Dow Corning Corporation, 8 pages.
Author Unknown, "Ceramics for Temperature," San Jose Delta, Inc. 2017, 3 pages.
Author Unknown, "Chapter 2: Thermal Expansion," ASM Ready Reference: Thermal Properties of Metals, 2002, ASM International, pp. 9-16.
Author Unknown, "Disco develops laser ingot slicing method to speed SiC wafer production and cut material loss," Semiconductor Today, Aug. 11, 2016, Juno Publishing and Media Solutions Ltd., 3 pages.
Author Unknown, "Disco's KABRA!zen fully automates KABRA laser slicing technology," Semiconductor Today, Dec. 11, 2017, Juno Publishing and Media Solutions Ltd., 3 pages.
Author Unknown, "Formation of Silicon and Gallium Arsenide Wafers," OpenStax CNX, accessed Dec. 17, 2018, Rice University, 15 pages.
Author Unknown, "IFTLE 171 Semicon Taiwan Part 3: Disco, Namics, Amkor," Insights from the Leading Edge Blog, Semiconductor Manufacturing & Design Community, accessed Dec. 17, 2018, 16 pages.
Author Unknown, "Supplementary Material (ESI) for Lab on a Chip," The Royal Society of Chemistry, 2007, 9 bages.
Author Unknown, "Technical Information: Stealth Dicing Technology and Applications," Hamamatsu, Mar. 2005, Hamamatsu Photonics K.K., 8 pages.
Author Uknown, "Tg—Glass Transition Temperature for Epoxies," Tech Tip 23, 2012, Epoxy Technology Inc., 2 pages.
Bedell, S.W. et al., "Fast Track Communication: Layer transfer by controlled spalling," Journal of Physics D: Applied Physics, vol. 46, Mar. 21, 2013, IOP Publishing Ltd., 7 pages.
Cao, B. et al., "In-Situ Real-Time Focus Detection during Laser Processing Using Double-Hole Masks and Advanced Image Sensor Software," Sensors, vol. 17, No. 7, Jul. 2017, MDPI, 13 pages.
Cree, "Cree Silicon Carbide Substrates and Epitaxy," Materials Catalogue, 1998-2013, Cree, Inc., 17 pages.
De Guire, M., "Introduction to Crystallography," Introduction to Materials Science & Engineering, 2006, pp. 4.1-4.15.
Dunn, T. et al., "Metrology for Characterization of Wafer Thickness Uniformity During 3D-IC Processing," Corning Incorporated, retrieved May 9, 2019 from https://www.corning.com/media/worldwide/global/documents/semi%20Metrology%20for%20Characterization%20of%20Wafer%20Thickness%20Uniformity%20During%203D-IC%20Processing.pdf, 6 pages.
Friedmann, T. et al., "Laser Wafering for Silicon Solar," Sandia Report SAND2011-2057, Jan. 2011, Sandia National Laboratories, 23 pages.
Happich, J., "Twinning rather than thinning: yields 100μm-thin wafers in minutes: p. 2 of 2," eeNews Europe, Feb. 27, 2018, European Business Press SA, 1 page.
Kim, M. et al., "4H-SiC wafer slicing by using femtosecond laser double-pulses," Optical Materials Express, vol. 7, No. 7, Jul. 1, 2017, Optical Society of America, 11 pages.
Kim, M. et al., "Enhancement of the thermo-mechanical properties of PDMS molds for the hot embossing of PMMA microfluidic devices," Journal of Micromechanics and Microengineering, vol. 23, Aug. 28, 2013, IOP Publishing Ltd, 12 pages.
Nezu, T., "Laser Facilitates Production of SiC Wafers," XTECH, Aug. 18, 2016, Nikkei Business Publications, Inc., 4 pages.
Richter, J. et al., "COLD SPLIT Provides Significant Cost Advantages for SiC Substrates and Devices," Bodo's Power Systems: SiC Power Modules for a wide range of applications, Sep. 2017, 3 pages.
Wijesundara, M. et al., "Chapter 2: SiC Materials and Processing Technology," Silicon Carbide Microsystems for Harsh Environments, 2011, Springer, 64 pages.
Author Unknown, "What is Kabra®?" DISCO Corporation, accessed Sep. 23, 2019 from http://www.discousa.com/kabra/index_eg.html#kabra_process, 7 pages.
Notice of Allowance for U.S. Appl. No. 16/274,064, dated Jul. 25, 2019, 14 pages.
Notice of Allowance for U.S. Appl. No. 16/410,487, dated Oct. 3, 2019, 9 pages.
Hirata, K., "New laser slicing technology named KABRA process enables high speed and high efficiency SiC slicing," Proceedings of SPIE, vol. 10520, Feb. 19, 2018, pp. 1052003-1-1052003-6.
Final Office Action for U.S. Appl. No. 16/274,045, dated Nov. 19, 2019, 38 pages.
Advisory Action and AFCP 2.0 Decision for U.S. Appl. No. 16/274,045, dated Jan. 7, 2020, 4 pages.
Non-Final Office Action for U.S. Appl. No. 16/274,045, dated Apr. 6, 2020, 38 pages.
Notice of Allowance for U.S. Appl. No. 16/274,064, dated Nov. 4, 2019, 12 pages.

(56) References Cited

OTHER PUBLICATIONS

Notice of Allowance for U.S. Appl. No. 16/415,721, dated Nov. 15, 2019, 10 pages.
Corrected Notice of Allowability for U.S. Appl. No. 16/415,721, dated Mar. 4, 2020, 4 pages.
First Office Action for Chinese Patent Application No. 2019800932581, dated Jun. 13, 2022, 16 pages.
Examination Report for Indian Patent Application No. 202117055610, dated Jun. 9, 2022, 7 pages.
Notice of Allowance for U.S. Appl. No. 17/178,532, dated Aug. 24, 2022, 10 pages.
Invitation to Pay Additional Fees and Partial Search for International Patent Application No. PCT/IB2019/061410, dated Jun. 9, 2020, 11 pages.
Invitation to Pay Additional Fees and Partial Search for International Patent Application No. PCT/IB2019/061412, dated Jun. 17, 2020, 11 pages.
International Search Report and Written Opinion for International Patent Application No. PCT/IB2019/061412, dated Aug. 7, 2020, 21 pages.
International Search Report and Written Opinion for International Patent Application No. PCT/US2020/022626, dated Jul. 8, 2020, 17 pages.
Final Office Action for U.S. Appl. No. 16/274,045, dated Aug. 3, 2020, 37 pages.
Non-Final Office Action for U.S. Appl. No. 16/784,311, dated Aug. 20, 2020, 5 pages.
International Search Report and Written Opinion for International Patent Application No. PCT/IB2019/061410, dated Oct. 5, 2020, 24 pages.
Advisory Action for U.S. Appl. No. 16/274,045, dated Oct. 9, 2020, 4 pages.
Notice of Allowance for U.S. Appl. No. 16/274,045, dated Jan. 28, 2021, 10 pages.
Corrected Notice of Allowability for U.S. Appl. No. 16/274,045, dated Feb. 16, 2021, 5 pages.
Notice of Allowance for U.S. Appl. No. 16/784,311, dated Oct. 21, 2020, 8 pages.
Notice of Allowance for U.S. Appl. No. 16/784,311, dated Feb. 18, 2021, 8 pages.
Non-Final Office Action for U.S. Appl. No. 16/792,261, dated Apr. 15, 2021, 7 pages.
International Preliminary Report on Patentability for International Patent Application No. PCT/IB2019/061410, dated Jul. 8, 2021, 15 pages.
International Preliminary Report on Patentability for International Patent Application No. PCT/IB2019/061412, dated Jul. 8, 2021, 13 pages.
Corrected Notice of Allowability for U.S. Appl. No. 16/784,311, dated May 19, 2021, 4 pages.
International Preliminary Report on Patentability for International Patent Application No. PCT/IB2019/061409, dated Jul. 8, 2021, 9 pages.
Notice of Allowance for U.S. Appl. No. 16/792,261, dated Sep. 2, 2021, 10 pages.
First Office Action for Chinese Patent Application No. 2019800871978, dated Feb. 9, 2022, 10 pages.
Non-Final Office Action for U.S. Appl. No. 17/178,532, dated May 9, 2022, 25 pages.
Amendment Accompanying Request for Continued Examination, Petition to Withdraw from Issue, and Statement of Applicant Admitted Prior Art for U.S. Appl. No. 16/784,311, submitted Feb. 4, 2021, 7 pages.
Final Office Action for U.S. Appl. No. 16/274,045, dated Jun. 11, 2019, 31 pages.
First Office Action with Machine Translation for Japanese Patent Application No. 2021-538067, dated Jan. 24, 2023, 9 pages.
First Office Action with Machine Translation for Japanese Patent Application No. 2021-538091, dated Jan. 24, 2023, 6 pages.
First Office Action with Machine Translation for Korean Patent Application No. 10-2021-7024093, dated Feb. 7, 2023, 11 pages.
First Office Action with Machine Translation for Korean Patent Application No. 10-2021-7024073, dated Feb. 7, 2023, 9 pages.
International Search Report and Written Opinion for International Patent Application No. PCT/IB2019/061409, dated Apr. 20, 2020, 17 pages.
Second Office Action with Machine Translation for Japanese Patent Application No. 2022-515614, dated Jan. 13, 2023, 14 pages.
Second Office Action with Machine Translation for Chinese Patent Application No. 2019800871978, dated Jul. 20, 2022, 19 pages.

* cited by examiner

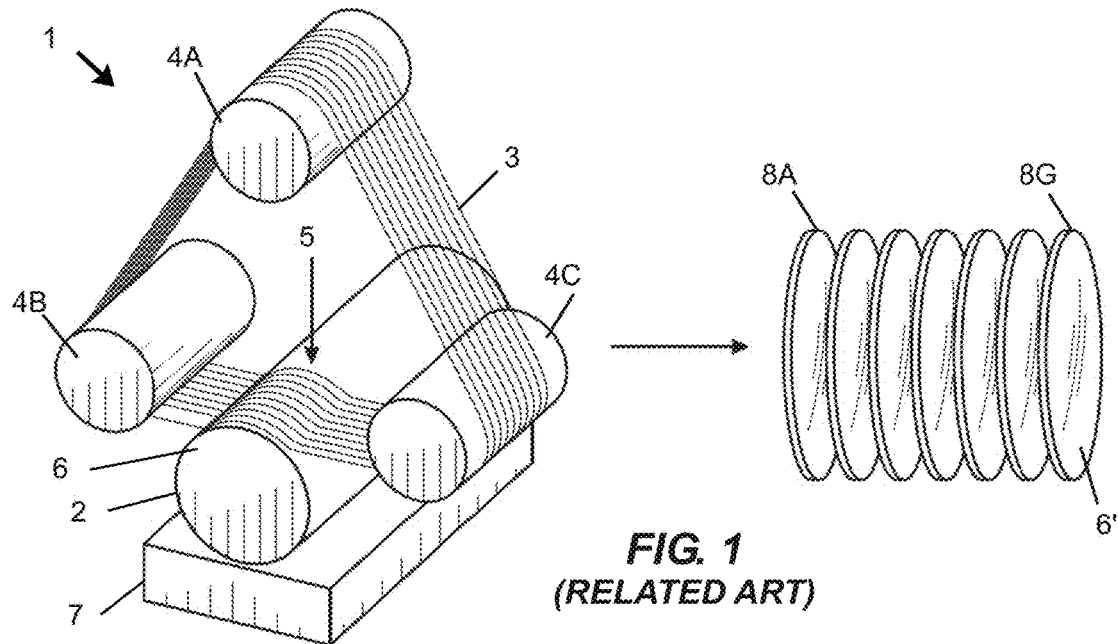
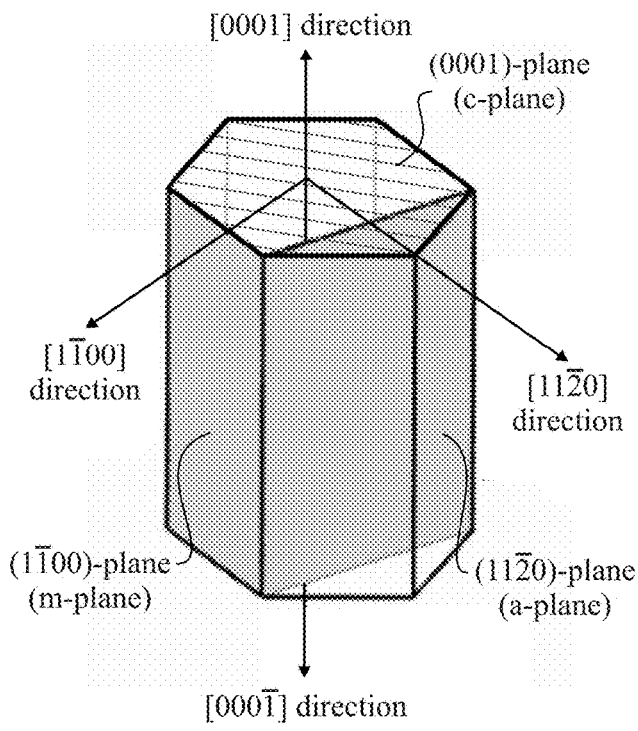
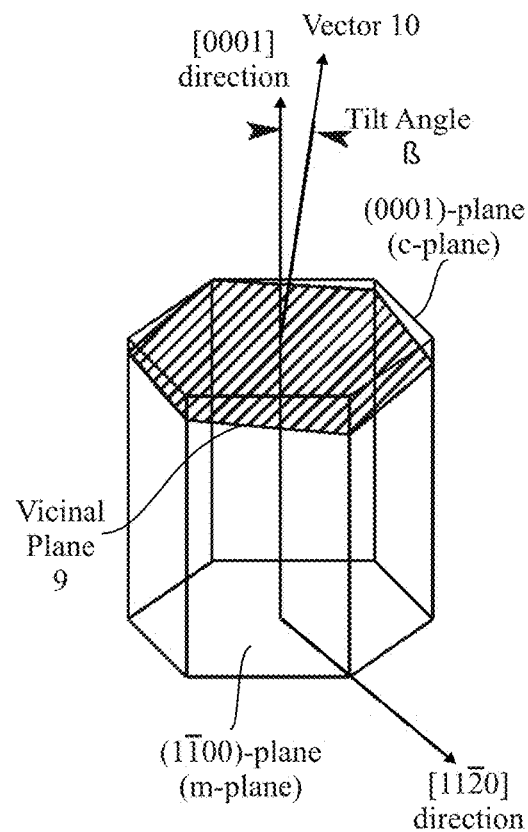
FIG. 1
*(RELATED ART)*
FIG. 2
FIG. 3

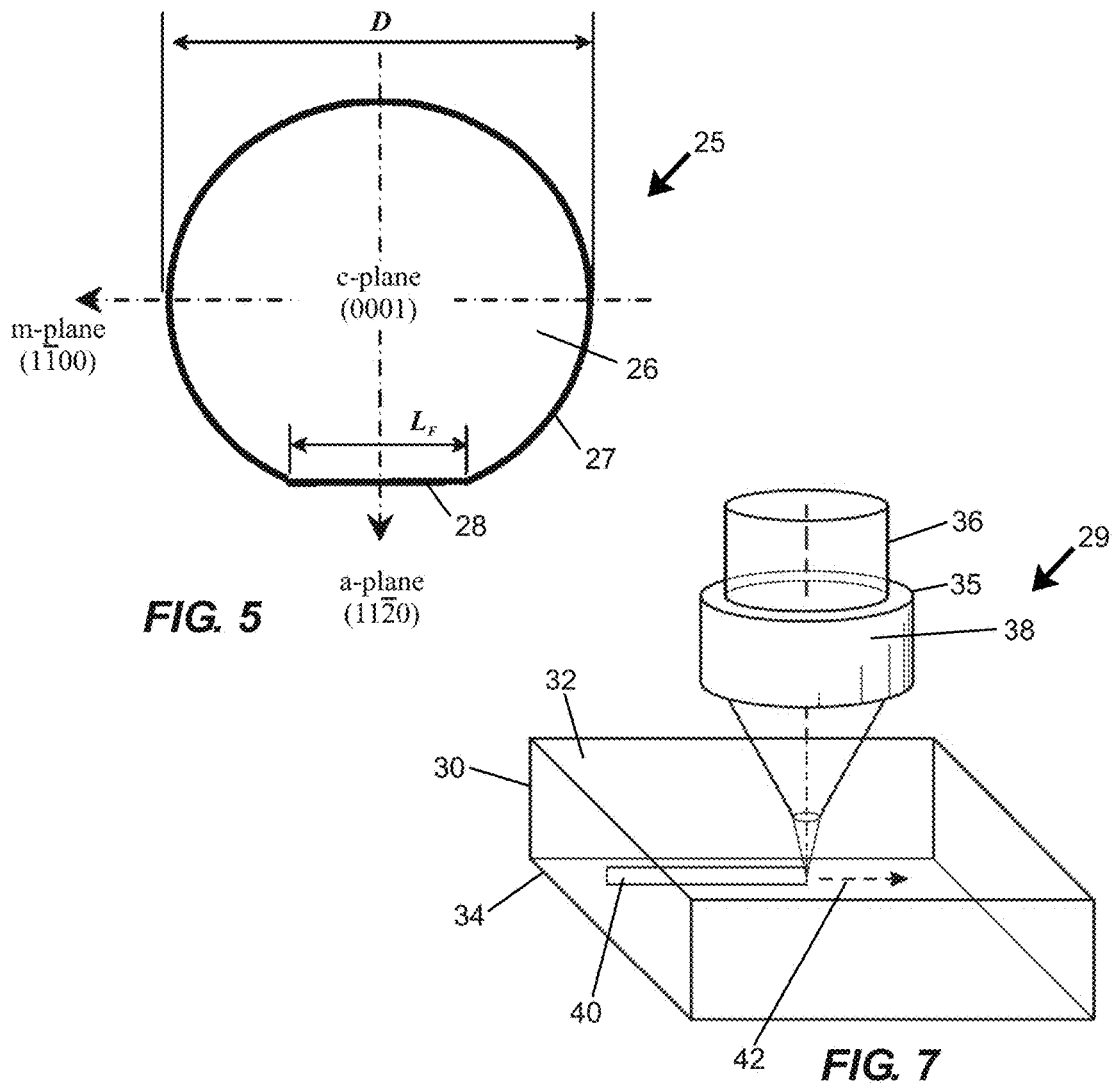
FIG. 5
FIG. 7
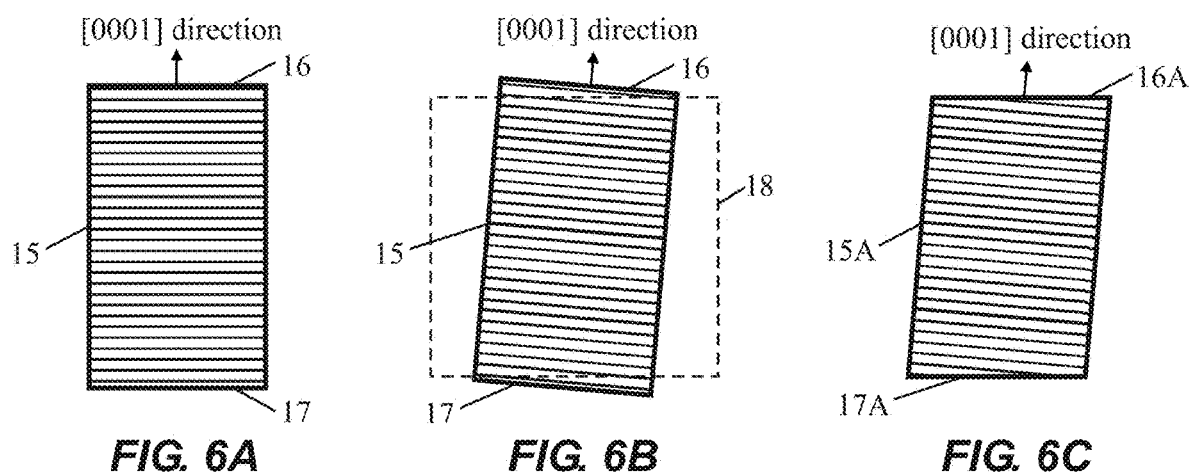
FIG. 6A  FIG. 6B  FIG. 6C

[11$\bar{2}$0] direction

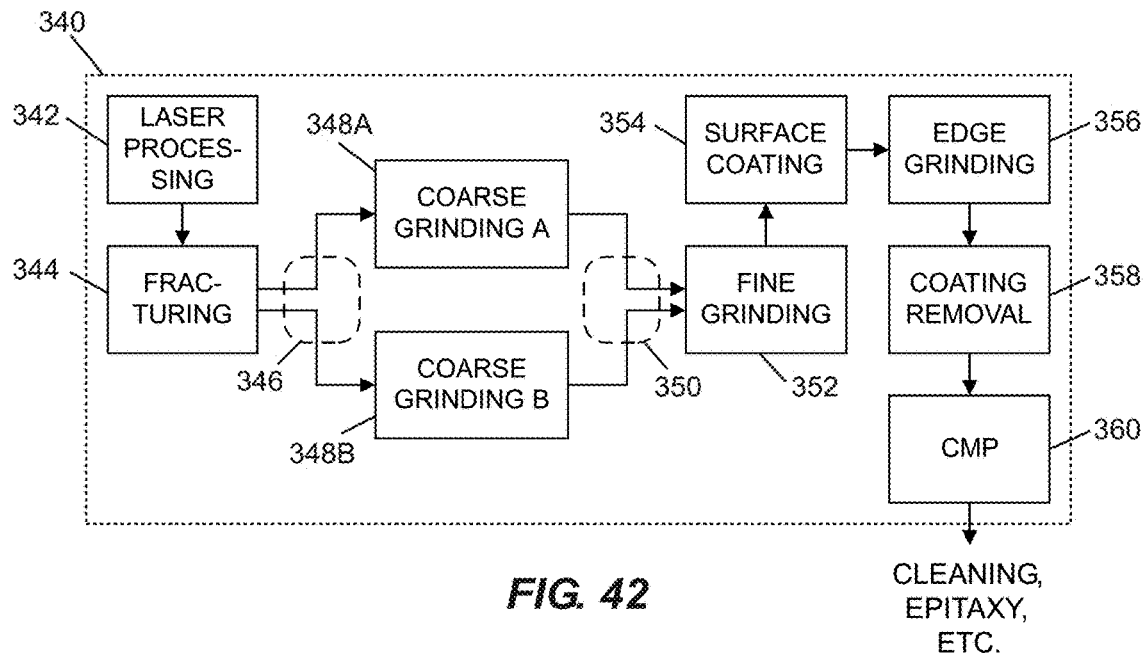
FIG. 42
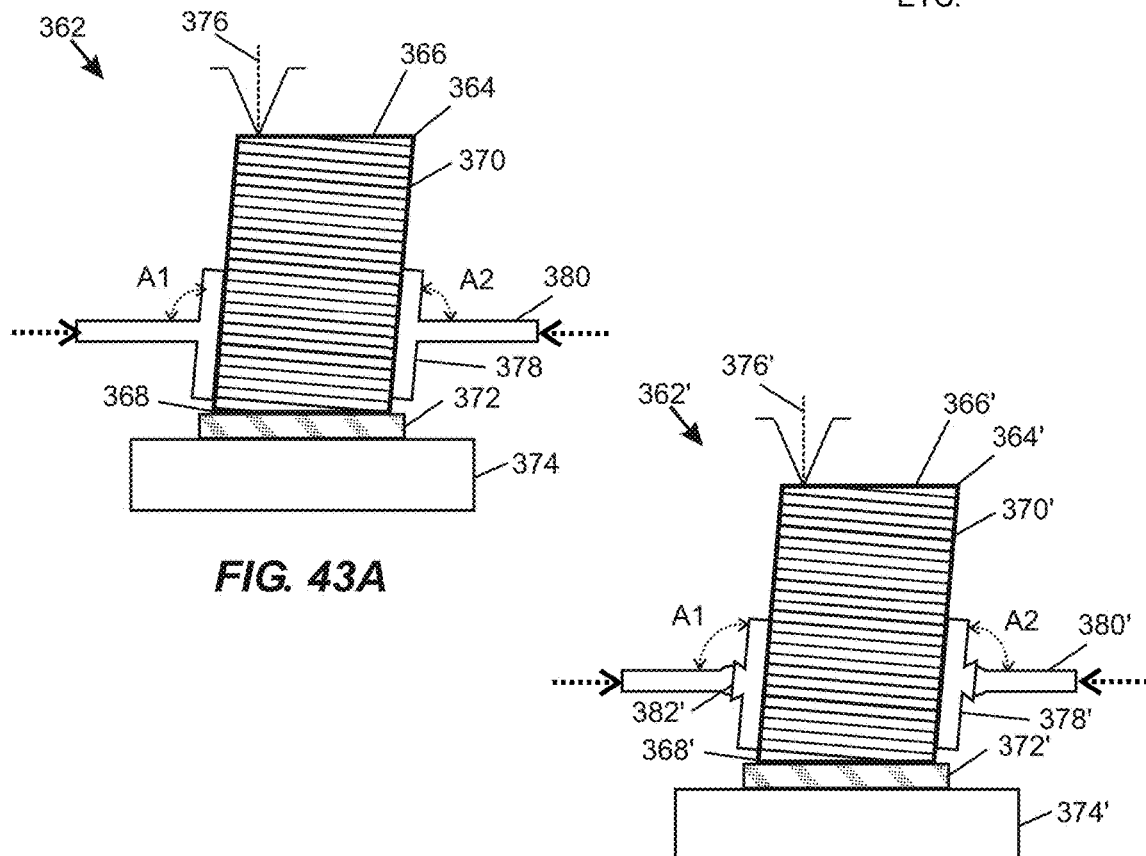
FIG. 43A
FIG. 43B

LASER-ASSISTED METHOD FOR PARTING CRYSTALLINE MATERIAL

STATEMENT OF RELATED APPLICATIONS

This application is a continuation of U.S. patent application Ser. No. 16/792,261 filed on Feb. 16, 2020 and subsequently issuing as U.S. Pat. No. 11,219,966, which is a divisional of U.S. patent application Ser. No. 16/410,487 filed on May 13, 2019 and subsequently issuing as U.S. Pat. No. 10,562,130, which is a continuation-in-part of U.S. patent application Ser. No. 16/274,064 filed on Feb. 12, 2019 and subsequently issuing as U.S. Pat. No. 10,576,585, which claims priority to U.S. Provisional Patent Application No. 62/786,333 filed on Dec. 29, 2018 and to U.S. Provisional Patent Application No. 62/803,340 filed on Feb. 8, 2019, wherein the entire disclosures of the foregoing applications are hereby incorporated by reference herein. This application also incorporated by reference the entire disclosure of U.S. patent application Ser. No. 16/274,045 filed on Feb. 12, 2019.

TECHNICAL FIELD

The present disclosure relates to methods for processing crystalline materials, and more specifically to laser-assisted methods for parting or removing relatively thin layers of crystalline material from a substrate, such as a boule or a wafer.

BACKGROUND

Various microelectronic, optoelectronic, and microfabrication applications require thin layers of crystalline materials as a starting structure for fabricating various useful systems. Traditional methods for cutting thin layers (e.g., wafers) from large diameter crystalline ingots of crystalline materials have involved use of wire saws. Wire sawing technology has been applied to various crystalline materials, such as silicon, sapphire, and silicon carbide. A wire saw tool includes an ultra-fine steel wire (typically having a diameter of 0.2 mm or less) that is passed through grooves of one or many guide rollers. Two slicing methods exist, namely, loose abrasive slicing and fixed abrasive slicing. Loose abrasive slicing involves application of a slurry (typically a suspension of abrasives in oil) to a steel wire running at high speed, whereby the rolling motion of abrasives between the wire and the workpiece results in cutting of an ingot. Unfortunately, the environmental impact of slurry is considerable. To reduce such impact, a wire fixed with diamond abrasives may be used in a fixed abrasive slicing method that requires only a water-soluble coolant liquid (not a slurry). High-efficiency parallel slicing permits a large number of wafers to be produced in a single slicing procedure. FIG. 1 illustrates a conventional wire saw tool 1 including parallel wire sections 3 extending between rollers 4A-4C and arranged to simultaneously saw an ingot 2 into multiple thin sections (e.g., wafers 8A-8G) each having a face generally parallel to an end face 6 of the ingot 2. During the sawing process, the wire sections 3 supported by the rollers 4A-4C may be pressed in a downward direction 5 toward a holder 7 underlying the ingot 2. If the end face 6 is parallel to a crystallographic c-plane of the ingot 2, and the wire sections 3 saw through the ingot 2 parallel to the end face 6, then each resulting wafer 8A-8G will have an "on-axis" end face 6' that is parallel to the crystallographic c-plane.

It is also possible to produce vicinal (also known as offcut or "off-axis") wafers having end faces that are not parallel to the crystallographic c-plane. Vicinal wafers (e.g., of SiC) having a 4 degree offcut are frequently employed as growth substrates for high-quality physical vapor transport and epitaxial growth of other materials (e.g., AlN and other Group III nitrides). Vicinal wafers may be produced either by growing an ingot in a direction away from the c-axis (e.g., growing over a vicinal seed material) and sawing the ingot perpendicular to the ingot sidewalls), or by growing an ingot starting with an on-axis seed material and sawing the ingot at an angle to that departs from perpendicular to the ingot sidewalls.

Wire sawing of semiconductor materials involves various limitations. Kerf losses based on the width of material removed per cut are inherent to saw cutting, and represent a significant loss of semiconductor material. Wire saw cutting applies moderately high stress to wafers, resulting in non-zero bow and warp characteristics. Processing times for a single boule (or ingot) are very long, and events like wire breaks can increase processing times and lead to undesirable loss of material. Wafer strength may be reduced by chipping and cracking on the cut surface of a wafer. At the end of a wire sawing process, the resulting wafers must be cleaned of debris.

In the case of silicon carbide (SiC) having high wear resistance (and a hardness comparable to diamond and boron nitride), wire sawing may require significant time and resources, thereby entailing significant production costs. SiC substrates enable fabrication of desirable power electronic, radio frequency, and optoelectronic devices. SiC occurs in many different crystal structures called polytypes, with certain polytypes (e.g., 4H—SiC and 6H—SIC) having a hexagonal crystal structure.

FIG. 2 is a first perspective view crystal plane diagram showing the coordinate system for a hexagonal crystal such as 4H—SiC, in which the c-plane ((0001) plane, corresponding to a [0001] (vertical) direction of crystal growth) is perpendicular to both the m-plane ((1$\bar{1}$00) plane) and the a-plane ((11$\bar{2}$0) plane), with the (1$\bar{1}$00) plane being perpendicular to the [1$\bar{1}$00] direction, and the (11$\bar{2}$0) plane being perpendicular to the [11$\bar{2}$0] direction. FIG. 3 is a second perspective view crystal plane diagram for a hexagonal crystal, illustrating a vicinal plane 9 that is non-parallel to the c-plane, wherein a vector 10 (which is normal to the vicinal plane 9) is tilted away from the [0001] direction by a tilt angle β, with the tilt angle β being inclined (slightly) toward the [11$\bar{2}$0] direction. FIG. 4A is a perspective view wafer orientation diagram showing orientation of a vicinal wafer 11A relative to the c-plane ((0001) plane), in which a vector 10A (which is normal to the wafer face 9A) is tilted away from the [0001] direction by a tilt angle β. This tilt angle β is equal to an orthogonal tilt (or misorientation angle) β that spans between the (0001) plane and a projection 12A of the wafer face 9A. FIG. 4B is a simplified cross-sectional view of the vicinal wafer 11A superimposed over a portion of an ingot 14A (e.g., an on-axis ingot having an end face 6A parallel to the (0001) plane) from which the vicinal wafer 11A was defined. FIG. 4B shows that the wafer face 9A of the vicinal wafer 11A is misaligned relative to the (0001) plane by a tilt angle β.

FIG. 5 is a top plan view of an exemplary SiC wafer 25 including an upper face 26 (e.g., that is parallel to the (0001) plane (c-plane), and perpendicular to the direction) and laterally bounded by a generally round edge 27 (having a diameter D) including a primary flat 28 (having a length $L_F$) that is perpendicular to the (11$\bar{2}$0) plane, and parallel to the

[11$\bar{2}$0] direction. A SiC wafer may include an outer surface that is misaligned with (e.g., off-axis at an oblique angle relative to) the c-plane.

Due to difficulties associated with making and processing SiC, SiC device wafers have a high cost relative to wafers of various other semiconductor materials. Typical kerf losses obtained from wire sawing SiC may be approximately 250 microns or more per wafer, which is quite significant considering that the wafers resulting from a wire sawing process may be roughly 350 microns thick and subsequently thinned (by grinding) to a final thickness of approximately 100 to 180 microns depending on the end use. It has been impractical to slice wafers thinner than about 350 microns considering wire sawing and device fabrication issues.

To seek to address limitations associated with wire sawing, alternative techniques for removing thin layers of semiconductor materials from bulk crystals have been developed. One technique involving removal of a layer of silicon carbide from a larger crystal is described in Kim et al., "4H—SiC wafer slicing by using femtosecond laser double pulses," Optical Materials Express 2450, vol. 7, no. 7 (2017). Such technique involves formation of laser-written tracks by impingement of laser pulses on silicon carbide to induce subsurface damage, followed by adhesion of the crystal to a locking jig and application of tensile force to effectuate fracture along a subsurface damage zone. Use of the laser to weaken specific areas in the material followed by fracture between those areas reduces the laser scanning time.

Additional separation techniques involving formation of laser subsurface damage with a pulsed laser beam to a SiC ingot and subsequent inducement of fracture by application of ultrasonic vibration are disclosed by U.S. Pat. Nos. 9,925,619 and 10,155,323 to Disco Corporation. Additional techniques for removing thin layers of semiconductor materials from bulk crystals are disclosed in U.S. Patent Application Publication No. 2018/0126484A1 to Siltectra GmbH.

Tools for forming laser subsurface damage in semiconductor materials are known in the art and commercially available from various providers, such as Disco Corporation (Tokyo, Japan). Such tools permit laser emissions to be focused within an interior of a crystalline substrate, and enable lateral movement of a laser relative to the substrate. Typical laser damage patterns include formation of parallel lines that are laterally spaced relative to one another at a depth within a crystalline material substrate. Parameters such as focusing depth, laser power, translation speed, etc. may be adjusted to impart laser damage, but adjustment of certain factors involves tradeoffs. Increasing laser power tends to impart greater subsurface damage that may increase ease of fracturing (e.g., by reducing the stress required to complete fracturing), but greater subsurface damage increases surface irregularities along surfaces exposed by fracturing, such that additional processing may be required to render such surfaces sufficiently smooth for subsequent processing (e.g., for incorporation in electronic devices). Reducing lateral spacing between subsurface laser damage lines may also increase ease of fracturing, but a reduction in spacing between laser damage lines increases the number of translational passes between a substrate and a laser, thereby reducing tool throughput. Additionally, results obtained by laser processing may vary within a substrate, depending on lateral or radial position at a particular vertical depth, and/or depending on vertical position of a substrate face relative to its original growth position as part of an ingot.

Variations in material and/or optical properties within a thick substrate such as a SiC ingot, and also among different ingots of the same composition, render it challenging to easily fabricate wafers of repeatably uniform thickness by laser processing and subsequent fracture while avoiding unnecessary material loss.

Accordingly, the art continues to seek improved laser-assisted methods for parting or removing relatively thin layers of crystalline (e.g., semiconductor) material from a substrate to address issues associated with conventional methods.

SUMMARY

The present disclosure relates in various aspects to methods for processing a crystalline material substrate and a material processing apparatus. Imaging and analysis of uncracked regions following formation of subsurface laser damage in a substrate are used as an indicator to determine when additional laser substrate damage is necessary at a first depth position and/or when an instruction set for forming subsurface laser damage at subsequent depth positions should be changed, thereby addressing variation in laser damage formation requirements (e.g., laser power, laser focusing depth, number of damage formation passes) from substrate to substrate, as well as at different depth positions within a single substrate. A crystalline material processing method includes generating subsurface laser damage sites in areas of the crystalline material at a first average depth position to promote formation of cracks in the substrate interior propagating outward from a subsurface laser damage pattern, imaging the substrate top surface, analyzing the image to identify a condition indicative of presence of uncracked regions within the substrate, and taking one or more actions responsive to the analyzing (e.g., upon attainment of appropriate conditions). One potential action includes forming supplemental subsurface laser damage at the first average depth position to promote formation of additional cracks in the uncracked regions, for formation of a first reduced thickness portion of the substrate (e.g., a first wafer). Another potential action includes changing an instruction set for producing subsequent subsurface laser damage formation (at second or subsequent average depth positions, for formation of second and any reduced thickness portions of the substrate), without necessarily forming additional damage at the first average depth position. The laser damage facilitates subsequent fracture of the substrate to yield multiple substrate portions of reduced thickness. A material processing apparatus includes a laser processing station having a laser, at least one translation stage, a diffuse light source arranged to be positioned to a first lateral side of a substrate, and an imaging device positioned to an opposing second lateral side of the substrate. The light source may be positioned substantially perpendicular to a primary flat of the substrate and/or within ±5 degrees of perpendicular to a <11$\bar{2}$0> direction of a hexagonal crystal structure of the substrate, to enhance visibility of uncracked regions through the top surface of the substrate.

In one aspect, the disclosure relates to a crystalline material processing method comprising: supplying emissions of a laser focused along a first average depth position within an interior of a crystalline material of a substrate, and effecting relative lateral movement between the laser and the substrate, to form subsurface laser damage having at least one subsurface laser damage pattern, wherein the at least one subsurface laser damage pattern is configured to promote formation of at least one plurality of cracks in the interior of the substrate propagating outward from substantially the at least one subsurface laser damage pattern; following formation of the at least one subsurface laser damage pattern, generating at least one image of a top surface of the substrate; analyzing the at least one image to identify a condition indicative of presence of uncracked regions in the interior of the substrate; and responsive to the analyzing, performing at least one of the following steps (i) or (ii): (i) effecting relative movement between the laser and the substrate while supplying emissions of the laser focused within the interior of the substrate in at least the uncracked regions to form supplemental subsurface laser damage to supplement the at least one subsurface laser damage pattern and promote formation of additional cracks in the uncracked regions along or proximate to the first average depth position, for formation of a first reduced thickness portion of the substrate; or (ii) changing an instruction set, associated with the substrate, for forming subsurface laser damage when producing subsurface laser damage patterns at a second average depth position and any subsequent average depth positions in the substrate, for formation of at least one additional reduced thickness portion of the substrate.

In certain embodiments, the analyzing comprises quantifying a top area property of the one or more uncracked regions in the interior of the substrate, and comparing the top area property to at least one predetermined threshold area property.

In certain embodiments, the at least one predetermined threshold area property comprises a first predetermined threshold area property and a second predetermined threshold area property, wherein the second predetermined threshold area property is greater than the first predetermined threshold area property, and the method comprises: performing step (ii) if the top area property is at least as large as the first predetermined threshold area property; and performing step (i) if the top area property is at least as large as the second predetermined threshold area property.

In certain embodiments, the method comprises performing both of steps (i) and (ii) responsive to the analyzing.

In certain embodiments, step (ii) comprises adjusting at least one of (a) average laser power, (b) laser focusing depth relative to an exposed surface of the substrate, or (c) number of laser damage formation passes, when producing subsurface laser damage patterns at the second average depth position and any subsequent average depth positions in the substrate.

In certain embodiments, the changing of the instruction set according to step (ii) comprises increasing average laser power by a value in a range of from 0.15 to 0.35 watts.

In certain embodiments, step (i) comprises adjusting at least one of (a) average laser power, or (b) laser focusing depth relative to an exposed surface of the substrate, when producing the supplemental subsurface laser damage to supplement the at least one subsurface laser damage pattern and promote formation of additional cracks in the uncracked regions along or proximate to the first average depth position.

In certain embodiments, the substrate comprises a generally round edge having a primary flat, and the generating of the at least one image comprises (a) illuminating the top surface with diffuse light generated by a diffuse light source arranged to a first lateral side of the substrate and arranged substantially perpendicular to the primary flat, and (b) capturing the at least one image with an imaging device arranged to an opposing second lateral side of the substrate.

In certain embodiments, the crystalline material comprises a hexagonal crystal structure; and the generating of the at least one image comprises (a) illuminating the top surface with diffuse light generated by a diffuse light source arranged to a first lateral side of the substrate and arranged within ±5 degrees of perpendicular to a <11$\bar{2}$0> direction of the hexagonal crystal structure, and (b) capturing the at least one image with an imaging device arranged to a second lateral side of the substrate that opposes the first lateral side.

In certain embodiments, the at least one subsurface laser damage pattern comprises a first subsurface laser damage pattern and a second subsurface laser damage pattern that is formed after the first subsurface laser damage pattern; the first subsurface laser damage pattern comprises a first plurality of substantially parallel lines and the second subsurface laser damage pattern; lines of the second plurality of substantially parallel lines are interspersed among lines of the first plurality of substantially parallel lines; and at least some lines of the second plurality of substantially parallel lines do not cross any lines of the first plurality of substantially parallel lines.

In certain embodiments, each line of the second plurality of substantially parallel lines is arranged between a different pair of adjacent lines of the first plurality of substantially parallel lines.

In certain embodiments, each line of the first plurality of substantially parallel lines and each line of the second plurality of substantially parallel lines is within ±5 degrees of perpendicular to a <11$\bar{2}$0> direction of a hexagonal crystal structure of the crystalline material and substantially parallel to a surface of the substrate.

In certain embodiments, the at least one subsurface laser damage pattern comprises a first subsurface laser damage pattern and a second subsurface laser damage pattern that is formed after the first subsurface laser damage pattern; the at least one plurality of substantially parallel lines comprises a first plurality of substantially parallel lines and a second plurality of substantially parallel lines; lines of the first plurality of substantially parallel lines are non-parallel to lines of the second plurality of substantially parallel lines; an angular direction of lines of the second plurality of substantially parallel lines differs by no more than 10 degrees from an angular direction of lines of the first plurality of substantially parallel lines; and at least some lines of the second plurality of substantially parallel lines do not cross any lines of the first plurality of substantially parallel lines.

In certain embodiments, the at least one subsurface laser damage pattern further comprises a third subsurface laser damage pattern that is formed after the second subsurface laser damage pattern; the at least one plurality of substantially parallel lines further comprises a third plurality of substantially parallel lines; the at least one plurality of cracks comprises first, second, and third pluralities of cracks; the first subsurface laser damage pattern forms the first plurality of cracks in the interior of the substrate propagating laterally outward from lines of the first plurality of substantially parallel lines; the second subsurface laser damage pattern forms the second plurality of cracks in the interior of the substrate propagating laterally outward from lines of the second plurality of substantially parallel lines, and the second plurality of cracks is non-connecting with the first plurality of cracks; and the third subsurface laser damage pattern forms the third plurality of cracks in the interior of the substrate propagating laterally outward from lines of the third plurality of substantially parallel lines, wherein at least some cracks of the third plurality of cracks connect with at least some cracks of the first plurality of cracks and with at least some cracks of the second plurality of cracks.

In certain embodiments, the method further comprises detecting a condition indicative of non-uniform doping of the crystalline material across at least a portion of a surface of the substrate, the non-uniform doping including a first doping region and a second doping region; and responsive to detection of the condition indicative of non-uniform doping of the crystalline material, performing at least one of the following steps (A) or (B): (A) altering laser power to provide laser emissions at a first power level when forming subsurface laser damage in the first doping region and provide laser emissions at a second power level when forming subsurface laser damage in the second doping region, during formation of the at least one subsurface laser damage pattern; or (B) changing average depth for formation of subsurface laser damage in the substrate when forming subsurface laser damage in one of the first doping region or the second doping region.

In certain embodiments, the method further comprises fracturing the crystalline material substantially along the at least one subsurface laser damage pattern to yield first and second crystalline material portions each having reduced thickness relative to the substrate, but substantially a same length and width as the substrate.

In certain embodiments, the substrate comprises silicon carbide. In certain embodiments, the substrate comprises an ingot having a diameter of at least 150 mm.

In another aspect, the disclosure relates to a material processing apparatus that comprises a laser processing station configured to process a substrate of crystalline material, the laser processing station comprising: a laser configured to form subsurface laser damage regions within an interior of the substrate; at least one translation stage configured to effect relative movement between the laser and the substrate; a diffuse light source configured to illuminate a top surface of the substrate, wherein the diffuse light source is arranged to be positioned to a first lateral side of the substrate; and an imaging device configured to generate at least one image of the top surface of the substrate, wherein the imaging device is configured to be positioned to a second lateral side of the substrate that opposes the first lateral side.

In certain embodiments, the substrate comprises a generally round edge having a primary flat, and the diffuse light source is arranged to be positioned to the first lateral side of the substrate and substantially perpendicular to the primary flat.

In certain embodiments, the crystalline material comprises a hexagonal crystal structure, the diffuse light source is arranged to be positioned to the first lateral side of the substrate and within ±5 degrees of perpendicular to a <11$\overline{2}$0> direction of the hexagonal crystal structure.

In certain embodiments, the material processing apparatus further comprises a computing device configured to analyze the at least one image to identify a condition indicative of presence of uncracked regions in the interior of the substrate.

In certain embodiments, the computing device is further configured to perform, responsive to the analyzing by the computing device, at least one of the following steps (i) or (ii): (i) effect relative movement between the laser and the substrate while supplying emissions of the laser focused within the interior of the substrate in at least the uncracked regions to form supplemental subsurface laser damage in the substrate and promote formation of additional cracks in the uncracked regions along or proximate to the first average depth position, for formation of a first reduced thickness portion of the substrate; or (ii) change an instruction set, associated with the substrate, for forming subsurface laser damage when producing subsurface laser damage patterns at a second average depth position and any subsequent average depth positions in the substrate, for formation of a second and any subsequent reduced thickness portions of the substrate.

In certain embodiments, the analyzing performed by the computing device comprises quantifying a top area property of the one or more uncracked regions in the interior of the substrate, and comparing the top area property to at least one predetermined threshold area property.

In certain embodiments, the at least one predetermined threshold area property comprises a first predetermined threshold area property and a second predetermined threshold area property, the second predetermined threshold area property being greater than the first predetermined threshold area property; the computing device is configured to control the material processing apparatus to perform step (ii) if the top area property is at least as large as the first predetermined threshold area property; and the computing device is configured to control the material processing apparatus to perform step (i) if the top area property is at least as large as the second predetermined threshold area property.

In certain embodiments, the material processing apparatus further comprises a memory configured to store the instruction set, associated with the substrate, for forming subsurface laser damage in the substrate, wherein the memory is accessible to the computing device.

In certain embodiments, the material processing apparatus further comprises a fracturing station configured to receive the substrate from the laser processing station.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Other aspects, features and embodiments of the present disclosure will be more fully apparent from the ensuing disclosure and appended claims.

BRIEF DESCRIPTION OF DRAWINGS

The accompanying drawings incorporated in and forming a part of this specification illustrate several aspects of the disclosure, and together with the description serve to explain the principles of the disclosure.

FIG. 1 includes a first frame providing a perspective view of an ingot received by a conventional wire saw tool and being subjected to a wire sawing process, and a second frame providing a perspective view of multiple wafers obtained by the wire sawing process.

FIG. 2 is a first perspective view crystal plane diagram showing the coordinate system for a hexagonal crystal such as 4H—SiC.

FIG. 3 is a second perspective view crystal plane diagram for a hexagonal crystal, illustrating a vicinal plane that is non-parallel to the c-plane.

FIG. 5 is a top plan view of an exemplary SiC wafer, with superimposed arrows showing crystallographic orientation directions.

FIG. 6A is a side elevation schematic view of an on-axis ingot of crystalline material.

FIG. 6B is a side elevation schematic view of the ingot of FIG. 6A being rotated by 4 degrees, with a superimposed pattern for cutting end portions of the ingot.

FIG. 6C is a side elevation schematic view of an ingot following removal of end portions to provide end faces that are non-perpendicular to the c-direction FIG. 7 is a perspective view schematic of a moveable laser tool configured to focus laser emissions within an interior of a crystalline material to form subsurface damage.

FIG. 42 is a schematic illustration of a material processing apparatus according to one embodiment, including a laser processing station, a material fracturing station, multiple coarse grinding stations arranged in parallel, a fine grinding station, a surface coating station, an edge grinding station, a coating removal station, and a CMP station.

FIG. 43A is a schematic side cross-sectional view of a first apparatus for holding an ingot having end faces that are non-perpendicular to a sidewall thereof, according to one embodiment.

FIG. 43B is a schematic side cross-sectional view of a second apparatus for holding an ingot having end faces that are non-perpendicular to a sidewall thereof, according to one embodiment.

DETAILED DESCRIPTION

Figure 4A:
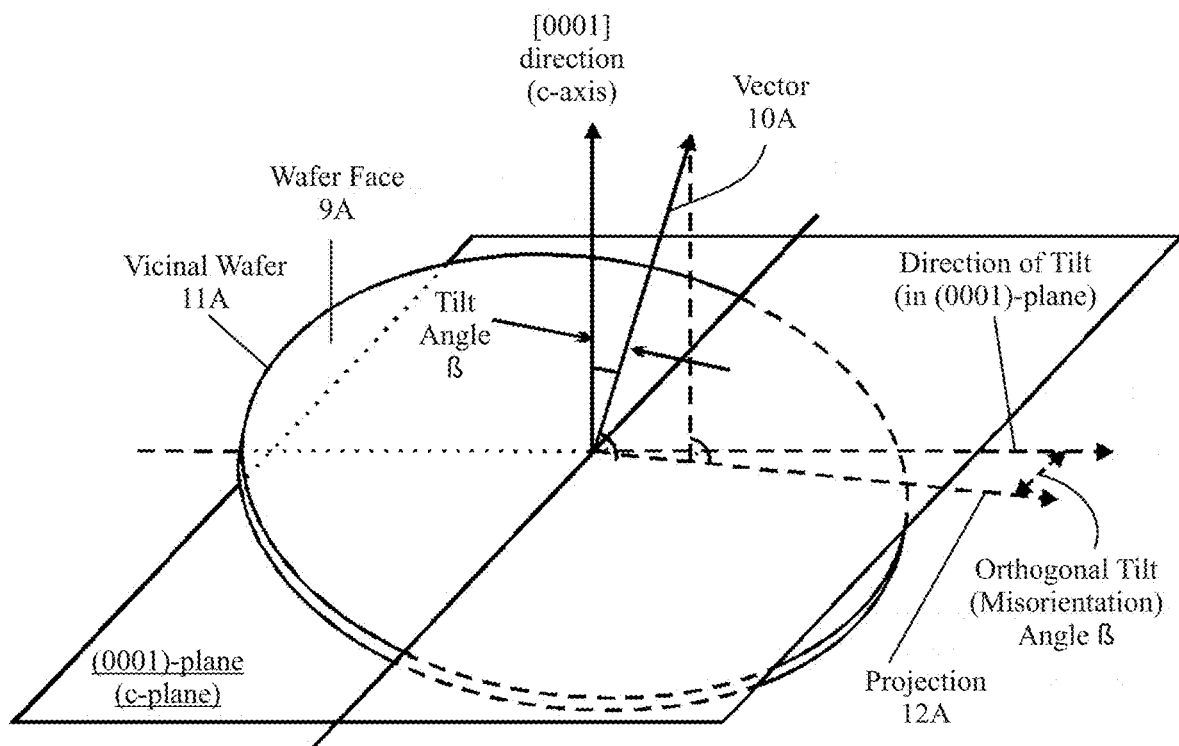
FIG. 4A is a perspective view wafer orientation diagram showing orientation of a vicinal wafer relative to the c-plane.
Figure 4B:
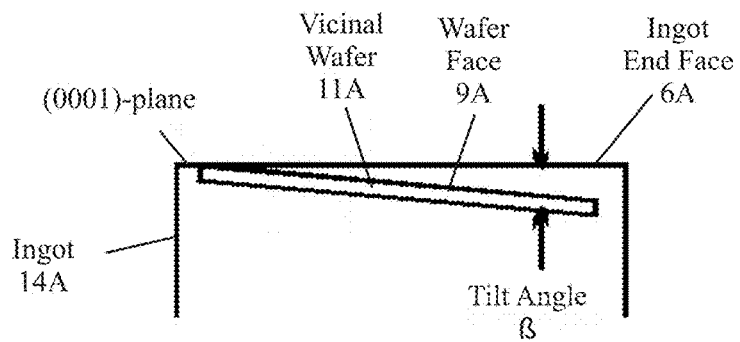
FIG. 4B is a simplified cross-sectional view of the vicinal wafer of FIG. 4A superimposed over a portion of an ingot.

The present disclosure relates in various aspects to methods for processing a crystalline material substrate and a material processing apparatus. A crystalline material processing method includes generating subsurface laser damage sites in areas of the crystalline material at a first average depth position to promote formation of cracks in the substrate interior propagating outward from a subsurface laser damage pattern, imaging the substrate top surface, analyzing the image to identify a condition indicative of presence of uncracked regions within the substrate, and taking one or more actions responsive to the analyzing (e.g., upon attainment of appropriate conditions). One potential action includes forming supplemental subsurface laser damage at the first average depth position to promote formation of additional cracks in the uncracked regions, for formation of a first reduced thickness portion of the substrate (e.g., a first wafer). Another potential action includes changing an instruction set for producing subsequent laser damage formation (at second or subsequent average depth positions, for formation of second and any reduced thickness portions of the substrate), without necessarily forming additional damage at the first average depth position. The laser damage facilitates subsequent fracture of the substrate to yield multiple substrate portions of reduced thickness.

In certain embodiments, the analyzing comprises quantifying a top area property of the one or more uncracked regions in the interior of the substrate, and comparing the top area property to at least one predetermined threshold area property. In certain embodiments, if a first threshold area property is exceeded, then average laser power is incrementally increased in a subsequent laser damage formation step (i.e., at second or subsequent average depth positions, for formation of second and subsequent reduced thickness substrate portions), without necessarily forming additional damage at the first average depth position. As an alternative to, or in addition to, increasing laser power, a laser focusing depth relative to a top surface may be altered and/or a number of laser damage formation passes may be altered, in an instruction set for performing a second and subsequent laser damage formation step. If a second, greater threshold area property is exceeded (suggesting that uncracked regions may be large enough to impede fracturing), then supplemental subsurface laser damage is formed at the first average depth position, to supplement the at least one subsurface laser damage pattern and promote formation of additional cracks in the uncracked regions along or proximate to the first average depth position, for formation of a reduced thickness portion of the substrate. This supplemental damage may be formed before the substrate is removed from the laser processing station, thereby enhancing laser processing station throughput by avoiding superfluous substrate demounting and re-mounting steps.

In additional aspects, the present disclosure relates to a material processing apparatus that comprises a laser processing station configured to process a substrate of crystalline material, the laser processing station comprising: a laser configured to form subsurface laser damage regions within an interior of the substrate; at least one translation stage configured to effect relative movement between the laser and the substrate; a diffuse light source configured to illuminate a top surface of the substrate, wherein the diffuse light source is arranged to be positioned to a first lateral side of the substrate; and an imaging device configured to generate at least one image of the top surface of the substrate, wherein the imaging device is configured to be positioned to a second lateral side of the substrate that opposes the first lateral side. Such apparatus causes uncracked regions adjacent to subsurface laser damage within a substrate interior to be visible at a surface thereof as dark (e.g., black or nearly black) spots on a top surface of the substrate. Such apparatus also causes regions having different degrees of cracking among subsurface laser damage areas to exhibit different colors at the top surface of the substrate. Since dark spots typically appear first in the facet area (corresponding to the doping ring), in certain embodiments, the facet area can be isolated.

As mentioned previously, variations in material and/or optical properties within a thick substrate (such as a SiC ingot), and also among different ingots of the same composition, render it challenging to easily and reproducibly fabricate wafers of uniform thickness by laser processing while avoiding unnecessary material loss. Applicant has found that, when wafers are sequentially formed from SiC ingots by formation of subsurface laser damage followed by fracturing, it is necessary to increase laser power as damage formation progresses in depth position to enable successful fracture. (Restated, when forming multiple wafers from a SiC ingot, initial wafers distal from the seed crystal may be successfully parted following formation of laser damage produced at a lower average laser power, but progressively higher laser power levels become necessary for laser damage used to part subsequent wafers as the growth position of the parted wafers gets closer to the seed crystal.) This behavior is believed to be primarily driven by bulk optical absorption changes, but may also be influenced by other changes in the crystal lattice. One theoretical solution to this problem would be to simply use high laser power at each sequential depth position when forming subsurface damage, but this would result in unnecessary material loss when damage is produced "early" in the ingot (e.g., at the first several depth positions distal from the seed crystal), and would also significantly increase wafer-to-wafer thickness spread due to variability in both the damage depth and the point at which decomposition is reached relative to a laser beam waist (resulting from the focal length of a beam focusing optic). Trying to constantly adjust for wafer thickness is neither practical nor accurate due to measurement inaccuracies caused by rough surfaces produced by the laser separation process, and due to the relationship between laser depth and required laser power.

Before detailing specific features of the foregoing method and apparatus (with particular embodiments being described in connection with FIGS. 45 to 51), apparatuses and methods for processing crystalline material substrates will be introduced.

Terminology and Definitions

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

As used herein, a "substrate" refers to a crystalline material, such as a single crystal semiconductor material, optionally comprising an ingot or a wafer, that is divisible into at least two thinner portions having substantially the same lateral dimensions (e.g., diameter, or length and width) as the substrate, and having sufficient thickness (i) to be surface processed (e.g., lapped and polished) to support epitaxial deposition of one or more semiconductor material layers, and optionally (ii) to be free-standing if and when separated from a rigid carrier. In certain embodiments, a substrate may have a generally cylindrical shape, and/or may have a thickness of at least about one or more of the following thicknesses: 300 μm, 350 μm, 500 μm, 750 μm, 1 mm, 2 mm, 3 mm, 5 mm, 1 cm, 2 cm, 5 cm, 10 cm, 20 cm, 30 cm, or more. In certain embodiments, a substrate may include a thicker wafer that is divisible into two thinner wafers. In certain embodiments, a substrate may be part of a thicker wafer having one or more epitaxial layers (optionally in conjunction with one or more metal contacts) arranged thereon as part of a device wafer with a plurality of electrically operative devices. The device wafer may be divided in accordance with aspects of the present disclosure to yield a thinner device wafer and a second thinner wafer on which one or more epitaxial layers (optionally in conjunction with one or more metal contacts) may be subsequently formed. In certain embodiments, a substrate may comprise a diameter of 150 mm or greater, or 200 mm or greater. In certain embodiments, a substrate may comprise 4H—SiC with a diameter of 150 mm, 200 mm, or greater, and a thickness in a range of 100 to 1000 microns, or in a range of 100 to 800 microns, or in a range of 100 to 600 microns, or in a range of 150 to 500 microns, or in a range of 150 to 400 microns, or in a range of 200 to 500 microns, or in any other thickness range or having any other thickness value specified herein.

The terms "first average depth position," "second average depth position," and "subsequent average depth position" as used herein refer to depth positions (e.g., horizontal planes) within a substrate, as measured from an initial top surface of the substrate, for formation of reduced thickness portions of the substrate. For example, a first average depth position may correspond to a subsurface laser damage position for forming a first wafer from an ingot, a second average depth position may correspond to a subsurface laser damage position for forming a second wafer from the ingot, and so on. In certain embodiments, each reduced thickness portion derived from the substrate has the same or substantially the same thickness. The term "average depth position" is used instead of depth position in recognition of the fact that in certain embodiments, a laser focusing depth may be subject to small differences between passes or even within a single pass for formation of a laser damage pattern for formation of a single reduced thickness portion of a substrate (e.g., one wafer), with such small differences preferably being in a range of 1 to 10 microns, or 2 to 8 microns, or 2 to 6 microns. This is to be distinguished from the much greater difference between first and second average depth positions, which is typically in a range of at least 100 microns (or at least 150 microns, 200 microns, 300 microns, 400 microns, 500 microns or more).

The embodiments set forth below represent the necessary information to enable those skilled in the art to practice the embodiments and illustrate the best mode of practicing the embodiments. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Materials

Methods disclosed herein may be applied to substrates of various crystalline materials, of both single crystal and polycrystalline varieties. In certain embodiments, methods disclosed herein may utilize cubic, hexagonal, and other crystal structures, and may be directed to crystalline materials having on-axis and off-axis crystallographic orientations. In certain embodiments, methods disclosed herein may be applied to semiconductor materials and/or wide bandgap materials. Exemplary materials include, but are not limited to, Si, GaAs, and diamond. In certain embodiments, such methods may utilize single crystal semiconductor materials having hexagonal crystal structure, such as 4H—SiC, 6H-SIC, or Group III nitride materials (e.g., GaN, AlN, InN, InGaN, AlGaN, or AlInGaN). Various illustrative embodiments described hereinafter mention SiC generally or 4H—SiC specifically, but it is to be appreciated that any suitable crystalline material may be used. Among the various SiC polytypes, the 4H—SiC polytype is particularly attractive for power electronic devices due to its high thermal conductivity, wide bandgap, and isotropic electron mobility. Bulk SiC may be grown on-axis (i.e., with no intentional angular deviation from the c-plane thereof, suitable for forming undoped or semi-insulating material) or off-axis (typically departing from a grown axis such as the c-axis by a non-zero angle, typically in a range of from 0.5 to 10 degrees (or a subrange thereof such as 2 to 6 degrees or another subrange), as may be suitable for forming N-doped or highly conductive material). Embodiments disclosed herein may apply to on-axis and off-axis crystalline materials, as well as doped and unintentionally doped crystalline semiconductor materials. Doped semiconductor material (e.g., N-doped SiC) exhibits some infrared absorption, thus requiring the use of higher laser power than undoped material to impart subsurface laser damage. In certain embodiments, crystalline material may include single crystal material, and may further include single crystal semiconductor material. Certain embodiments disclosed herein may utilize on-axis 4H—SiC or vicinal (off-axis) 4H—SiC having an offcut in a range of from 1 to 10 degrees, or from 2 to 6 degrees, or about 4 degrees.

Certain embodiments herein may use substrates of doped or undoped SiC, such as SiC ingots (also known as boules), which may be grown by physical vapor transport (PVT) or other conventional ingot fabrication methods. If doped SiC is used, such doping may render the SiC N-type or semi-insulating in character. In certain embodiments, a N-type SiC ingot is intentionally doped with nitrogen. In certain embodiments, a N-type SiC ingot includes resistivity values within a range of 0.015 to 0.028 Ohm-cm. In certain embodiments, a SiC ingot may have resistivity values that vary with vertical position, such that different substrate portions (e.g., wafers) have different resistivity values, which may be due to variation in bulk doping levels during ingot growth. In certain embodiments, a SiC ingot may have doping levels that vary horizontally, from a higher doping region proximate to a center of the ingot to a lower doping level proximate to a lateral edge thereof. Variation in ingot doping and resistivity with respect to vertical and horizontal position may render it necessary to adjust laser damage formation parameters for formation of different reduced thickness portions (e.g., wafers) of a substrate (e.g., an ingot) and/or during formation of a single reduced thickness portion of a substrate. In certain embodiments, resistivity is greatest proximate to an exposed surface of an ingot, and is lowest proximate to a growth seed. A reduction in resistivity corresponds to an increase in doping and an increase in laser absorption.

FIGS. 6A and 6C schematically illustrate on-axis and off-axis crystalline substrates in the form of ingots that may be utilized with methods disclosed herein. FIG. 6A is a side elevation schematic view of an on-axis ingot 15 of crystalline material having first and second end faces 16, 17 that are perpendicular to the c-direction (i.e., [0001] direction for a hexagonal crystal structure material such as 4H—SiC). FIG. 6B is a side elevation schematic view of the ingot 15 of FIG. 6A being rotated by four degrees, with a superimposed pattern 18 (shown in dashed lines) for cutting and removing end portions of the ingot 15 proximate to the end faces 16, 17. FIG. 6C is a side elevation schematic view of an off-axis ingot 15A formed from the ingot 15 of FIG. 6B, following removal of end portions to provide new end faces 16A, 17A that are non-perpendicular to the c-direction. If laser emissions of a first depth are supplied through an end face 16 of the ingot 15 to form subsurface laser damage, a carrier (not shown) is joined to the end face 16, and the ingot 15 is fractured along the subsurface laser damage, then an on-axis wafer may be formed. Conversely, if laser emissions of a first depth are supplied through an end face 16A of the off-axis ingot 15A to form subsurface laser damage, a carrier (not shown) is joined to the end face 16A, and the ingot 15A is fractured along the subsurface laser damage, then an off-axis wafer may be formed.

Subsurface Laser Damage Formation

Processing of a crystalline material substrate to form multiple patterns of subsurface laser damage facilitates subsequent fracture of the substrate to yield reduced thickness first and second crystalline material portions of the substrate. Certain methods involve interspersing of multiple sequentially formed pluralities of substantially parallel lines of multiple subsurface laser damage patterns, respectively, wherein at least some lines of a second (e.g., subsequently formed) plurality of lines do not cross lines of a first plurality of lines. Certain methods involve formation of initial and subsequent subsurface laser damage patterns each comprising a plurality of substantially parallel lines in a substrate of crystalline material, with lines of the initial and subsequent pluralities of substantially parallel lines being non-parallel to one another, wherein an angular direction of lines of the subsequent plurality of substantially parallel lines differs by no more than 10 degrees from an angular direction of lines of the initial plurality of substantially parallel lines, and at least some lines of the subsequent plurality of substantially parallel lines do not cross any lines of the initial plurality of substantially parallel lines. Certain methods involve formation of an initial subsurface laser damage pattern substantially centered at an initial depth within an interior of a crystalline material of a substrate, and formation of a subsequent subsurface laser damage pattern substantially centered at a subsequent depth (differing from the initial depth) within the substrate, wherein the subsequent subsurface laser damage pattern is substantially registered with the initial subsurface laser damage pattern, and vertical extents of at least portions of the initial and subsurface laser damage patterns are overlapping.

Sequential formation of interspersed or interleaved subsurface laser damage patterns distributed over a crystalline material is believed to beneficially maintain sufficient stress within a crystalline material to facilitate subsequent material fracture using methods herein, while enabling high laser tool throughput in conjunction with modest material damage and concomitantly low kerf losses. It would be simple in principle to use high laser power and scan nearly an entirety of a crystalline material to facilitate fracturing along a laser damage line. Such an approach can reliably separate thin layers of crystalline material from a bulk substrate (e.g., an ingot), but high laser power tends to increase material damage, necessitating significant surface processing (e.g., grinding and planarization) to remove the damage. Close spacing between laser damage lines will help promote fracture, but at the cost of significantly reducing throughput of a laser processing tool. A conventional approach for forming subsurface laser damage has involved forming a subsurface laser damage line in a forward direction across a crystalline material, followed by relative indexing in a lateral direction between the material and a laser, followed by forming a subsurface laser damage line in a rearward direction, followed by lateral indexing in the same lateral direction, and so on. Such approach generally requires higher laser power or closer spacing between sequentially formed laser damage lines, which will tend to reduce throughput or impart a greater degree of damage, thereby increasing kerf loss due to the need to remove additional material from laser-processed surfaces for removal of the laser damage. This conventional approach does not involve forming a first distributed subsurface laser damage pattern (e.g., involving formation of a first plurality of laser damage regions over multiple non-overlapping areas of a substrate) followed by formation of a second distributed subsurface laser damage pattern (e.g., involving formation of a second plurality of laser damage regions over the same multiple non-overlapping areas of the substrate), with the second subsurface laser damage pattern being interleaved or interspersed among the first subsurface laser damage pattern.

Various embodiments disclosed herein address the concern of promoting reliable separation of thin layers (e.g., wafers) of crystalline material from a substrate without unduly high laser power, while enabling high laser tool throughput and providing low kerf losses. Certain embodiments herein involve forming an initial distributed subsurface laser damage pattern in a crystalline material substrate (e.g., over each area of a plurality of non-overlapping areas of the substrate), then forming at least one subsequent distributed subsurface laser damage pattern in the same substrate (e.g., over each area of the same plurality of non-overlapping areas), wherein at least portions (e.g., lines) of the at least one subsequent laser damage pattern are arranged in gaps between laser damage lines of the initial laser damage pattern, thereby providing interspersed or interleaved subsurface laser damage patterns. In certain embodiments, at least some (or all) laser damage lines of at least one subsequently formed laser damage pattern do not cross laser damage lines of an initial subsurface laser damage pattern. It is believed that non-crossing of laser damage patterns may beneficially avoid localized stresses from being dissipated. In certain embodiments, first and second interspersed subsurface laser damage patterns are formed in such a manner to prevent propagation of localized subsurface cracks therebetween, but application of a third (or subsequent) interspersed subsurface laser damage pattern will cause localized subsurface cracks to propagate and join in a substantially continuous manner over an entire internal plane of a crystalline material substrate, thereby easing subsequent fracture along the laser damage region using techniques disclosed herein. Formation of interspersed subsurface laser damage according to methods described herein has been observed to permit reliable separation of thin layers of crystalline material from a substrate with a smaller number of laser damage lines per layer to be removed, beneficially providing increased laser tool throughput while providing low levels of laser damage (enabling low kerf losses).

Various embodiments refer to laser subsurface damage including lines that are oriented relative to a crystal structure of a substrate. In certain embodiments, a substrate comprises a crystalline material having a hexagonal crystal structure, wherein laser damage lines are oriented perpendicular to, or within ±5 degrees of perpendicular to, a <11$\bar{2}$0> direction of the hexagonal crystal structure and parallel or substantially parallel to (e.g., within ±5 degrees, ±3 degrees, or ±1 degree of) a surface of the substrate. Although a primary flat on a conventional 4H—SiC wafer is intended to be oriented parallel to the <11$\bar{2}$0> direction of the hexagonal crystal structure, a primary flat may not be truly parallel to such direction due to variations in manufacturing. Various SiC wafer manufacturers provide published specifications for primary flat orientation of ±5 degrees from parallel to the <11$\bar{2}$0> direction of the hexagonal crystal structure. It is therefore preferred to use x-ray diffraction (XRD) data rather than wafer flat alignment to determine proper laser orientation for formation of subsurface laser damage.

Tools for forming laser subsurface damage in crystalline materials are known in the art and commercially available from various providers, such as Disco Corporation (Tokyo, Japan). Such tools permit laser emissions to be focused within an interior of a crystalline material substrate, and enable lateral movement of a laser relative to the substrate.

Typical laser damage patterns in the art include formation of parallel lines that are laterally spaced relative to one another at a depth within a crystalline substrate. Parameters such as focusing depth, laser power, translation speed, and subsurface damage line spacing may be adjusted to impart laser damage, but adjustment of certain factors involves tradeoffs. Increasing laser power tends to impart greater subsurface damage that may enhance ease of fracturing (e.g., by reducing the stress required to complete fracturing), but greater subsurface damage increases surface irregularities along surfaces exposed by fracturing, such that additional processing may be required to render such surfaces sufficiently smooth for subsequent processing (e.g., for incorporation in electronic devices), and the additional processing leads to additional kerf losses. Reducing lateral spacing between subsurface laser damage lines may also enhance ease of fracturing, but a reduction in spacing between laser damage lines increases the number of translational passes between a substrate and a laser, thereby reducing tool throughput.

FIG. 7 is a perspective view schematic of one example of a laser tool 29 configured to focus laser emissions within an interior of a crystalline material 30 to form subsurface damage 40. The crystalline material 30 includes an upper surface 32 and an opposing lower surface 34, and the subsurface damage 40 is formed in the interior of the crystalline material 30 between the upper and lower surfaces 32, 34. Laser emissions 36 are focused with a lens assembly 35 to yield a focused beam 38, with a focal point thereof being in the interior of the crystalline material 30. Such laser emissions 36 may be pulsed at any suitable frequency (typically in the nanosecond, picosecond, or femtosecond range) and beam intensity, with a wavelength below the bandgap of the crystalline material 30 to permit the laser emissions 36 to be focused at a targeted depth below a surface thereof. At the focal point, the beam size and short pulse width results in an energy density high enough to result in very localized absorption that forms subsurface damage. One or more properties of the lens assembly 35 may be altered to adjust a focal point of the focused beam 38 to a desired depth within the crystalline material 30. Relative lateral motion (e.g., lateral translation) between the lens assembly 35 and the crystalline material 30 may be effected to propagate the subsurface damage 40 in a desired direction, as schematically illustrated by dashed line 44. Such lateral movement may be repeated in various patterns, including patterns as described hereinafter.

Figure 8A:
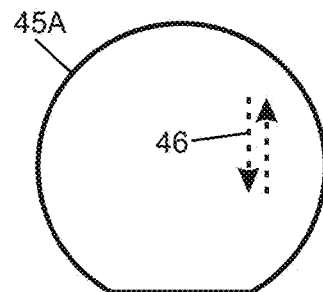
FIGS. 8A and 8B provide exemplary laser tool travel paths relative to a crystalline material for formation of subsurface damage within the crystalline material, with FIG. 8B including a superimposed arrow showing orientation of subsurface damage lines relative to the [11$\bar{2}$0] direction of a hexagonal crystal structure of the crystalline material.
Figure 8B:
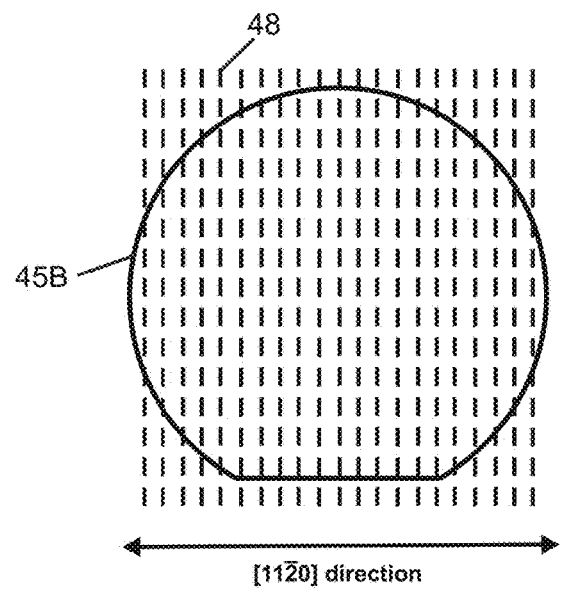

FIGS. 8A and 8B provide exemplary laser tool travel paths relative to a crystalline material for formation of subsurface damage within the crystalline material. In certain embodiments, a laser tool portion (e.g., including a lens assembly) may be configured to move while a crystalline material is stationary; in other embodiments, a laser tool portion may be held stationary while a crystalline material is moved relative to the tool portion. FIG. 8A shows a reversing y-direction linear scanning movement 46 suitable for forming subsurface damage in a pattern of laterally spaced parallel lines within a first crystalline material 45A. FIG. 8B shows y-direction linear scanning movement 48 over (and beyond) an entire surface of a crystalline material 45B (with slight advancement in an x-direction upon each reversal in y-direction), sufficient to form parallel subsurface laser damage lines distributed through the crystalline material 45B. As shown, the laser damage lines are perpendicular to the [11$\bar{2}$0] direction of a hexagonal crystal structure of the crystalline material 45B along a surface of the crystalline material 45B, and are and substantially parallel to the surface of the crystalline material 45B.

Coverage of an entire surface of a crystalline material with laser lines formed in a y-direction, with unidirectional advancement in the x-direction following each y-direction reversal, may be referred to as a single pass of laser damage formation. In certain embodiments, laser processing of crystalline material to form subsurface damage may be performed in two, three, four, five, six, seven, or eight passes, or any other suitable number of passes. Increasing the number of passes at lower laser power can reduce kerf losses. To achieve a desirable balance of material loss versus process speed, desirable numbers of laser subsurface damage formation passes have been found to be two to five passes, or three to four passes, prior to performance of a fracturing step.

In certain embodiments, lateral spacing between adjacent laser subsurface damage lines (whether formed in a single pass or multiple passes) may be in a range of from 80 to 400 microns, or from 100 to 300 microns, or from 125 to 250 microns. Lateral spacing between adjacent laser subsurface damage lines impacts laser processing time, ease of fracture, and (depending on c-plane orientation or mis-orientation) effective laser damage depth.

It has been observed that forming subsurface laser damage lines in crystalline material results in formation of small cracks in the interior of the material propagating outward (e.g., laterally outward) from the laser damage lines. Such cracks appear to extend substantially or predominantly along the C-plane. The length of such cracks appears to be functionally related to laser power level (which may be calculated as the product of pulse frequency times energy per pulse). For adjacent laser subsurface damage lines spaced apart by a specific distance, it has been observed that increasing laser power in forming such laser subsurface damage lines tends to increase the ability of cracks to connect or join between the laser subsurface damage lines, which is desirable to promote ease of fracturing.

If the crystalline material subject to laser damage formation includes an off-axis (i.e., non c-plane) orientation (e.g., in a range of from 0.5-10 degrees, 1-5 degrees, or another misorientation), such misorientation may affect desirable laser damage line spacing.

Figure 9:
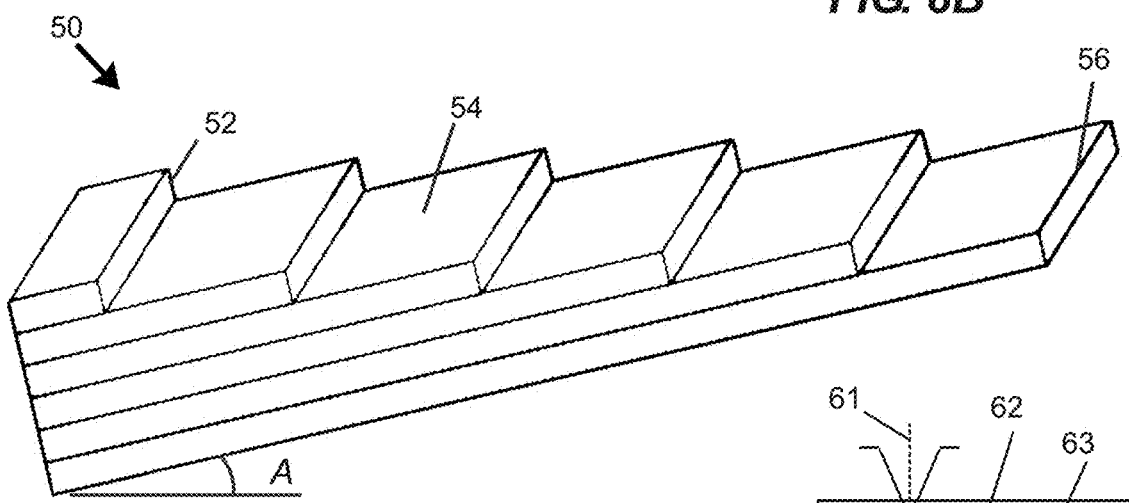
FIG. 9 is a perspective view schematic of the surface structure of an off-axis (relative to the c-axis) or vicinal 4H—SiC crystal after fracture but prior to smoothing, with the fractured surface exhibiting terraces and steps.

A SiC substrate may include surfaces that are misaligned (e.g., off-axis at an oblique angle relative to) the c-plane. An off-axis substrate may also be referred to as a vicinal substrate. After fracturing such a substrate, the as-fractured surface may include terraces and steps (which may be smoothed thereafter by surface processing such as grinding and polishing). FIG. 9 is a perspective view schematic of a surface structure of an off-axis 4H—SiC crystal 50 (having an angle A relative to a c-axis basal plane) after fracture but prior to smoothing. The fractured surface exhibits steps 52 and terraces 54 relative to a c-axis basal plane 56. For a 4 degree off-axis surface, steps theoretically have a height of about 17 microns for a terrace width of 250 microns. For a 4H—SiC crystal having subsurface laser damage, 250 micron spacing between laser lines forms terraces of 250 micron width. After fracturing, the stepped surface is subject to being ground smooth, planarized, and polished in preparation for epitaxial growth of one or more layers thereon.

When subsurface laser damage is formed in crystalline material (e.g., SiC), and if subsurface laser damage lines are oriented away from perpendicular to a substrate flat (i.e., non-perpendicular to the [11$\bar{2}$0] direction), then such laser damage lines extend through multiple steps and terraces in a manner equivalent to off-axis semiconductor material. For purposes of subsequent discussion, the term "off-axis laser subsurface damage lines" will be used to refer to laser subsurface damage lines that are non-perpendicular to the [11$\bar{2}$0] direction.

Providing spacing that is too large between adjacent subsurface laser damage lines inhibits fracture of crystalline material. Providing spacing that is too small between adjacent subsurface laser damage lines tends to reduce step heights, but increases the number of vertical steps, and increasing the number of vertical steps typically requires greater separation force to complete fracturing.

Reducing spacing between adjacent laser damage lines to a distance that is too small may yield diminishing returns and substantially increase processing time and cost. A minimum laser energy threshold is required for SiC decomposition. If this minimum energy level creates connected cracks between two laser lines spaced about 100 microns apart, then reducing laser line spacing below this threshold likely offers little benefit in terms of reducing kerf loss.

Surface roughness of crystalline material exposed by fracturing can impact not only subsequent handling such as robot vacuum, but also grind wheel wear, which is a primary consumable expense. Roughness is impacted by both the spacing of subsurface laser damage lines and orientation of such subsurface damage lines relative to the crystal structure of the semiconductor material. Reducing a gap between subsurface damage lines simply reduces potential step height. Providing off-axis laser subsurface damage lines tends to breaks up the long parallel steps that would otherwise be present at the laser damage region, and it also helps mitigate at least some impact from C plane slope or curvature. When the laser lines are perpendicular to the flat of a substrate, the cleave plane parallel to the laser lines along the C plane extends about 150 mm from the flat to the opposing curved end of the wafer. Slight deviations in the C plane slope or curvature (which are common for SiC substrates) can create significant variability in the fractured surface as it forces plane jumping as a fracture propagates. A drawback to providing off-axis laser subsurface damage lines is that such subsurface damage lines generally require laser power to be increased to form connected cracks between adjacent laser lines. Thus, in certain embodiments, forming a combination of on-axis subsurface laser damage lines (that are perpendicular to the primary flat) and off-axis laser subsurface damage lines provides a good balance between avoiding excessive variability in the fractured surface without requiring unduly increased laser power to form connected cracks between adjacent laser lines.

In certain embodiments, a laser having a wavelength of 1064 nm may be used to implement methods disclosed herein, with the inventors having gained experience in processing of 4H—SiC. Although a wide range of pulse frequencies may be used in certain embodiments, pulse frequencies of 120 kHz to 150 kHz have been successfully employed. A translation stage speed of 936 mm/s between a laser and a substrate to be processed has been successfully utilized; however, higher or lower translation stage speeds may be used in certain embodiments with suitable adjustment of laser frequency to maintain desirable laser pulse overlap. Average laser power ranges for forming subsurface laser damage in doped SiC material are in a range of from 3 W to 8 W, and 1 W to 4 W for undoped SiC material. Laser pulse energy may be calculated as power divided by frequency. Laser pulse widths of 3 ns to 4 ns may be used, although other pulse widths may be used in other embodiments. In certain embodiments, a laser lens Numerical Aperture (NA) in a range of 0.3 to 0.8 may be used. For embodiments directed to processing of SiC, given the refractive index change going from air (~1) to SiC (~2.6), a significant change in refractive angle is experience inside SiC material to be processed, making laser lens NA and aberration correction important to achieving desirable results.

One of the primary drivers of kerf loss is subsurface laser damage below the primary fracture region on the ingot side. In general, an increase in subsurface laser damage increases kerf loss. One potential cause of increased subsurface laser damage is a failure to adequately compensate for the optical characteristics of the crystalline material. In certain embodiments, optical parameter optimization may be periodically performed (e.g., each time a crystalline material substrate (e.g., ingot) is supplied to the laser tool) prior to formation of subsurface laser damage in a substrate. Such optimization may utilize variable height adjustment to attainment of an initial state in which a best focus point of the laser beam is formed an upper surface of the crystalline material substrate, followed by adjusting the aperture and/or correction collar adjustment ring of the laser tool corresponding to a desired depth of formation of subsurface laser damage in the crystalline material according to a subsequent state.

In certain embodiments, a crystalline material substrate may exhibit doping that varies with respect to position (e.g., laterally and/or with diameter) across a primary surface (e.g., face) of the substrate. Dopant density is usually higher in a central region of a SiC {0001} wafer, as observable by a darker color in such region. This increased dopant density is due to enhanced impurity incorporation that occurs during facet growth. During growth of a SiC {0001} ingot, a {0001} facet appears near the center of the ingot. On the {0001} facet, fast spiral growth takes place, but crystal growth rates along the <0001> direction is relatively slow. Therefore, impurity concentration is enhanced along the {0001} facet region. The dopant density at the center (i.e., the facet region) of a SiC wafer may be 20% to 50% higher than a dopant density outside this region. Formation of a doping ring region of increased dopant concentration in SiC is shown in FIGS. 14A, 14C, and 14D. Such region exhibits higher laser absorption and slightly altered refractive index, wherein both of the foregoing phenomena impact depth of focusing of laser emissions in the substrate. Increasing laser power when impinging focused laser emissions into the doping ring region, relative to power used when impinging focused laser emissions into the material outside the doping ring region, can compensate for differing properties of the doping ring region. In certain embodiments, presence of a condition indicative of non-uniform doping of a crystalline material across at least a portion of a surface of the substrate may be detected to determine presence of at least one first doping region and at least one second doping region. (Methods for detecting different doping conditions include, but are not limited to, interferometry, resistivity measurement, absorption or reflectivity measurement, and other techniques known to those skilled in the art.) Thereafter, responsive to detection of the condition indicative of non-uniform doping of the crystalline material, laser power may be altered during formation of subsurface laser damage patterns to provide laser emissions at a first average power when forming subsurface laser damage in a first doping region, and to provide laser emissions at a second average power when forming subsurface laser damage in a second doping region, wherein the first and second average power levels differ from one another. Alternatively, or additionally, depth for formation of subsurface laser damage in the substrate (i.e., relative to an exposed surface of the substrate) when forming subsurface laser damage may be altered in one of the first doping region or the second doping region. In certain embodiments, a difference in laser focusing depth between first and second doping regions for formation of a single reduced thickness portion of a substrate (e.g., one wafer) may be in a range of 1 to 15 microns, or 1 to 10 microns, or 2 to 8 microns, or 4 to 6 microns.

In certain embodiments, a crystalline material substrate may exhibit laser absorption levels that vary with respect to vertical position in the substrate (e.g., within an ingot), particularly for intentionally doped material. Laser absorption levels may also vary from substrate to substrate (e.g., from ingot to ingot). It is believed that such changes may be attributable to doping changes. In certain embodiments, a lower average laser power (e.g., 3 W) may be used for formation of subsurface laser damage in a substrate region distal from a growth seed, and a higher average laser power (e.g., 5.5 W) may be used for formation of subsurface laser damage in a substrate region proximal to a growth seed.

In certain embodiments, for initial setting of laser subsurface damage to the correct depth relative to a surface of crystalline material substrate, an optical measurement of the depth of laser focus in the semiconductor material may be performed (e.g., taking into account semiconductor material/air index of refraction changes), and the setting of laser damage (e.g., laser power, laser focus, and/or number of laser damage formation passes) may be adjusted responsive to such measurement prior to scanning an entire surface of the substrate. In certain embodiments, an optical measurement of a depth of laser focus may be performed once per ingot, or each time after a portion of an ingot is fractured and removed (i.e., before formation of subsurface laser damage pattern(s) for each substrate layer to be removed by subsequent fracturing).

In certain embodiments, a semiconductor material processing method as disclosed herein may include some or all of the following items and/or steps. A second carrier wafer may be attached to a bottom side of a crystalline material substrate (e.g., ingot). Thereafter, a top side of the crystalline material substrate may be ground or polished, such as to provide an average surface roughness Ra of less than about 5 nanometers to prepare the surface for transmitting laser energy. Laser damage may then be imparted at a desired depth or depths within the crystalline material substrate, with spacing and direction of laser damage traces optionally being dependent on crystal orientation of the crystalline material substrate. A first carrier may be bonded to a top side of the crystalline material substrate. An identification code or other information linked to the first carrier is associated with a wafer to be derived from the crystalline material substrate. Alternatively, laser marking may be applied to the wafer (not the carrier) prior to separation to facilitate traceability of the wafer during and after fabrication. The crystalline material substrate is then fractured (using one or more methods disclosed herein) along a subsurface laser damage region to provide a portion of the semiconductor material substrate bound to the first carrier, and a remainder of the crystalline material substrate being bound to the second carrier. Both the removed portion of the semiconductor material substrate and the remainder of the semiconductor material substrate are ground smooth and cleaned as necessary to remove residual subsurface laser damage. The removed portion of the semiconductor material substrate may be separated from the carrier. Thereafter, the process may be repeated using the remainder of the semiconductor material substrate.

Whereas wire sawing of SiC wafers typically entails kerf losses of at least about 250 microns per wafer, laser- and carrier-assisted separation methods disclosed herein and applied to SiC may achieve kerf losses in a range of from 80 to 140 microns per wafer.

Figure 10A:
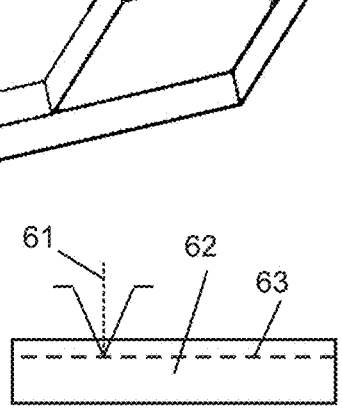
FIGS. 10A-10D are cross-sectional schematic views of formation of subsurface laser damage in a substrate of crystalline material by focusing laser emissions into a bare substrate, through a surface of a substrate supported by a carrier, through a carrier and an adhesive layer into a substrate, and through a carrier into a substrate, respectively.
Figure 10B:
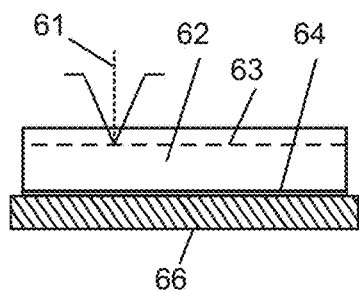
Figure 10C:
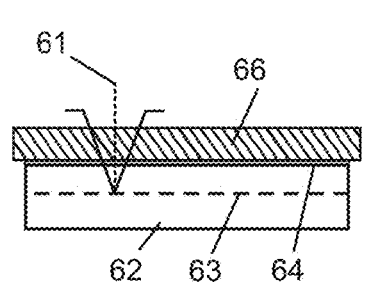
Figure 10D:
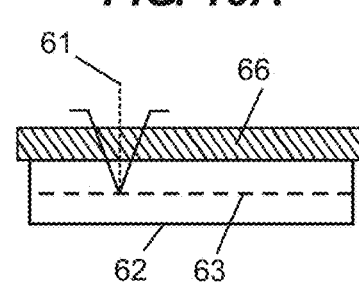

In certain embodiments, laser subsurface damage may be formed in a crystalline material substrate prior to bonding the substrate to a rigid carrier. In certain embodiments, a rigid carrier that is transparent to laser emissions of a desired wavelength may be bonded to a crystalline material substrate prior to subsurface laser damage formation. In such an embodiment, laser emissions may optionally be transmitted through a rigid carrier and into an interior of the crystalline material substrate. Different carrier-substrate subsurface laser formation configurations are shown in FIGS. 10A-10D. FIG. 10A is a schematic view of laser emissions 61 being focused through a surface of a bare substrate 62 to form subsurface laser damage 63 within the substrate 62, whereby a rigid carrier may be affixed to the substrate 62 following formation of the subsurface laser damage. FIG. 10B is a schematic view of laser emissions 61 being focused through a surface of a substrate 62 form subsurface laser damage 63 within the substrate 62, with the substrate 62 having previously been bonded using adhesive material 64 to a rigid carrier 66. FIG. 10C is a schematic view of laser emissions 61 being focused through a rigid carrier 66 and adhesive 64 to form subsurface laser damage 63 within a substrate 62 previously bonded to the rigid carrier 66. In certain embodiments, a surface of the substrate 62 distal from the rigid carrier 66 may include one or more epitaxial layers and/or metallization layers, with the substrate 62 embodying an operative electrical device prior to formation of the subsurface laser damage 63. FIG. 10D is a schematic view of laser emissions 61 being focused through a rigid carrier 66 into a substrate 62 (without an intervening adhesive layer) to form subsurface laser damage 63 within the substrate 62 previously bonded (e.g., via anodic bonding or other adhesiveless means) to the rigid carrier 66.

Interspersed Subsurface Laser Damage

In certain embodiments, subsurface laser damage may be formed in crystalline material by sequential formation of multiple interspersed laser damage patterns, with each subsurface laser damage pattern including a plurality of substantially parallel lines. In certain embodiments, each subsurface laser damage pattern may extend over substantially an entire length (e.g., perpendicular to a substrate flat) and include spaced-apart lines distributed over substantially an entire width, of a substrate of crystalline material. In certain embodiments, interspersed damage patterns may include sequentially formed first and second, or first through third, or first through fourth, subsurface laser damage patterns, with each subsurface laser damage pattern including multiple parallel lines. It is believed that sequentially forming multiple subsurface laser damage patterns in an interspersed fashion (e.g., forming a first subsurface damage pattern, then forming a second subsurface damage pattern, then forming any subsequent subsurface damage pattern(s), with various lines of each damage pattern distributed among the other damage patterns) is preferable to forming the same traces without interspersing to promote ease of fracturing of the crystalline material along or adjacent to a subsurface laser damage region. Without wishing to be bound by any specific theory as to reasons for improved fracturing results obtained by interspersing of subsurface laser damage patterns in a crystalline material, it is believed that sequential formation of interspersed subsurface laser damage patterns may preserve a greater degree of internal stress within the semiconductor material to facilitate lateral propagation of cracks emanating from different subsurface laser damage lines.

In certain embodiments, a first subsurface laser damage pattern in a crystalline material includes a first plurality of parallel lines and a first plurality of cracks in the interior of the crystalline material propagating laterally outward (e.g., predominantly or substantially along the c-plane) from lines of the first plurality of substantially parallel lines, wherein cracks emanating from each line are non-connecting with cracks emanating from each adjacent line. In certain embodiments, a second subsurface laser damage pattern including a second plurality of parallel lines is formed in the crystalline material after formation of the first subsurface laser damage pattern, wherein the second subsurface laser damage pattern includes a second plurality of cracks in the interior of the crystalline material propagating laterally outward from lines of the second plurality of substantially parallel lines, and at least some cracks of the second plurality of cracks connect with cracks emanating from two adjacent lines of the first plurality of lines (e.g., to form continuous cracks).

In certain embodiments, first, second, and third subsurface laser damage patterns are sequentially formed in a crystalline material, with each subsurface laser damage pattern including multiple parallel lines, and with lines of each subsurface laser damage pattern being distributed among lines of each other subsurface laser damage pattern. In certain embodiments, the first subsurface laser damage pattern comprises a first plurality of cracks in the interior of the crystalline material propagating laterally outward from lines of the first plurality of substantially parallel lines; the second subsurface laser damage pattern comprises a second plurality of cracks in the interior of the crystalline material propagating laterally outward from lines of the second plurality of substantially parallel lines, with the second plurality of cracks being non-connecting with the first plurality of cracks; and the third subsurface laser damage pattern comprises a third plurality of cracks in the interior of the crystalline material propagating laterally outward from lines of the third plurality of substantially parallel lines. In such an embodiment, at least some cracks of the third plurality of cracks connect with (i) at least some cracks of the first plurality of cracks and (ii) at least some cracks of the second plurality of cracks (e.g., to form continuous cracks). In certain embodiments, a fourth subsurface laser damage pattern may be formed after the first through third subsurface laser damage patterns, with the fourth subsurface laser damage pattern serving to further connect cracks emanating from any two or more of the first, second, or third lines. In certain embodiments, three, four, five, or more interspersed patterns of subsurface laser damage may be provided.

In certain embodiments, one or more portions of a substrate may include interspersed subsurface laser damage patterns, while other portions of a substrate may include non-interspersed laser damage patters. In certain embodiments, different interspersing patterns of subsurface laser damage may be provided on the same substrate. For example, an interspersing pattern of subsurface laser damage on a single substrate may include five damage lines in a first region, four damage lines in a second region, three damage lines in a third region, two damage lines in a fourth region, one damage lines in a fifth region (i.e., without interspersing), zero damage patterns in a sixth region, or any combination of two or three of the foregoing, optionally wherein each of the foregoing regions has substantially the same unit area. In certain embodiments, a regular (e.g., regularly repeating) pattern of interspersed damage lines may exist in at least one region of the substrate, and an irregular (e.g., lacking regular repeat) pattern of interspersed damage lines or non-interspersed damage lines may exist in at least one other region of the substrate.

Figure 11A:
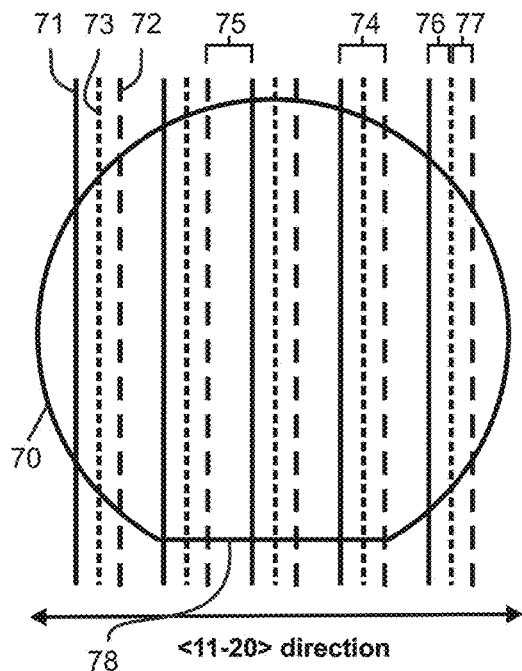
FIG. 11A provides a top plan view of a crystalline material substrate including interspersed first, second, and third subsurface laser damage patterns defined therein according to one embodiment, with each damage pattern including a plurality of substantially parallel lines perpendicular to the [11$\bar{2}$0] direction (and substantially perpendicular to a primary substrate flat), and with the laser damage patterns in combination forming multiple three-line groups that are separated from one another by an inter-group spacing that exceeds a spacing between adjacent lines in each three-line group.

FIG. 11A provides a top plan view of a crystalline material substrate 70 including interspersed first, second, and third subsurface laser damage patterns defined therein according to one embodiment. The first, second, and third subsurface damage patterns separately include first, second, and third pluralities of parallel lines 71, 72, 73, respectively, that extend perpendicular to a primary substrate flat 78 (and perpendicular to the [11$\bar{2}$0] direction). The three laser damage patterns in combination forming multiple three-line groups 74 that are separated from one another by an inter-group spacing 75 that exceeds a spacing 76, 77 between adjacent lines in each three-line group 74. For clarity, cracks formed by the first, second, and third pluralities of parallel lines 71, 72, 73 are not illustrated in FIG. 11A. In certain embodiments, the first plurality of parallel lines 71 is formed in a first pass, the second plurality of parallel lines 72 is formed in a second pass, and the third plurality of parallel lines 73 is formed in a third pass. The third pass may serve to connect cracks originally emanating from any of the first and/or second parallel lines 71, 72.

With continued reference to FIG. 11A, in one embodiment the first plurality of parallel lines 71 may be formed with a 500 micron pitch (i.e., spacing between lines), and the second plurality of parallel lines 72 may be formed with a 500 micron pitch and an offset of 250 microns relative to the first plurality of parallel lines 71. Thereafter, the third plurality of parallel lines 73 may be formed with a 500 micron pitch, and an offset of 125 microns relative to the first plurality of parallel lines 71. This arrangement creates multiple three-line groups 74 that are separated from each other three-line group by a 250 micron gap, with adjacent lines within each three-line group being separated from each other by a gap of 125 microns.

The inventors have found that the order of the three-pass laser damage formation process described in connection with FIG. 11A is important. If the order of passes is changed to sequentially form the first, third, and second pluralities of subsurface laser damage lines, then higher laser power is required to complete cracking across the 250 micron inter-group spacing 75. It is believed that this may be attributable to the cracking that occurs between the 125 micron spaced lines on the second pass when using the original (first, second, third pass) sequential order, in which cracks formed in the third pass are sufficiently sized to just connect cracks emanating from the second subsurface damage lines across the second 125 micron gap 77. When the order of the passes is first, third, second, then cracking across the inter-group spacing 75 is not observed unless laser power is increased, but laser power increases typically increase kerf loss. Thus, according to certain embodiments in which the order of passes is first, second, third, it may be desirable for cracks formed in the first and second passes not to connect with one another, and then for cracks formed in the third pass to create connected cracks across both the 125 micron gaps 76, 77 and the 250 micron inter-group spacing 75.

In certain embodiments, boundaries of each three-line group 74 may be considered to bound a damage-bearing area of the substrate 70, and the damage-bearing area of each three-line group 74 is spaced apart from a damage-bearing area of each other three-line group (i.e., by the inter-group spacing 75). Notably, as will be shown in FIG. 11D, the cracks formed by subsurface laser damage may propagate between adjacent three-line groups 74 across the inter-group spacing 75.

Figure 11B:
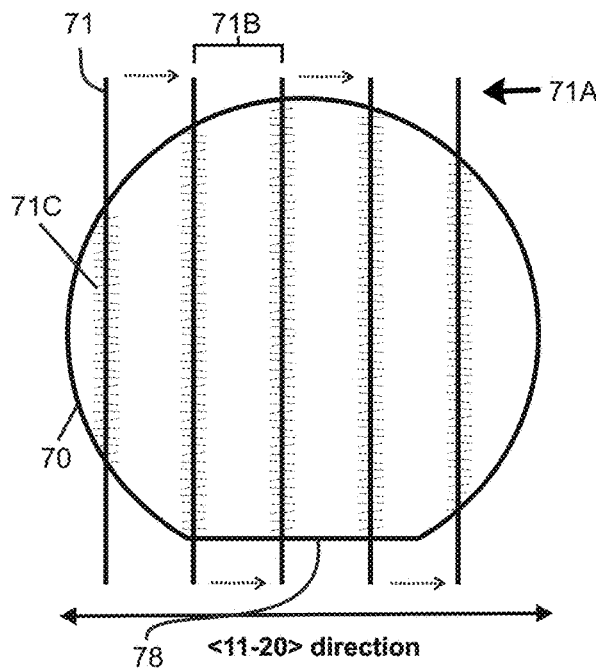
FIG. 11B is a top plan schematic view of the crystalline material substrate of FIG. 11A during fabrication, following formation of the first subsurface laser damage pattern, with illustration of a first plurality of cracks within the interior of the substrate propagating laterally outward from the first plurality of substantially parallel lines.
Figure 11C:
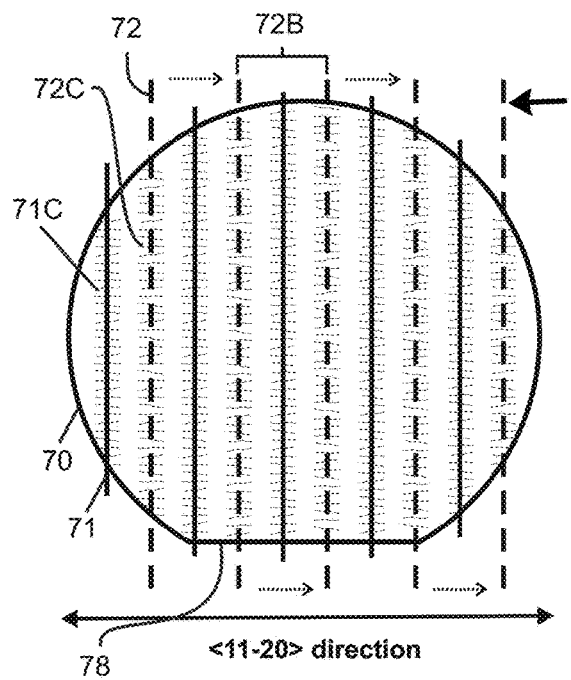
FIG. 11C is a top plan view of the crystalline material substrate of FIG. 11B, upon formation of the second subsurface laser damage pattern after the first subsurface laser damage pattern, with illustration of a second plurality of cracks within the interior of the substrate propagating laterally outward from the second plurality of substantially parallel lines but not contacting the first plurality of cracks.
Figure 11D:
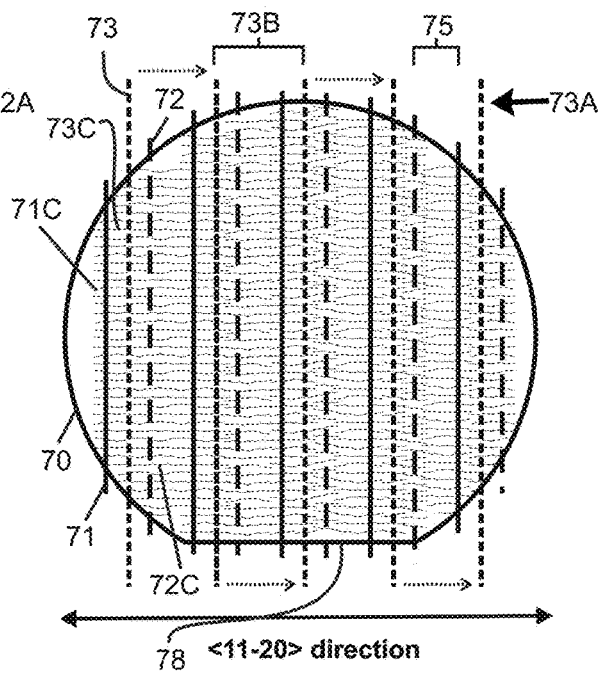
FIG. 11D is a top plan view of the crystalline material substrate of FIG. 11C, upon formation of the third subsurface laser damage pattern after the first and second subsurface laser damage patterns, with illustration of a third plurality of cracks within the interior of the substrate propagating laterally outward from the third plurality of substantially parallel lines and connecting cracks of the first plurality and second plurality of cracks.

FIGS. 11B-11D illustrate fabrication of the crystalline material substrate 70 of FIG. 11A. FIG. 11B illustrates the substrate 70 following formation of a first plurality of subsurface laser damage lines 71 (perpendicular to a flat 78 of the substrate 70) having a pitch (or inter-line spacing) 71B and that form a first subsurface laser damage pattern 71A. Cracks 71C propagate laterally outward from the first plurality of subsurface laser damage lines 71, but cracks emanating from different subsurface laser damage lines 71 do not connect with one another.

FIG. 11B illustrates the substrate 70 following formation of a second plurality of subsurface laser damage lines 72 (perpendicular to a flat 78 of the substrate 70) having a pitch (or inter-line spacing) 72B and that form a second subsurface laser damage pattern 72A. Cracks 72C propagate laterally outward from the second plurality of subsurface laser damage lines 71, but cracks emanating from different subsurface laser damage lines 71 do not connect with one another.

FIG. 11C illustrates the substrate 70 following formation of a third plurality of subsurface laser damage lines 73 (perpendicular to a flat 78 of the substrate 70) having a pitch (or inter-line spacing) 73B and that form a third subsurface laser damage pattern 73A. Cracks 73C propagate laterally outward from the third plurality of subsurface laser damage lines 73, with such cracks 73C being sufficient to connect cracks 71C, 72C formed by the first and second subsurface laser damage lines 71, 72. As shown, connection of cracks between the first, second, and third pluralities of subsurface damage lines is also sufficient to cause cracks to further propagate and connect across the inter-group spacing 75.

In certain embodiments, a third laser pass that forms the third subsurface damage pattern is performed at a higher laser power level than the first two passes, to assist in extending cracks to connect across the inter-group spacing 75, which is wider than the spacing 76, 77 between lines within each three-line group 74. The inventors have found that increasing laser power during the third pass sufficient to connect not only cracks between laser subsurface damage line 125 um apart, but also between laser subsurface damage lines positioned 250 um apart (such as shown in FIG. 11D). This yields a roughly 25% tool throughput increase with a small penalty in kerf loss (e.g., approximately 110 um kerf loss instead of 100 um).

Figure 12:
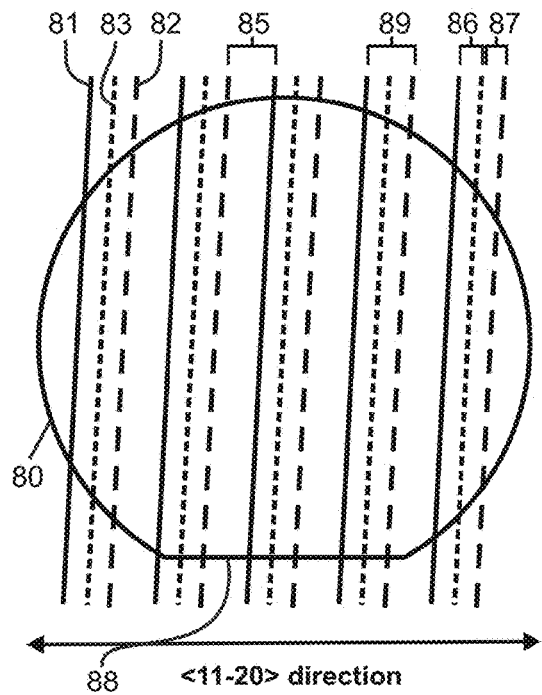
FIG. 12 is a top plan schematic view of a crystalline material substrate including interspersed first through third subsurface laser damage patterns defined therein according to one embodiment similar to that shown in FIG. 11A, with each damage pattern including a plurality of substantially parallel lines that deviate three degrees relative to perpendicular to the [11$\bar{2}$0] direction along the substrate surface (and substantially perpendicular to a primary substrate flat), and with the laser damage patterns in combination forming multiple three-line groups that are separated from one another by an inter-group spacing that exceeds a spacing between adjacent lines in each three-line group.

In certain embodiments, all laser subsurface damage lines may be non-perpendicular to a primary substrate flat (and to the [11$\bar{2}$0] direction), within a range of from about 1 degree to 5 degrees from perpendicular. For example, FIG. 12 is top plan schematic view of a crystalline material substrate 80 including a substrate flat 88 and first, second, and third pluralities of substantially parallel subsurface laser damage lines 81-83 that are interspersed or interspersed among one another to form first through third subsurface laser damage patterns. Each plurality of substantially parallel subsurface laser damage lines 81-83 deviates three degrees relative to perpendicular to a primary substrate flat (and to the [11$\bar{2}$0] direction), with the laser damage patterns in combination forming multiple three-line groups 89 that are separated from one another by an inter-group spacing 85 that exceeds the spacing (or gaps) 86, 87 between adjacent lines in each three-line group 89. In one embodiment the first plurality of parallel lines 81 may be formed with a 500 micron pitch (i.e., spacing between lines), and the second plurality of parallel lines 82 may be formed with a 500 micron pitch and an offset of 250 microns relative to the first plurality of parallel lines 81. Thereafter, the third plurality of parallel lines 83 may be formed with a 500 micron pitch, and an offset of 125 microns relative to the first plurality of parallel lines 81. This arrangement creates multiple three-line groups 89 that are separated from each other three-line group by a 250 micron gap, with adjacent lines within each three-line group being separated from each other by a gap of 125 microns. As shown, the parallel subsurface laser damage lines 81-83 of each group are parallel to one another.

Figure 13:
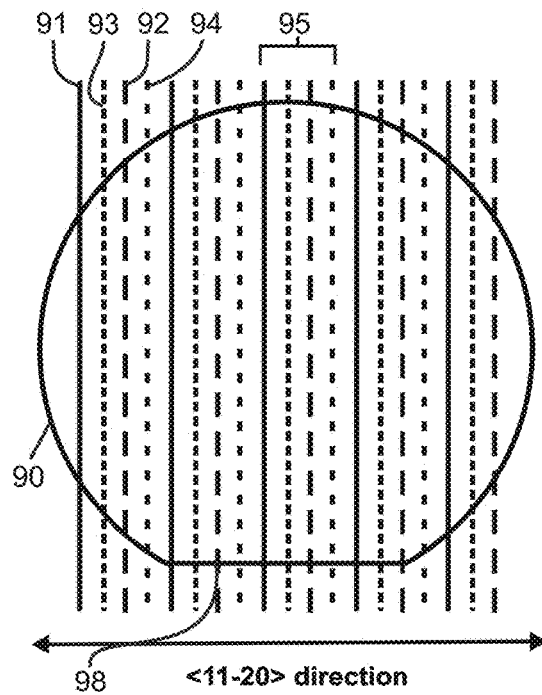
FIG. 13 is a top plan schematic view of a crystalline material substrate including interspersed first through fourth laser damage patterns with all lines parallel to one another and perpendicular to the [11$\bar{2}$0] direction along the substrate surface (and substantially perpendicular to a primary substrate flat).

FIG. 13 is top plan schematic view of a crystalline material substrate 90 including a substrate flat 98 and first through fourth pluralities of substantially parallel subsurface laser damage lines 91-94 that are interspersed or interleaved among one another to form first through fourth subsurface laser damage patterns with all lines being parallel to one another and perpendicular to the substrate flat 98 (and to the [11$\bar{2}$0] direction). In certain embodiments, the first through fourth pluralities of subsurface laser damage lines 91-94 may each include lines having a pitch of 500 nm, wherein the second plurality of lines 92 are offset 250 microns from the first plurality of lines 91, the third plurality of lines is offset 125 microns from the first plurality of lines 91, and the fourth plurality of lines is offset 375 microns from the first plurality of lines 91. The net result is that a 125 micron gap is provided between each line of the first through fourth pluralities of lines 91-94. A four-line repeat group 95 is composed of the first through fourth lines 91-94.

An alternative method for forming a crystalline material substrate similar to the substrate 90 shown in FIG. 13 involves use of four passes of laser subsurface damage formation, with each pass forming lines having a 500 micron pitch. Following a first pass, lines formed by a second pass are offset 125 microns from lines of the first pass, then lines of the third pass are offset 250 microns from lines of the first pass, then lines of the fourth pass are offset 375 microns from lines of the first pass.

Figure 14:
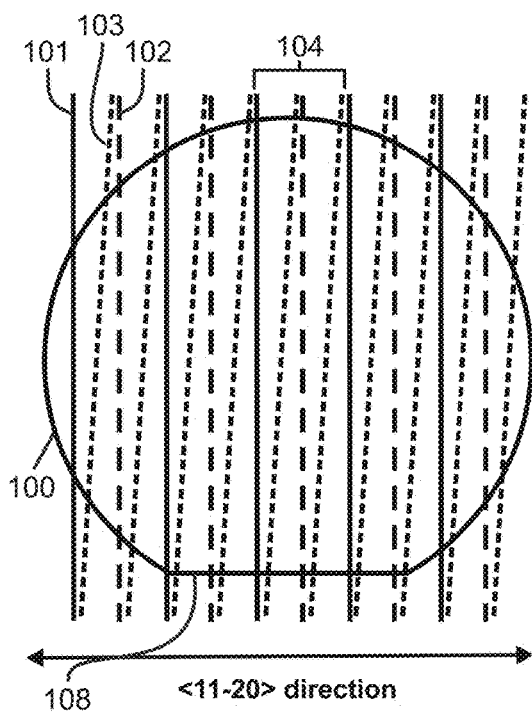
FIG. 14 is a top plan schematic view of a crystalline material substrate including interspersed first, second, and third subsurface laser damage patterns defined therein according to one embodiment in which first and second groups of lines are each parallel to one another and perpendicular to the [11$\bar{2}$0] direction along the substrate surface (and substantially perpendicular to a primary substrate flat), and the third group of lines is non-parallel to the first and second groups of lines but does not cross lines of the first and second groups of lines within the substrate.

FIG. 14 is top plan schematic view of a crystalline material substrate 100 including a substrate flat 108, and including interspersed first through third pluralities of subsurface laser damage lines 101-103 forming first, second, and third subsurface laser damage patterns. The first and second pluralities of lines 101, 102 are each parallel to one another and perpendicular to the primary substrate flat 108 (and to the [11$\bar{2}$0] direction), while the third plurality of lines 103 is non-parallel to the first and second pluralities of lines 101, 102 (e.g., with an angular difference in a range of from 1 to 5 degrees) but does not cross any of the first and second lines 101, 102 within the substrate 100. In certain embodiments, the first and second pluralities of parallel lines 101, 102 are formed first, and then the third plurality of parallel lines 103 is formed thereafter. In certain embodiments, the first and second pluralities of parallel lines 101, 102 each have a 500 micron pitch, with the second plurality of parallel lines 102 being offset 250 microns relative to the first plurality of parallel lines 101. A multi-line repeat group 104 is composed of the first through third lines 101-103.

Although subsurface laser damage lines in FIG. 14 are non-crossing, in certain embodiments one or more subsurface laser damage lines (e.g., formed in a subsequent laser damage formation pass) may cross one or more other subsurface damage lines (e.g., formed in a prior or initial laser damage formation pass). In certain embodiments, relative angles between subsurface laser damage lines that cross may be in a range of 4 to 30 degrees, or 5 to 20 degrees, or 5 to 15 degrees, or 5 to 10 degrees.

Figure 15:
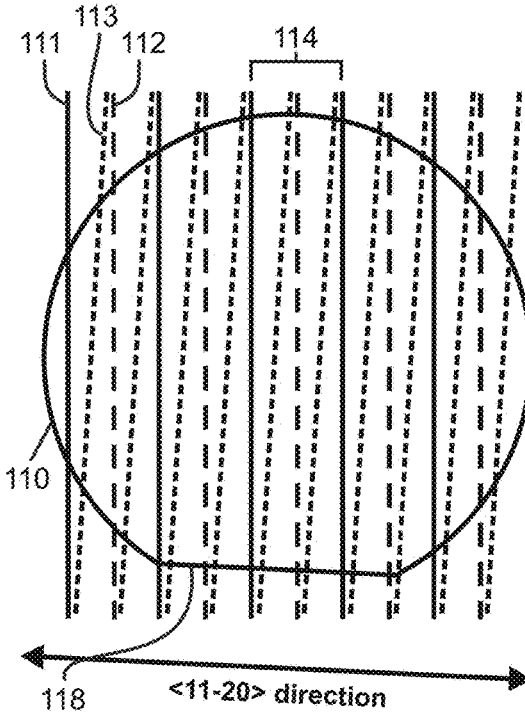
FIG. 15 is a top plan schematic view of a crystalline material substrate including interspersed first, second, and third subsurface laser damage patterns defined therein according to one embodiment in which first and second groups of lines are each parallel to one another and deviate about 3 degrees from perpendicular to the [11$\bar{2}$0] direction along the substrate surface (and substantially perpendicular to a primary substrate flat), and the third group of lines is perpendicular to the primary substrate flat but does not cross lines of the first and second groups of lines within the substrate.

FIG. 15 is top plan schematic view of a crystalline material substrate 110 including a substrate flat 118, and including interspersed first through third pluralities of subsurface laser damage lines 111-113 that form first through third subsurface laser damage patterns. The first and second pluralities of lines 111, 112 are each parallel to one another and non-perpendicular to the primary substrate flat 108 (e.g., with an angular difference in a range of from 1 to 5 degrees), while the third plurality of lines 113 is perpendicular to the primary substrate flat 118 but at least some (or all) lines thereof do not cross lines of the first and second groups of lines 111, 112 within the substrate 110. In certain embodiments, the first and second pluralities of parallel lines 111, 112 each have a 510 micron pitch, with the second plurality of parallel lines 112 being offset 250 microns relative to the first plurality of parallel lines 111. A three-line repeat group 114 is composed of the first through third lines 111-113.

Figure 16:
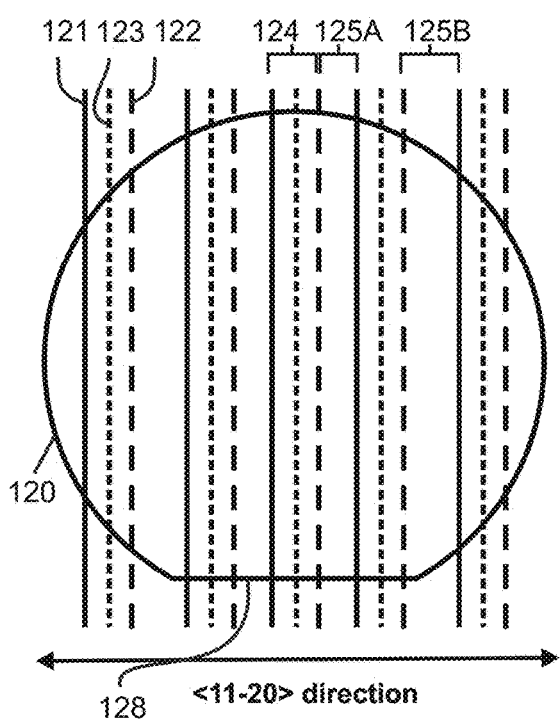
FIG. 16 is a top plan schematic view of a crystalline material substrate including interspersed first, second, and third subsurface laser damage patterns defined therein according to one embodiment in which all laser damage lines are parallel to one another, and inter-group spacing of laser damage lines is not uniform over at least portions of the substrate.

FIG. 16 is a top plan schematic view of a crystalline material substrate including interspersed first, second, and third subsurface laser damage patterns defined therein according to one embodiment in which all laser damage lines are parallel to one another, and inter-group spacing of laser damage lines is not uniform over at least portions of the substrate.

Figure 17:
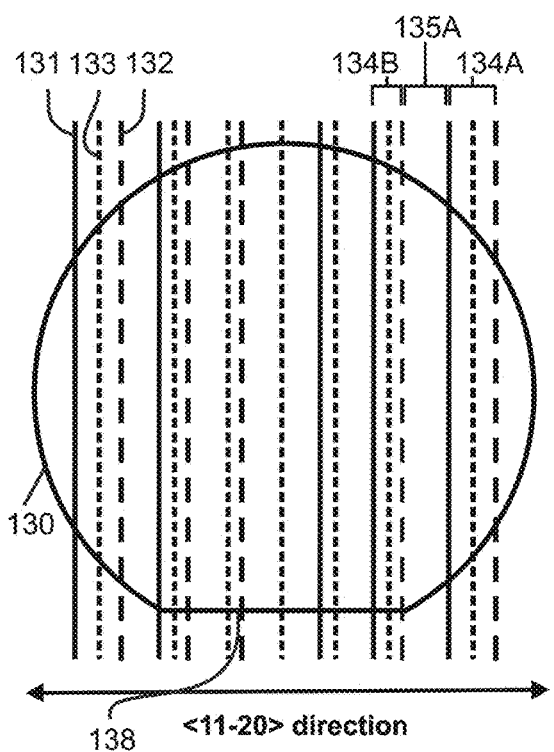
FIG. 17 is a top plan schematic view of a crystalline material substrate including interspersed first, second, and third subsurface laser damage patterns defined therein according to one embodiment in which all laser damage lines are parallel to one another, and laser damage lines exhibit variation in intra-group spacing, inter-group spacing, and group composition.

FIG. 17 is a top plan schematic view of a crystalline material substrate including interspersed first, second, and third subsurface laser damage patterns defined therein according to one embodiment in which all laser damage lines are parallel to one another, and laser damage lines exhibit variation in intra-group spacing, inter-group spacing, and group composition.

Figure 18:
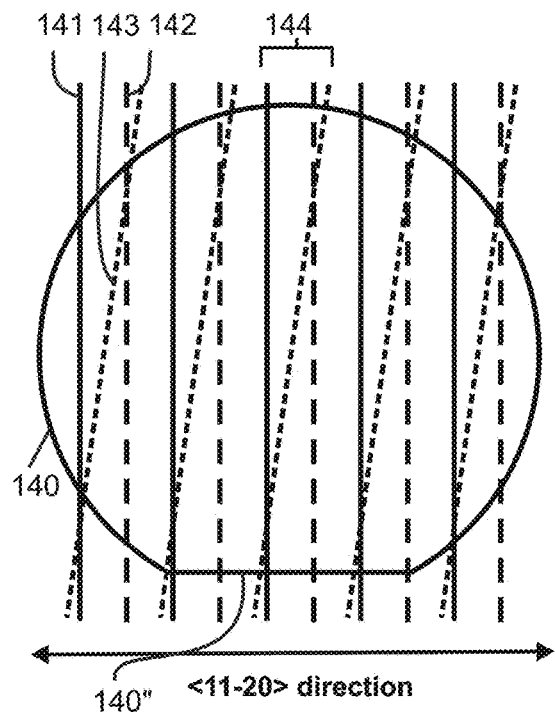
FIG. 18 is a top plan schematic view of a crystalline material substrate including sequentially formed first, second, and third subsurface laser damage patterns defined therein according to one embodiment in which first and second groups of laser damage lines are parallel to one another, while a third group of laser damage lines are non-parallel to and cross the first and second groups of laser damage lines.

FIG. 18 is a top plan schematic view of a crystalline material substrate including sequentially formed first, second, and third subsurface laser damage patterns defined therein according to one embodiment in which first and second groups of laser damage lines are parallel to one another, while a third group of laser damage lines are non-parallel to and cross the first and second groups of laser damage lines.

Figure 19:
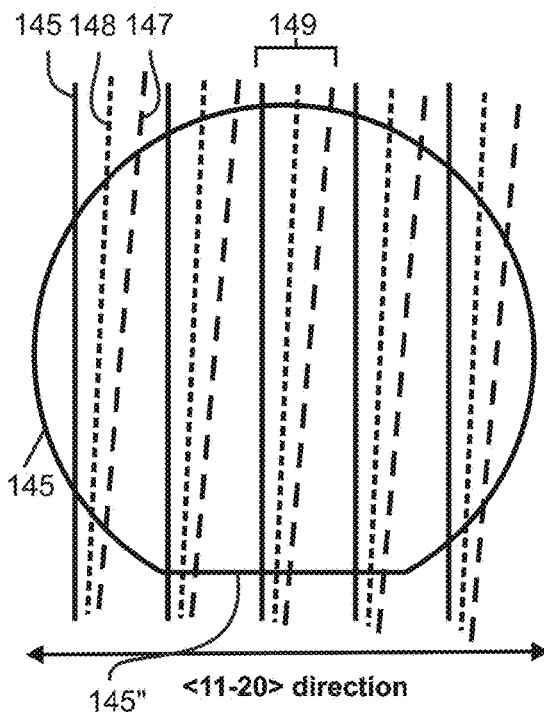
FIG. 19 is a top plan schematic view of a crystalline material substrate including sequentially formed first, second, and third subsurface laser damage patterns in which each group of laser damage lines includes parallel lines, and each group of laser damage lines is non-parallel to each other group of laser damage lines.

FIG. 19 is a top plan schematic view of a crystalline material substrate including sequentially formed first, second, and third subsurface laser damage patterns in which each group of laser damage lines includes parallel lines, and each group of laser damage lines is non-parallel to each other group of laser damage lines. Although FIGS. 11A to 19 illustrate embodiments including three or four pluralities of subsurface laser damage lines, it is to be appreciated that any suitable number of subsurface laser damage line groups may be provided. For example, in certain embodiments, first and second pluralities of subsurface laser damage lines may be interspersed in the absence of third and/or fourth pluralities of subsurface laser damage lines. In certain embodiments, first and second pluralities of subsurface laser damage lines may be formed in first and second passes, respectively, with each plurality of laser damage lines having a 250 micron pitch, and with the second plurality of laser damage lines being offset by 125 microns relative to the first plurality of laser damage lines.

In certain embodiments, subsurface laser damage is distributed among multiple non-overlapping areas of crystalline material by forming a first group of subsurface laser damage sites in non-overlapping first and second areas of the crystalline material, followed by formation of a second group of subsurface laser damage sites in the first and second areas, wherein at least some (or all) sites of the second group of subsurface laser damage sites do not cross sites of the first group of subsurface laser damage sites is formed in the non-overlapping areas. One or more additional groups of subsurface laser damage sites may be formed thereafter, and distributed among the same non-overlapping first and second areas of the crystalline material. Although first and second areas have been described, it is to be appreciated that any suitable number of non-overlapping areas may be defined (e.g., three, four, five, six, or more areas). In certain embodiments, such areas may not only lack any overlap, but may also be spaced apart from one another (e.g., spaced apart laterally) in a non-contacting relationship.

Figure 20A:
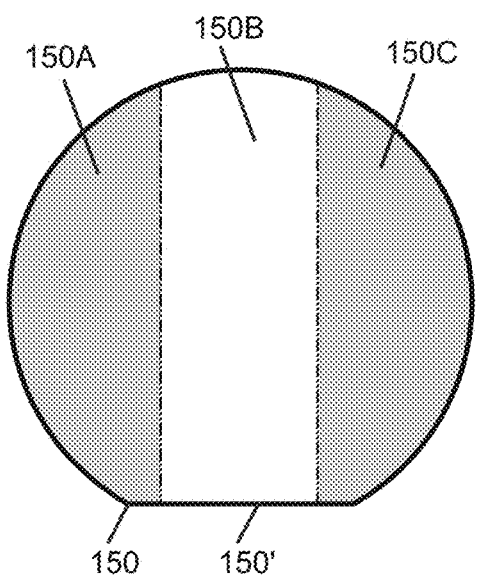
FIG. 20A is a top plan view of a crystalline material substrate illustrating non-overlapping first, second, and third areas in which laser damage regions may be formed.

FIG. 20A is a top plan view of a crystalline material substrate 150 illustrating non-overlapping first, second, and third areas 150A-150C in which laser damage regions may be formed. Although shading has been added to the first and third areas 150A, 150C for illustration purposes to emphasize boundaries between the first through third areas 150A-150C, it is to be appreciated that an actual crystalline material substrate 150 would typically be uniform in color. Each area 150A-150C contacts a portion of a primary flat 150' of the substrate 150. While three areas 150A-150C are shown in FIGS. 20A-20D, any suitable number of areas are contemplated, such as two, three, four, five, six, or more, and such areas may be arranged in any suitable conformation such as in a one-dimensional array, in a two-dimensional array, in sectors (e.g., wedge-shaped sectors) extending from a center point, etc.

Figure 20B:
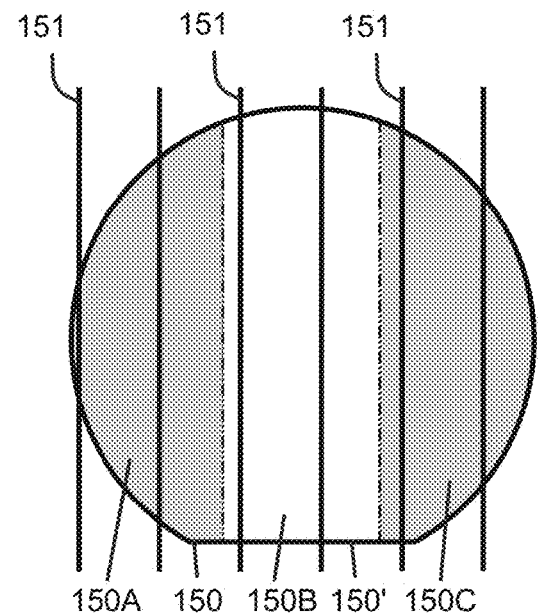
FIG. 20B is a top plan view of the crystalline material substrate of FIG. 20A following formation of a first plurality of subsurface laser damage regions in the first through third areas.

FIG. 20B is a top plan view of the crystalline material substrate 150 of FIG. 20A following formation of a first plurality of subsurface laser damage regions 151 in the first through third areas 150A-150C. As shown, the laser damage regions 151 are provided as substantially parallel lines that are substantially perpendicular to a primary flat 150' of the substrate 150. Multiple laser damage regions 151 are provided in each of the first through third areas 150A-150C. Although not illustrated in FIG. 20B, it is to be appreciated that laterally extending cracks (such as shown in FIG. 11B) may emanate from the laser damage regions 151, but preferably not connect between adjacent laser damage regions 151. In certain embodiments, subsurface laser damage regions 151 of the plurality of subsurface laser damage regions 151 may be formed in the first area 150A, then in the second area 150B, and finally in the third area 150C.

Figure 20C:
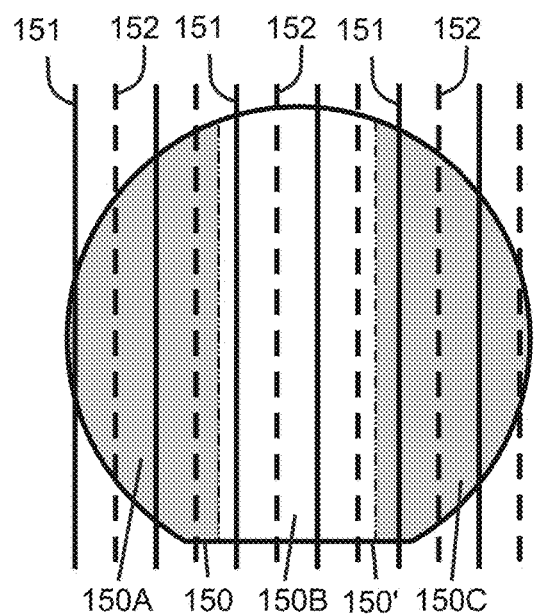
FIG. 20C is a top plan view of the crystalline material substrate of FIG. 20B following formation of a second plurality of subsurface laser damage regions in the first through third areas.

FIG. 20C is a top plan view of the crystalline material substrate 150 of FIG. 20B following formation of a second plurality of subsurface laser damage regions 152 in the first through third areas 150A-150C. As shown, the laser damage regions 152 of the second plurality of subsurface laser damage regions 152 are provided as substantially parallel lines that are substantially perpendicular to the primary flat 150', and multiple laser damage regions 152 are provided in each of the first through third areas 150A-150C. Additionally, each laser damage region 152 of the second plurality of subsurface laser damage regions 152 is substantially parallel to the first plurality of subsurface laser damage regions 151. Although not shown in FIG. 20C, it is to be appreciated that laterally extending cracks may emanate from each laser damage region 151, 152, but such cracks preferably do not connect between adjacent laser damage regions 151, 152. In certain embodiments, subsurface laser damage regions 152 of the plurality of subsurface laser damage regions 152 may be formed in same sequence as the first subsurface laser damage regions 151 (e.g., the subsurface laser damage regions 152 may be formed in the first area 150A, then in the second area 150B, and finally in the third area 150C). In this manner, laser damage regions 152 of the second plurality of subsurface laser damage regions 152 are interspersed among laser damage regions 151 of the first plurality of subsurface laser damage regions 151.

Figure 20D:
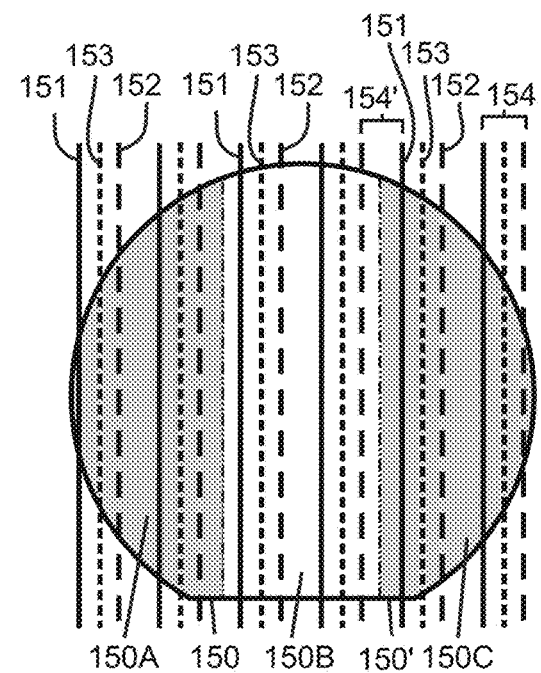
FIG. 20D is a top plan view of the crystalline material substrate of FIG. 20C following formation of a third plurality of subsurface laser damage regions in the first through third areas.

FIG. 20D is a top plan view of the crystalline material substrate of FIG. 20C following formation of a third plurality of subsurface laser damage regions 153 in the first through third areas 150A-150C. As shown, the laser damage regions 153 of the third plurality of subsurface laser damage regions 153 are provided as substantially parallel lines that are substantially perpendicular to the primary flat 150', and multiple laser damage regions 153 of the third plurality of subsurface laser damage regions 153 are provided in each of the first through third areas 150A-150C. Each laser damage region 153 of the third plurality of subsurface laser damage regions 153 may be substantially parallel to the first and second pluralities of subsurface laser damage regions 151, 152. Subsurface laser damage patterns provided by the first through third subsurface laser damage regions 151-153 form a plurality of three-line groups 154 that are spaced apart from one another by an inter-group spacing 154' that exceeds a spacing between adjacent laser damage regions 151-153 in each three-line group 154. Although not shown in FIG. 20C, it is to be appreciated that laterally extending cracks may emanate from each laser damage region 151-153, with the cracks extending laterally among all laser damage region 151-153 (such as shown in FIG. 11D) to facilitate subsequent fracture of an upper portion of the substrate 150 from a remainder of the substrate 150. In certain embodiments, subsurface laser damage regions 153 of the plurality of subsurface laser damage regions 152 may be formed in same sequence as the first and second subsurface laser damage regions 151, 152 (e.g., the subsurface laser damage regions 153 may be formed in the first area 150A, then in the second area 150B, and finally in the third area 150C). In this manner, laser damage regions 153 of the third plurality of subsurface laser damage regions 153 are interspersed among laser damage regions 151, 152 of the first and second pluralities of subsurface laser damage regions 151, 152.

Parallel Processing and/or Laser Beam Splitting

In certain embodiments, multiple regions of one substrate may be processed simultaneously to form subsurface laser damage in multiple substrate regions, and/or multiple substrates may be arranged within a single tool for simultaneous or substantially simultaneous laser processing, to enhance tool throughput. In certain embodiments, an output beam of one laser may be split into multiple beams using one or more beam splitters, individual beams of the beams may either be supplied to different substrates or different areas of a single substrate, to form subsurface laser damage therein utilizing methods disclosed herein. In certain embodiments, multiple lasers may be used to simultaneously supply beams to multiple substrates or multiple areas of a single substrate, to form subsurface laser damage therein utilizing methods disclosed herein.

Figure 21:
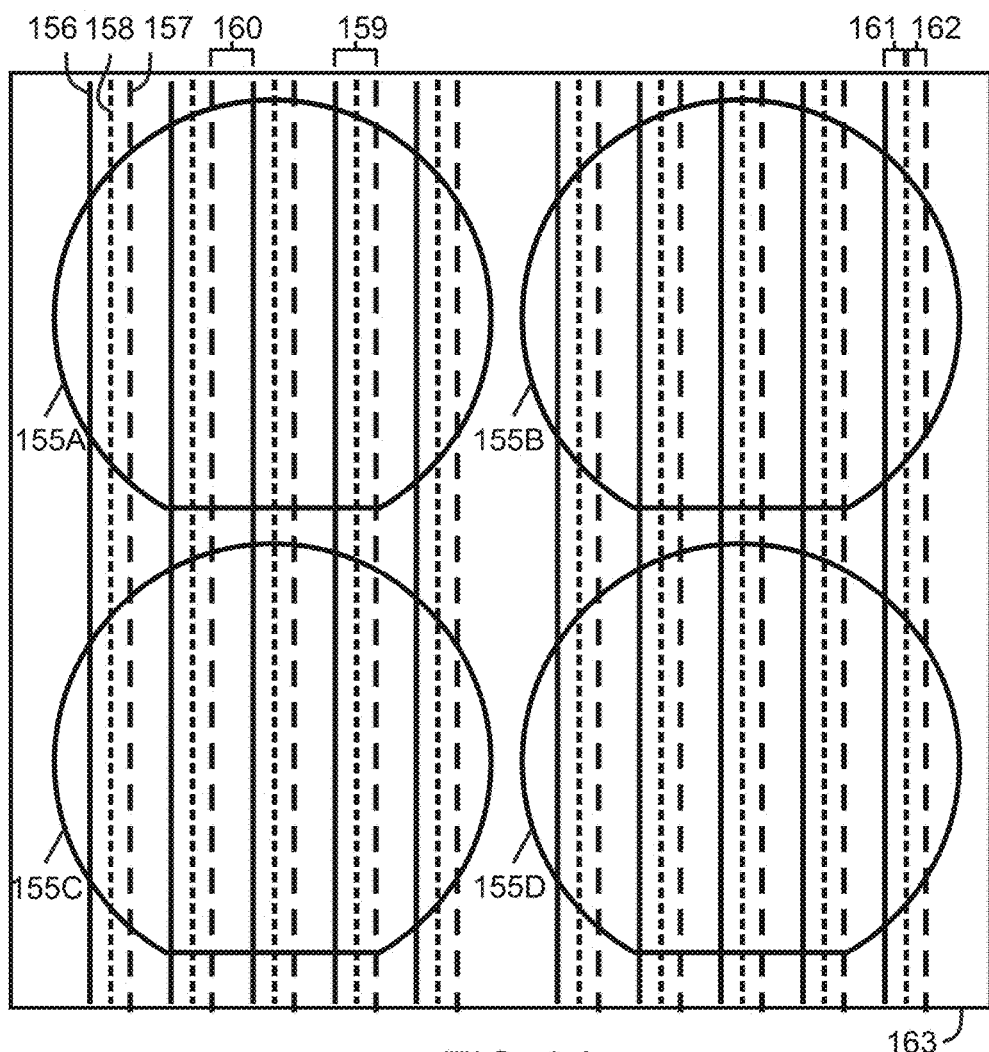
FIG. 21 is a top plan schematic view of a holder of a laser processing apparatus arranged to hold four substrates in which subsurface laser damage may be formed with one or more lasers.

FIG. 21 is a top plan schematic view of a holder 163 of a laser processing apparatus arranged to hold four substrates 155A-155D in which subsurface laser damage may be formed with one or more lasers. As shown, each substrate 155A-155D includes subsurface laser damage patterns defined therein, with such patterns including first, second, and third pluralities of substantially parallel lines 156-158. The three laser damage patterns in combination forming multiple three-line groups 156 that are separated from one another by an inter-group spacing 160 that exceeds a spacing 161, 162 between adjacent lines in each three-line group 159. In certain embodiments, laser damage patterns may be formed in the first and third substrates 155A, 155C with a first laser or a first split laser beam portion, and laser damage patterns may be formed in the second and fourth substrates 155B, 155D with a second laser or second split laser beam portion. In certain embodiments, the holder 163 bearing the substrates 155A-155D is configured to move (e.g., in two (x, y) lateral directions) while one or more lasers and/or focusing optics thereof are restrained from lateral movement (but may be subject to vertical (z-direction) movement).

Figure 22A:
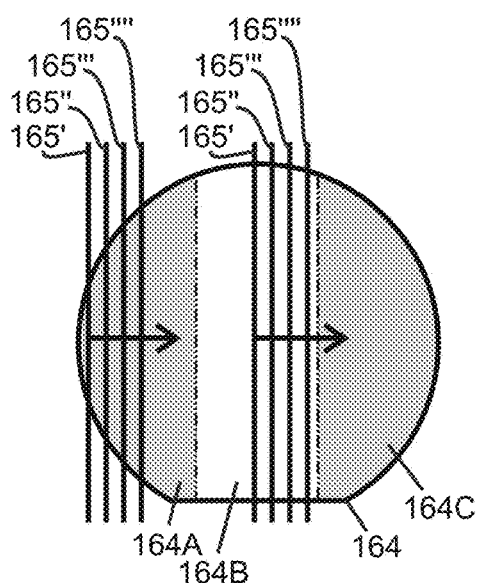
FIG. 22A is a top plan schematic view of a single substrate being processed with a split laser beam to simultaneously form subsurface laser damage according to a first subsurface laser damage pattern in two portions of the substrate.
Figure 22B:
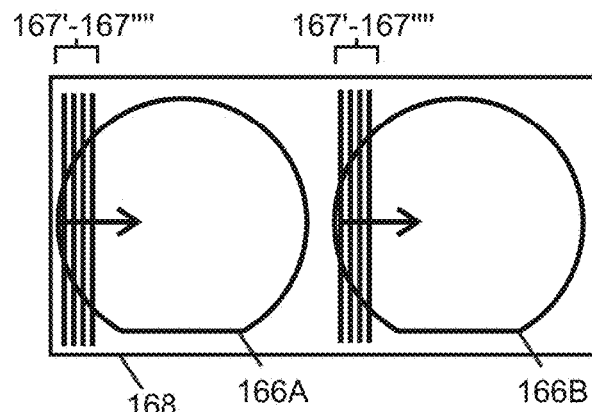
FIG. 22B is a top plan schematic view of a two substrates being processed with a split laser beam to simultaneously form subsurface laser damage according to a first subsurface laser damage pattern in both substrates.

FIG. 22A is a top plan schematic view of a single substrate 164 being processed with a laser beam split into multiple portions to simultaneously form subsurface laser damage regions according to a first subsurface laser damage pattern in multiple areas of the substrate 164. As shown, the substrate 164 includes multiple areas 164A-164C (e.g., resembling the areas 150A-150C depicted in FIGS. 20A-20C). An initial laser damage formation step includes impinging two split laser beam portions to simultaneously form laser damage regions 165' in the first and second areas 164A, 164B. The substrate 164 may be laterally indexed relative to a laser (e.g., in a direction opposite the rightward arrows), and a subsequent laser damage formation step includes impinging two split laser beam portions to simultaneously form laser damage regions 165" in the first and second areas 164A, 164B. This process is repeated to form additional laser damage regions 165''', 165'''' in the first and second areas 164A, 164B, and eventually to cover the first, second, and third areas 164A-164C to form a first subsurface laser damage pattern. Thereafter, the process may be repeated to form second and third subsurface laser damage patterns, respectively, that are interspersed with the first subsurface laser damage pattern. The first and second split laser beam portions may be used to form a subsurface laser damage patterns distributed over an entirety of the substrate 164 in half the time that the patterns could be formed with single, undivided laser beam. FIG. 22B is a top plan schematic view of two substrates 166A, 166B supported by a holder 168 and being processed with a laser beam split into two portions to simultaneously form subsurface laser damage according to at least one subsurface laser damage pattern in both substrates 166A, 1668. An initial laser damage formation step includes impinging two split laser beam portions to simultaneously form laser damage regions 167' in the first and second substrates 166A, 1668. The holder bearing the substrates 166A, 166B may be laterally indexed relative to a laser (e.g., in a direction opposite the rightward arrows), and a subsequent laser damage formation step includes impinging two split laser beam portions to simultaneously form laser damage regions 167" in the first and second substrates 166A, 1668. This process is repeated to form additional laser damage regions 167''', 167'''' in the first and second substrates 166A, 1668, and eventually to cover the first and second substrates 166A, 1668 to form a first subsurface laser damage patterns therein. Thereafter, the process may be repeated to form second and third subsurface laser damage patterns in the substrates 166A, 1668, respectively, that are interspersed with the first subsurface laser damage pattern.

Formation of Overlapping Subsurface Laser Damage at Different Depths

In certain embodiments, initial subsurface laser damage centered at a first depth may be formed within an interior of a crystalline material substrate, and additional subsurface laser damage centered at a second depth may be formed within the interior of the substrate, wherein the additional subsurface laser damage is substantially registered with the initial subsurface laser damage, and a vertical extent of at least a portion of the additional subsurface laser damage overlaps with a vertical extent of at least a portion of the initial laser damage. Restated, one or more subsequent passes configured to impart laser damage at a different depth may be added on top of one or more prior passes to provide subsurface laser damage with an overlapping vertical extent. In certain embodiments, addition of overlapping subsurface damage may be performed responsive to a determination (e.g., by optical analysis) prior to fracturing that one or more prior subsurface laser damage formation steps was incomplete. In certain embodiments, a difference in laser focusing depth between first and second laser damage patterns for formation of a single reduced thickness portion of a substrate (e.g., one wafer) may be in a range of 1 to 10 microns, or 2 to 8 microns, or 2 to 6 microns. Formation of overlapping subsurface laser damage at different depths may be performed in conjunction with any other method steps herein, including (but not limited to) formation of multiple interspersed subsurface laser damage patterns.

Figure 23A:
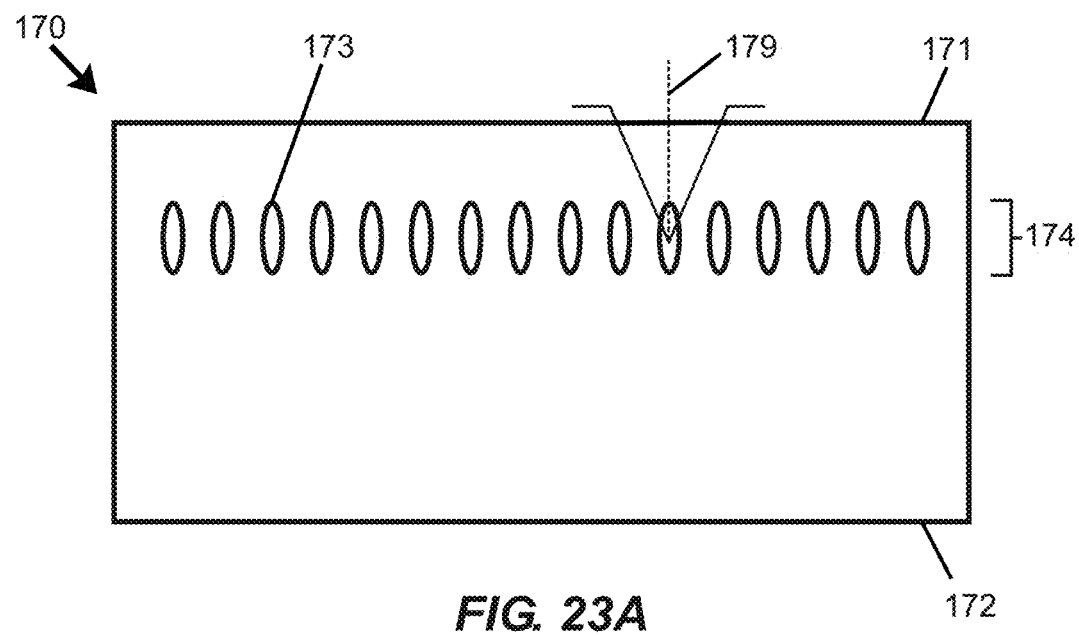
FIG. 23A is a cross-sectional schematic view of a crystalline material substrate including a first subsurface laser damage pattern centered at a first depth.
Figure 23B:
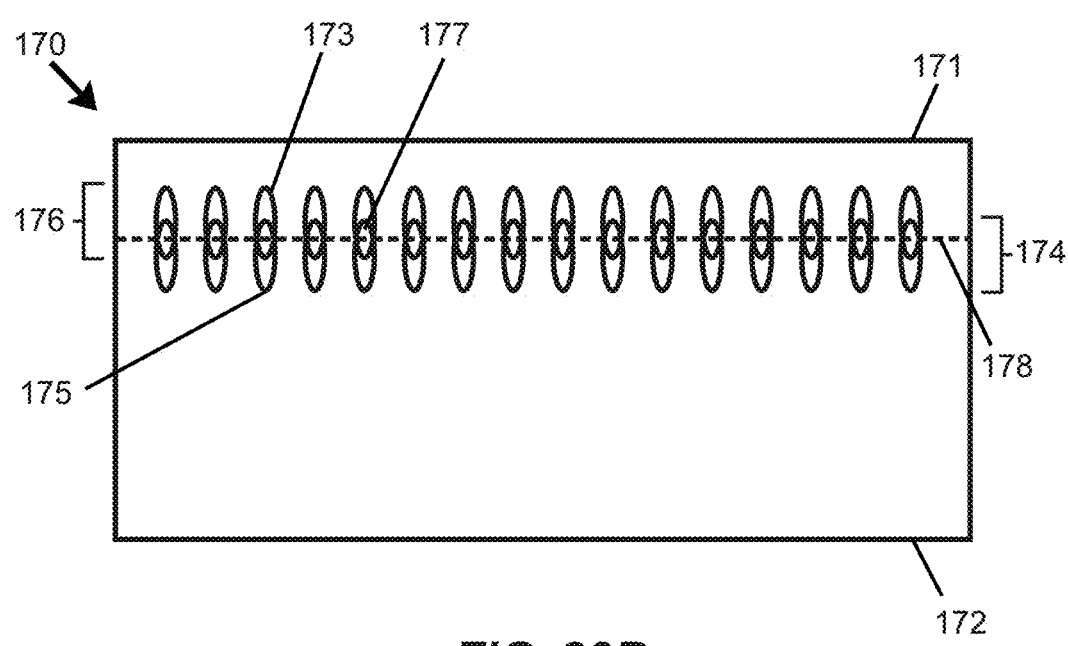
FIG. 23B is a cross-sectional schematic view of the substrate of FIG. 23A following formation of a second subsurface laser damage pattern centered at a second depth and registered with the first subsurface laser damage pattern, with an overlapping vertical extent of the first and second damage patterns.

FIG. 23A is a cross-sectional schematic view of a crystalline material substrate 170 including a first subsurface laser damage pattern 173 centered at a first depth relative to a first surface 171 of the substrate 1770, with the subsurface damage pattern 173 produced by focused emissions of a laser 179. The first subsurface laser damage pattern 173 has a vertical extent 174 that remains within an interior of the substrate 170 between the first surface 171 and an opposing second surface 172. FIG. 23B is a cross-sectional schematic view of the substrate of FIG. 23A following formation of a second subsurface laser damage pattern 175 centered at a second depth and registered with the first subsurface laser damage pattern 173, wherein a vertical extent 176 of the second damage pattern 175 overlaps with a vertical extent 174 of the first damage pattern 173 in a damage overlap region 177. In certain embodiments, subsequent fracturing of the crystalline material 170 may be performed along or through the damage overlap region 177.

Formation of Non-Overlapping Subsurface Laser Damage at Different Depths

In certain embodiments, subsurface laser damage lines may be formed at different depths in a substrate without being registered with other (e.g., previously formed) subsurface laser damage lines and/or without vertical extents of initial and subsequent laser damage being overlapping in character. In certain embodiments, an interspersed pattern of subsurface laser damage may include groups of laser lines wherein different groups are focused at different depths relative to a surface of a substrate. In certain embodiments, a focusing depth of emissions of a laser within the interior of the substrate differs among different groups of laser lines (e.g., at least two different groups of first and second groups, first through third groups, first through fourth groups, etc.) by a distance in a range from about 2 microns to about 5 microns (i.e., about 2 µm to about 5 µm).

Laser Tool Calibration

One of the primary drivers of kerf loss is subsurface laser damage below the primary fracture region on the ingot side. In general, an increase in subsurface laser damage increases kerf loss. One potential cause of increased subsurface laser damage is a failure to adequately compensate for the optical characteristics of the crystalline material.

In certain embodiments, laser calibration may be performed each time a crystalline material substrate (e.g., ingot) is supplied to the laser tool, prior to formation of subsurface laser damage therein. Such calibration may utilize variable height adjustment to attainment of an initial state in a best focus point of the laser beam is formed an upper surface of the crystalline material substrate, followed by adjusting the aperture or correction collar of the laser tool corresponding to a desired depth of formation of subsurface laser damage in the crystalline material according to a subsequent state.

Wafer Photographs Showing Doping Region (a/k/a Doping Ring)

Figures 24A, 24B:
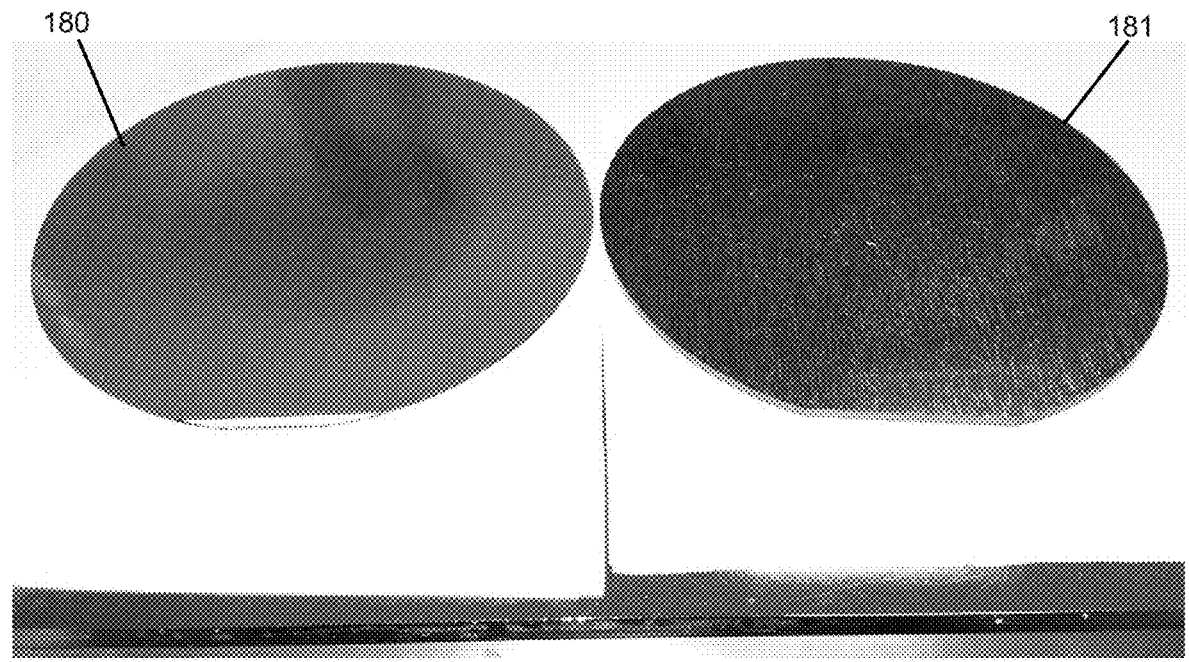
FIG. 24A is a perspective view photograph of a SiC wafer following separation from a thermoplastic glue-bonded sapphire carrier according to a method described herein.
FIG. 24B is a perspective view photograph of the sapphire carrier from which the SiC wafer of FIG. 24A was separated.
Figures 24C, 24D:
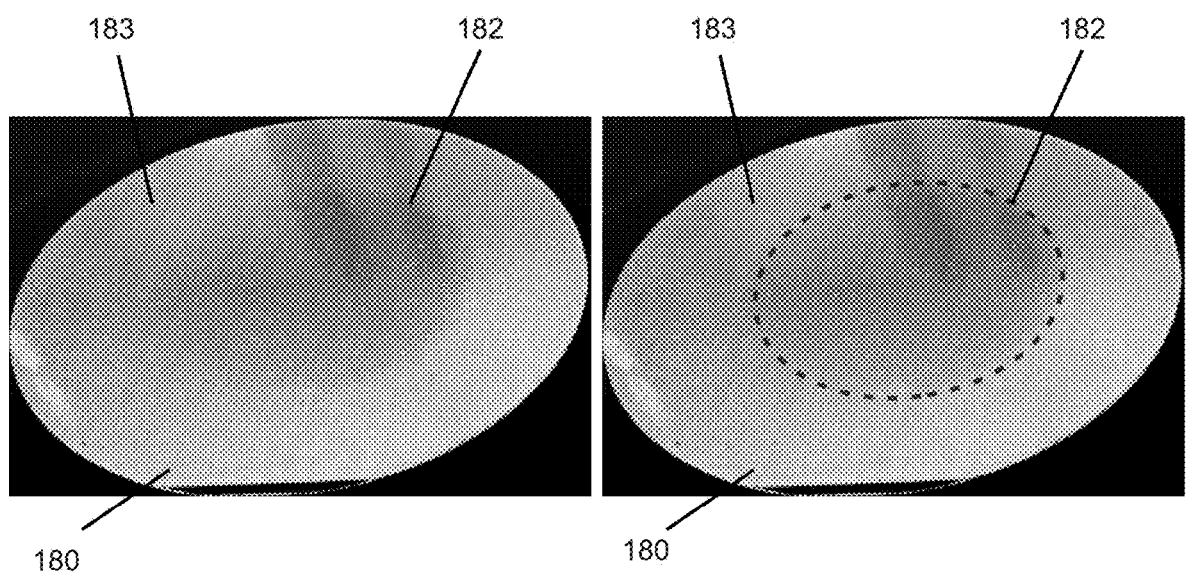
FIG. 24C is a partially tone-reversed version of the SiC wafer photograph of FIG. 24A to emphasize contrast between a central doping ring and an annular outer portion of the wafer.
FIG. 24D shows the image of FIG. 24C annotated with a dashed-line oval to denote a boundary between the central doping ring and the annular outer portion of the wafer.

FIG. 24A is a perspective view photograph of a SiC wafer 180 following separation from a carrier (i.e., the thermoplastic glue-bonded sapphire carrier 181 shown in FIG. 24B) using a thermally-induced fracture method described herein. Both the wafer 180 and the carrier 181 have a diameter of 150 mm. No wafer breakage was observed following thermally induced fracture. FIG. 24C is a partially tone-reversed version of the SiC wafer photograph of FIG. 24A to emphasize contrast between a central doping ring 182 and an annular outer portion 183 of the SiC wafer 180. FIG. 24D shows the image of FIG. 24C annotated with a dashed-line oval to denote a boundary between the central doping ring 182 and the annular outer portion 183 of the SiC wafer 180. The doping ring 182 represents a region of increased doping relative to the annular outer portion 183 of the SiC wafer. Since doped semiconductor material such as SiC exhibits increased absorption of IR wavelengths, higher laser power may be beneficial when seeking to form subsurface laser damage in the SiC wafer in the doping ring 182 as compared to the annular outer portion 183. In certain embodiments, presence of a condition indicative of non-uniform doping of a crystalline material across at least a portion of a surface of the substrate may be detected, such as by detecting a change in light reflection or absorption by optical means to determine presence of at least one first doping region and at least one second doping region (e.g., the doping ring 182 and the annular outer portion 183). Thereafter, responsive to detection of the condition indicative of non-uniform doping of the crystalline material, laser power may be altered during formation of subsurface laser damage patterns to provide laser emissions at a first average power when forming subsurface laser damage in a first doping region (e.g., the doping ring 182), and to provide laser emissions at a second average power when forming subsurface laser damage in a second doping region (e.g., the annular outer portion 183), wherein the first and second average power levels differ from one another.

Schematic Views of Ingots Exhibiting Doping Ring

Figure 25:
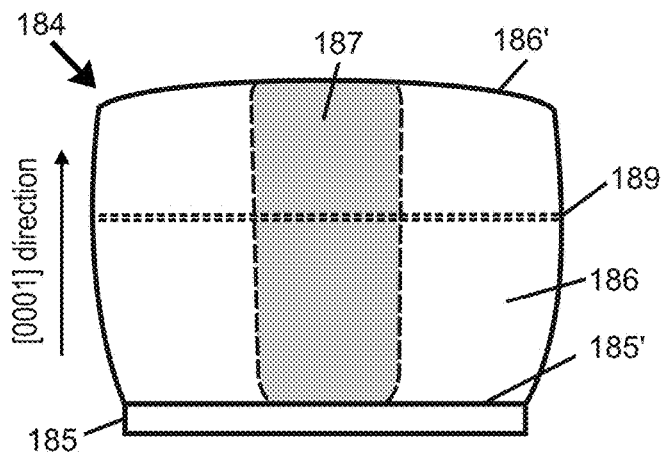
FIG. 25 is a side cross-sectional schematic view of a SiC ingot grown on a seed crystal, showing a cylindrically shaped doping region extending upward from the seed crystal through the entire thickness of the ingot along a central portion thereof.
Figure 26:
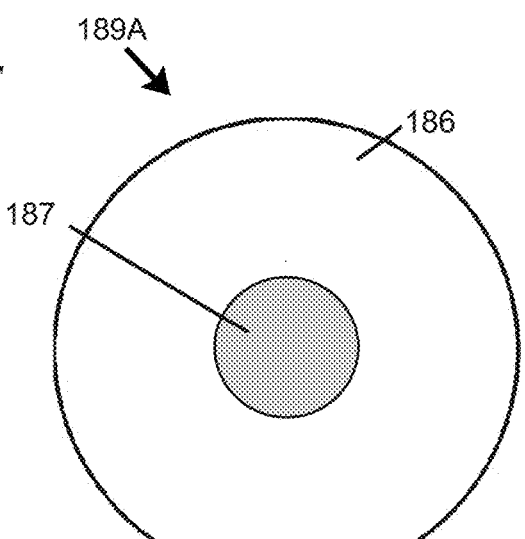
FIG. 26 is a top schematic view of a SiC wafer derived from the SiC ingot of FIG. 25 along an illustrated thin sectional portion thereof.

FIG. 25 is a side cross-sectional schematic view of a SiC ingot 184 grown on a seed crystal 185, showing a generally cylinder-shaped doping region 187 extending upward from the seed crystal 185 (at a first or bottom surface 185' of the ingot 184) through the entire thickness of the ingot 184 along a central portion thereof, wherein the doping region 187 is present at a second or top surface 186' of the ingot 184. The doping region 187 is laterally surrounded by an undoped (e.g., lower-doped or unintentionally doped) region 186 that is generally annular in shape. A thin cross-sectional portion 189 of the ingot 184 taken between the first and second surfaces 185', 186' may define a wafer 189A, as shown in FIG. 26. The wafer 189A includes a central doping region 187 and a generally annular-shaped undoped region 186, which is bounded in part by a primary flat 189'. In certain embodiments, the wafer 189A may be produced from the ingot 184 using a laser-assisted parting method as described herein.

Although FIG. 26 shows the size (e.g., width or diameter) of the doping region 187 as being substantially constant throughout the thickness of the ingot 184, the inventors have observed that the size of a doping region can vary with vertical position in an ingot (e.g., typically being larger in width or diameter closer to a seed crystal, and smaller with increasing distance away from the seed crystal). It has also been observed that the magnitude of doping within the doping region can vary with vertical position in an ingot.

Figure 27:
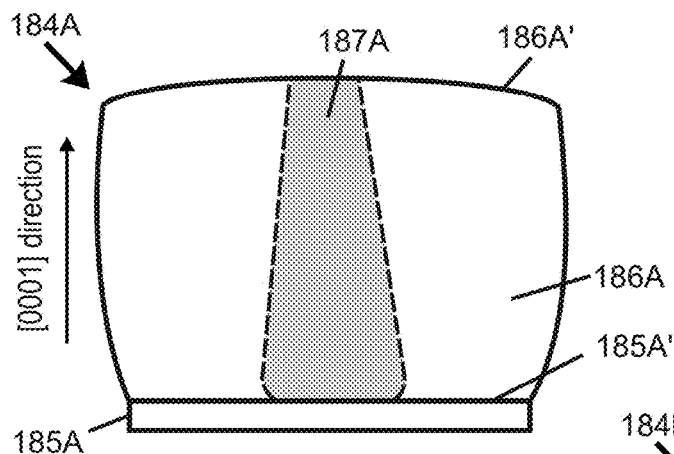
FIG. 27 is a side cross-sectional schematic view of a SiC ingot grown on a seed crystal, showing a frustoconically shaped doping region extending upward from the seed crystal through the entire thickness of the ingot along a central portion thereof.

FIG. 27 is a side cross-sectional schematic view of a SiC ingot 184A grown on a seed crystal 185A, showing a frustoconically shaped doping region 187A extending upward from the seed crystal 185A (at a first or bottom surface 185A' of the ingot 184A) through the entire thickness of the ingot 184A along a central portion thereof. As shown, the doping region 187A is present at a second or top surface 186A' of the ingot 184A, but the doping region 187A is smaller in width or diameter at the second surface 186A' than at the first surface 185A'. The doping region 187A is laterally surrounded by an undoped (e.g., lower-doped or unintentionally doped) region 186A that is generally annular in shape. In certain embodiments, the doping region 187A may have a width and a doping level that vary with vertical position relative to the seed crystal 185A.

The inventors have also observed that lateral position and shape of a doping region can differ relative to the configuration shown in FIG. 27 if a vicinal (e.g., offcut an angle non-parallel to c-plane) seed crystal is used for growth of a SiC ingot. For example, if a vicinal seed crystal is used, then a doping region may be more oval than round in shape, and/or may be offset laterally relative to a center of an ingot.

Figure 28:
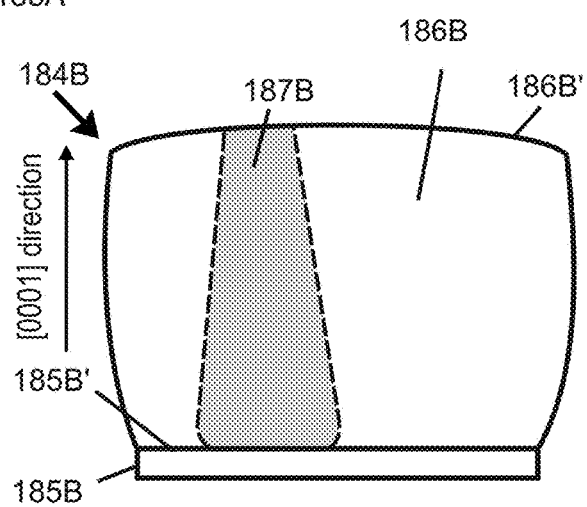
FIG. 28 is a side cross-sectional schematic view of a SiC ingot grown on a vicinal (e.g., offcut) seed crystal, showing a frustoconically shaped doping region extending upward from the seed crystal at a point offset from a center of seed crystal and upward through the entire thickness of the ingot.

FIG. 28 is a side cross-sectional schematic view of a SiC ingot 184B grown on a vicinal (e.g., offcut) seed crystal 185B, showing a frustoconically shaped doping region 187B extending upward from the seed crystal 185B at a point offset from a center of seed crystal 185B and upward through the entire thickness of the ingot 184B. As shown, the doping region 187B is present at a second or top surface 186B' of the ingot 184B, but the doping region 187B is smaller in width or diameter at the second surface 186B' than at the first surface 185B'. The doping region 187B may have a generally oval shape when viewed from above. The doping region 187B is laterally surrounded by an undoped (e.g., lower-doped or unintentionally doped) region 1866. In certain embodiments, the doping region 187B may have a shape, a width, and/or a doping level that varies with vertical position relative to the seed crystal 185B.

Magnified Wafer Photographs

Figure 29:
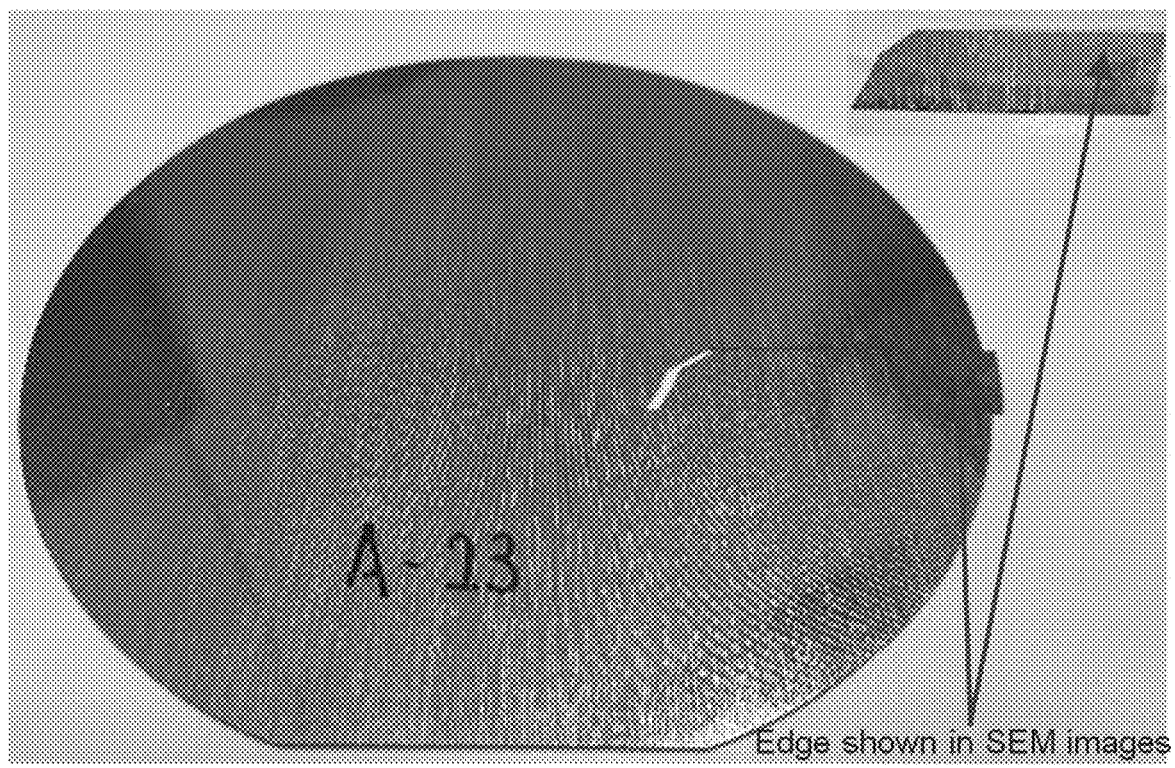
FIG. 29 is a perspective view photograph of a Si face of a SiC wafer separated from an ingot by a process involving formation of subsurface laser damage and subsequent separation, with an inset portion (upper right) depicting a fragment of the SiC wafer including an edge depicted in subsequent scanning electron microscope (SEM) images.

FIG. 29 is a perspective view photograph of a Si face of a SiC wafer separated from an ingot by a process involving formation of subsurface laser damage and subsequent separation, with an inset portion (upper right) depicting an intentionally separated fragment of the SiC wafer including an edge depicted in subsequent scanning electron microscope (SEM) images.

Figure 30A:
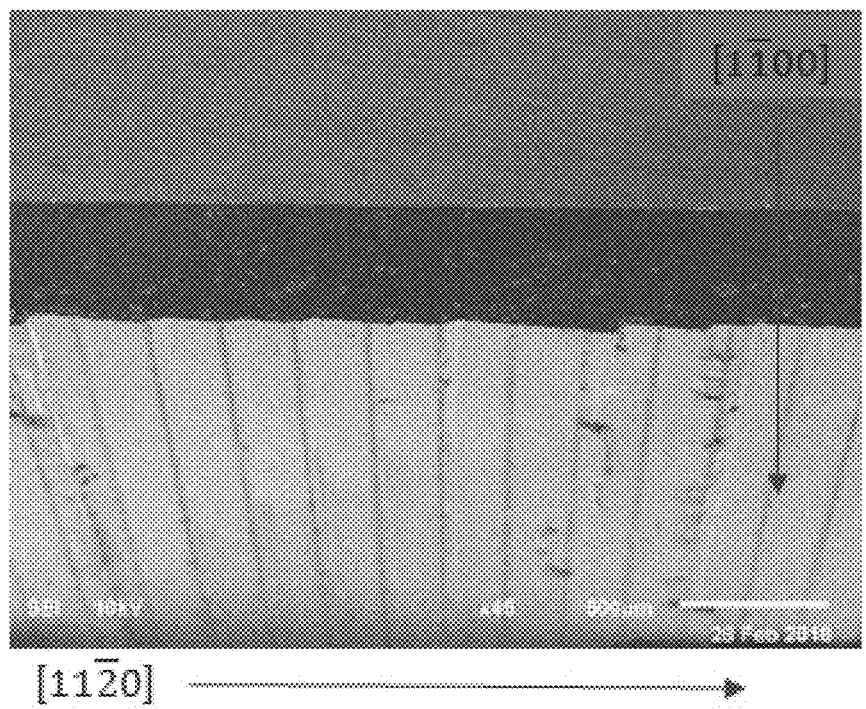
FIG. 30A is a 45 times magnification SEM image, taken at a 15 degree tilt angle, of a portion of the SiC wafer fragment of FIG. 29, with superimposed arrows showing directions of the [1$\bar{1}$00] and [11$\bar{2}$0] crystallographic planes.
Figure 30B:
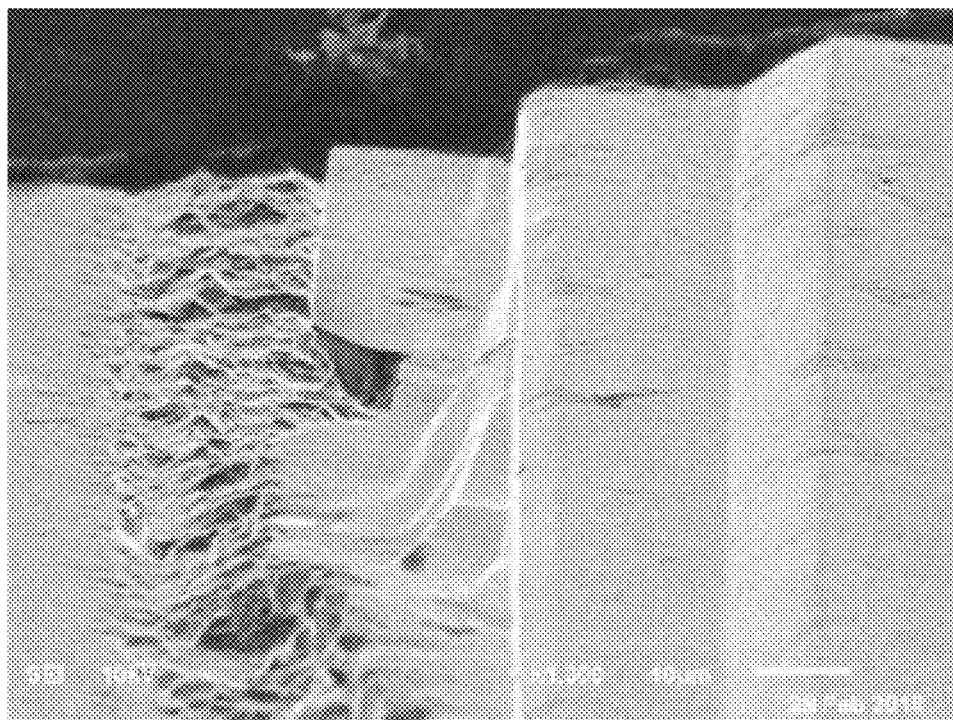
FIG. 30B is a 1,300 times magnification SEM image, taken at a 15 degree tilt angle, of a portion of the SiC wafer fragment of FIG. 29.
Figure 30C:
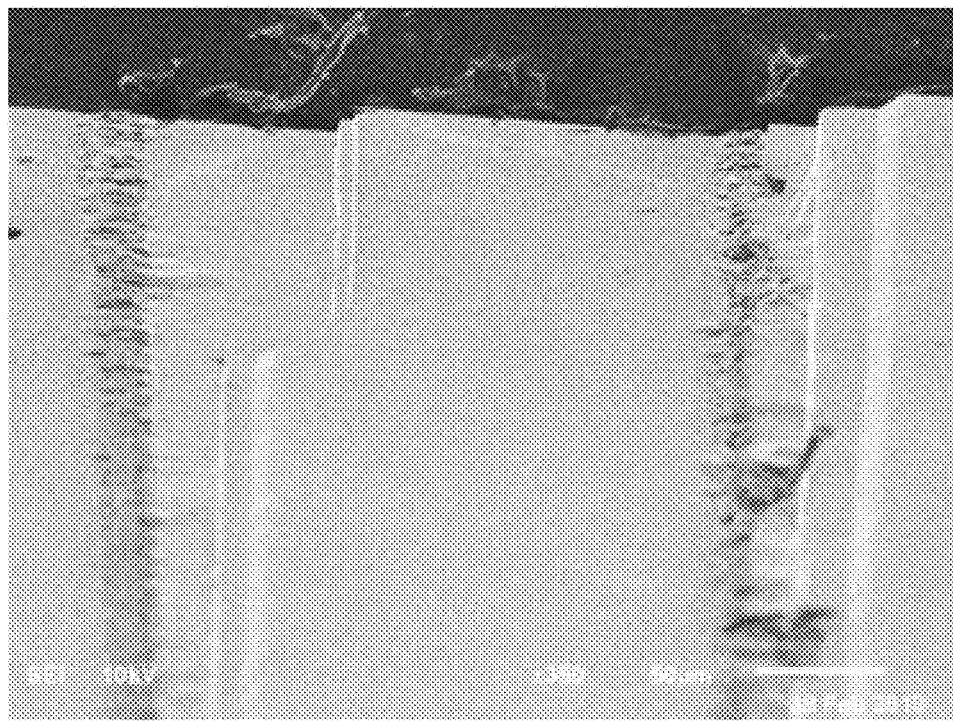
FIG. 30C is a 350 times magnification SEM image, taken at a 15 degree tilt angle, of a portion of the SiC wafer fragment of FIG. 29.

FIG. 30A is a 45 times magnification SEM image, taken at a 15 degree tilt angle, of a portion of the SiC wafer fragment of FIG. 29, with superimposed arrows showing directions of the [1$\bar{1}$00] and [11$\bar{2}$0] crystallographic planes. Laser lines are perpendicular to the [11$\bar{2}$0] direction spaced at about 250 microns therebetween. FIG. 30B is a 1,300 times magnification SEM image, taken at a 15 degree tilt angle, of a portion of the SiC wafer fragment of FIG. 29. FIG. 30C is a 350 times magnification SEM image, taken at a 15 degree tilt angle, of a portion of the SiC wafer fragment of FIG. 29. As shown in FIG. 30C, off-axis cleave planes roughly correlate with the laser spacing, but are not consistent across the entire wafer surface. This may be attributable at least on part to variation in laser line position on cleave planes. In this wafer, fracture was initiated at a polycrystalline inclusion.

Figure 30D:
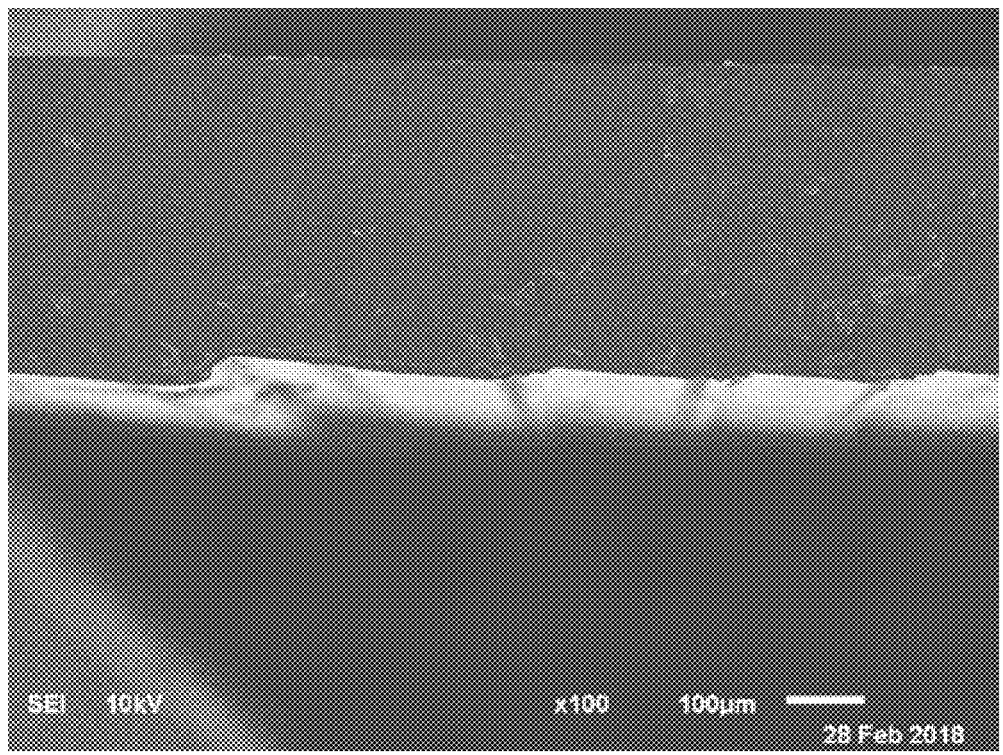
FIG. 30D is a 100 times magnification SEM image taken at a 2 degree tilt angle, of a portion of the SiC wafer fragment of FIG. 29.
Figure 30E:
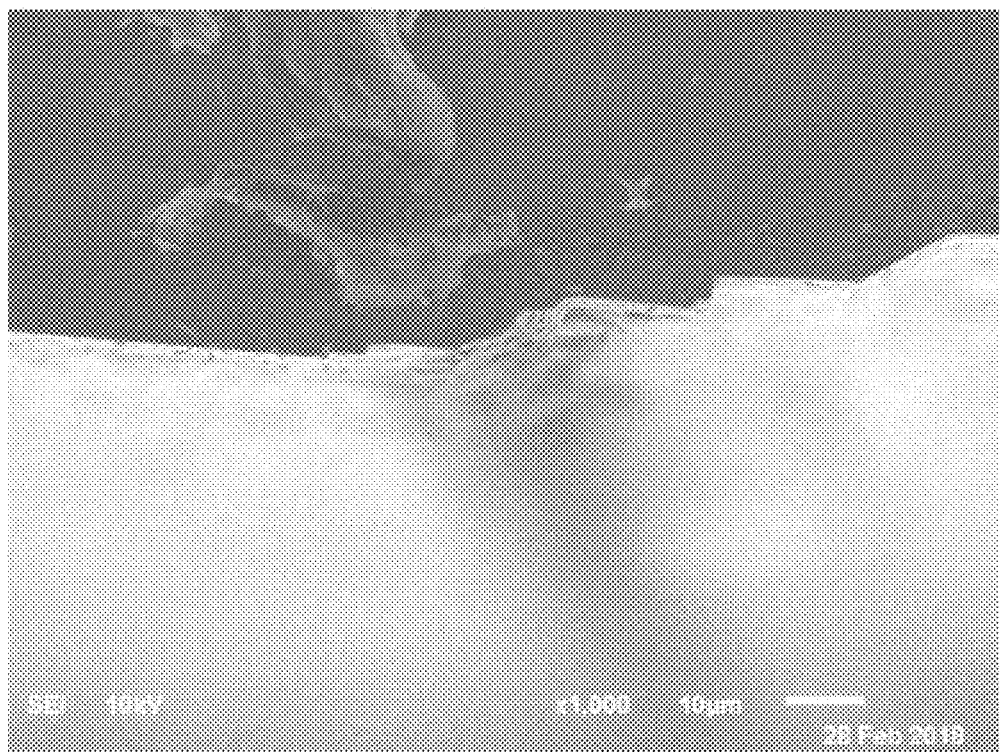
FIG. 30E is a 1,000 times magnification SEM image taken at a 2 degree tilt angle, of a portion of the SiC wafer fragment of FIG. 29.

FIG. 30D is a 100 times magnification SEM image taken at a 2 degree tilt angle, of a portion of the SiC wafer fragment of FIG. 29. FIG. 30E is a 1,000 times magnification SEM image taken at a 2 degree tilt angle, of a portion of the SiC wafer fragment of FIG. 29. FIGS. 30D and 30E show that laser damage is fairly shallow compared to surface features along the fracture region. Variability in the resulting fracture damage is visible, particularly in a central portion of FIG. 30E.

Figure 31A:
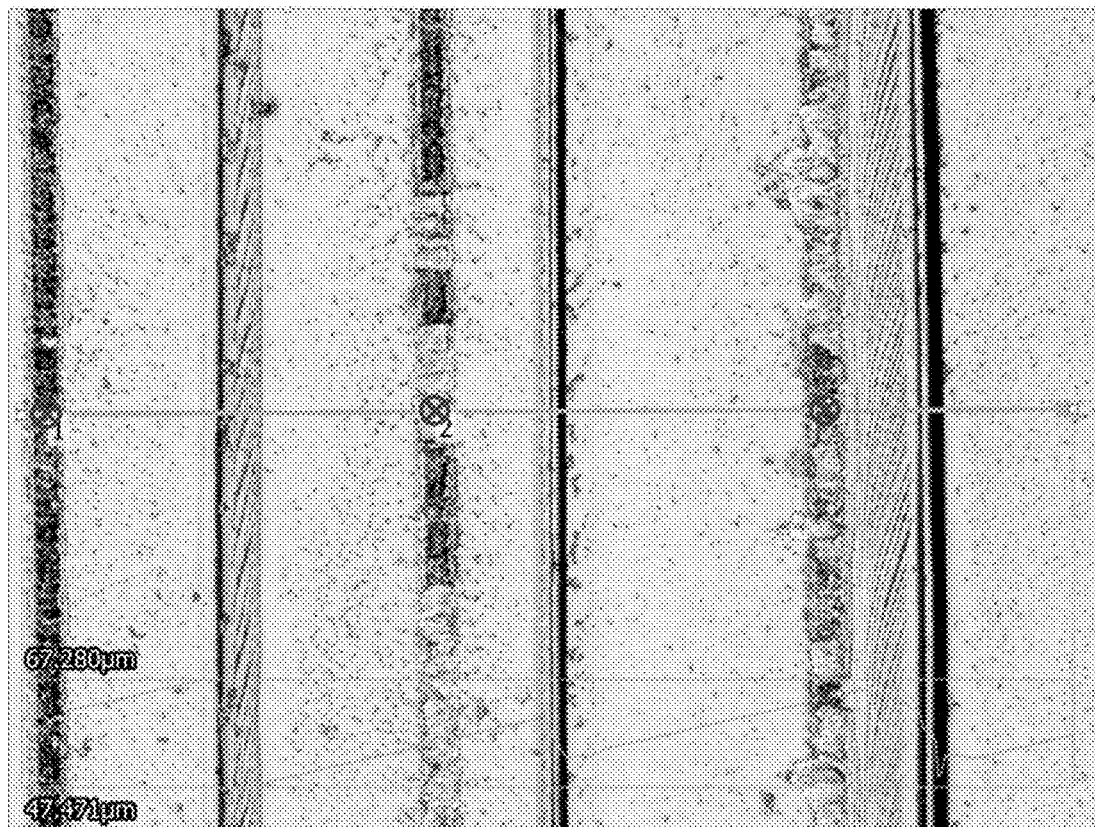
FIG. 31A is a confocal laser scanning microscopy image of a small, central portion of the SiC wafer of FIG. 29, with superimposed crosshairs marking positions of "trenches" formed by laser scanning.
Figure 31B:
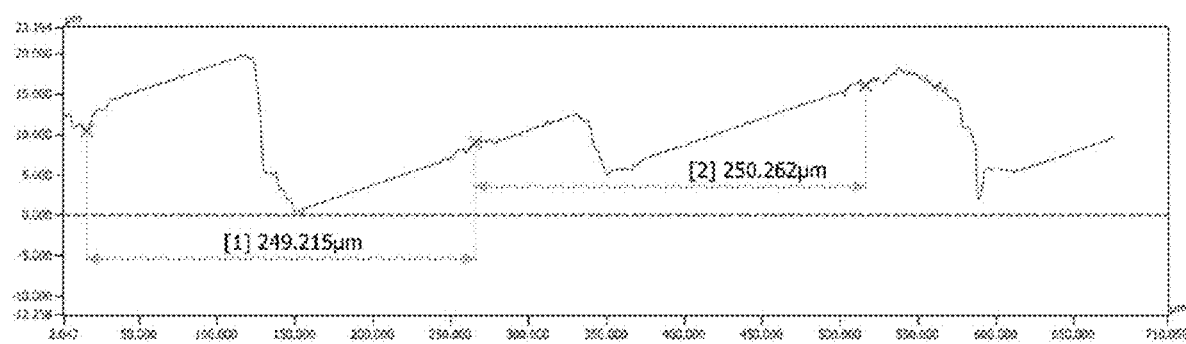
FIG. 31B is a surface profile plot of the portion of the SiC wafer of FIG. 31A.

FIG. 31A is a confocal laser scanning microscopy image of a small, central portion of the SiC wafer of FIG. 29, with superimposed crosshairs marking positions of "trenches" formed by laser scanning. FIG. 31B is a surface profile plot of the portion of the SiC wafer of FIG. 31A. With reference to FIG. 31B, variability in laser line position relative to SiC cleave planes is observable.

Figure 32A:
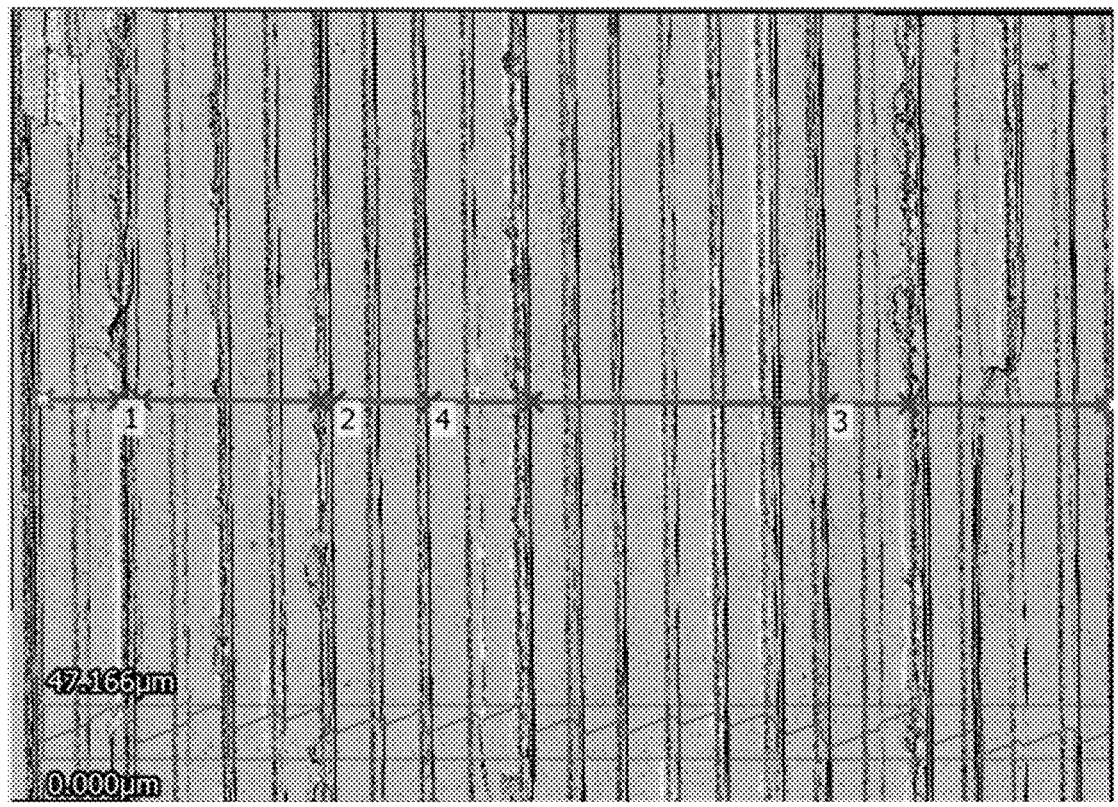
FIG. 32A is a confocal laser scanning microscopy image of a larger, top-proximate (as pictured) portion of the SiC wafer of FIG. 29, with superimposed crosshairs marking positions of "trenches" formed by laser scanning.
Figure 32B:
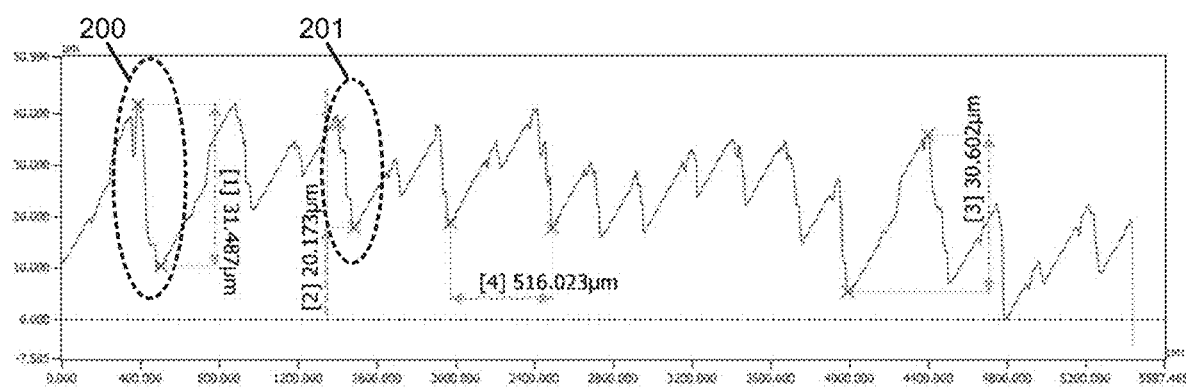
FIG. 32B is a surface profile plot of the top-proximate portion of the SiC wafer of FIG. 32A.

FIG. 32A is a confocal laser scanning microscopy image of a larger, top-proximate (as pictured) portion of the SiC wafer of FIG. 29, with superimposed crosshairs marking positions of "trenches" or lines formed by laser scanning. FIG. 32B is a surface profile plot of the top-proximate portion of the SiC wafer of FIG. 32A. In FIG. 32B, a first pair of lines corresponding to laser damage (represented as crosshairs within oval 200) are separated by a depth of more than 30 microns, and a second pair of lines corresponding to laser damage (represented as crosshairs within oval 201) are separated by a depth of more than 20 microns. An irregular spacing between laser lines is shown in FIGS. 32A and 32B, wherein individual lines within the first pair of lines (within oval 200) are closer to one another, and individual lines within the second pair of lines (within oval 201), are closer to one another than other depicted laser damage lines.

Figure 33A:
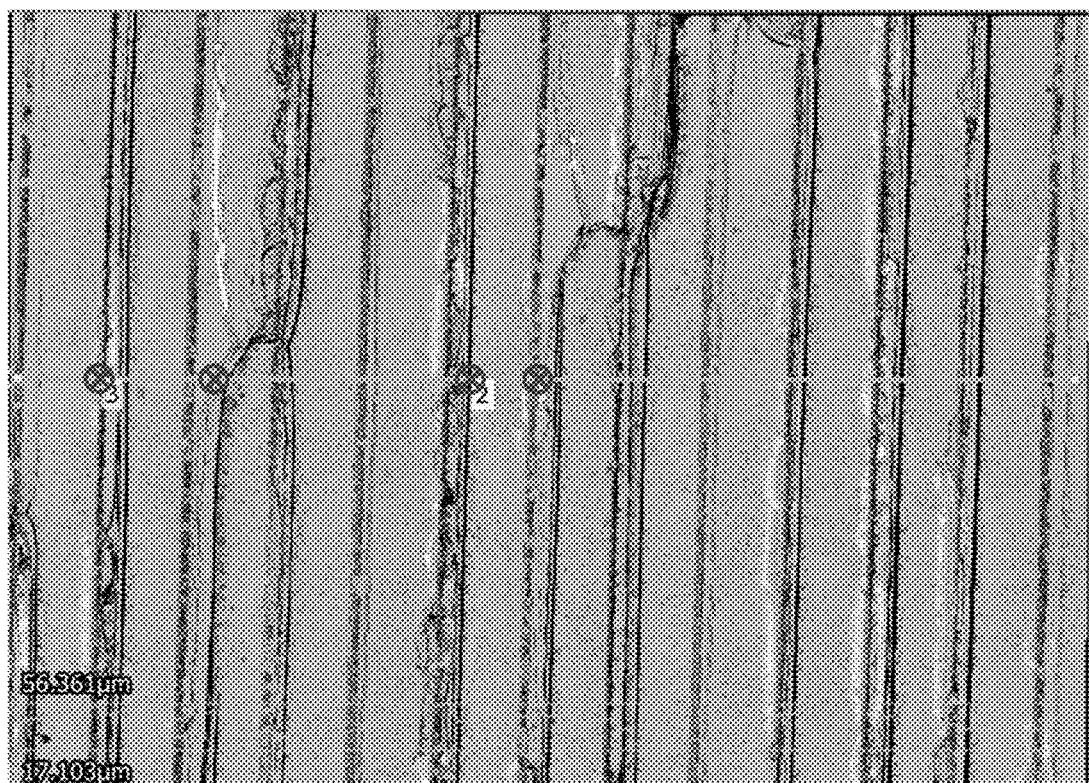
FIG. 33A is a confocal laser scanning microscopy image of a larger, bottom-proximate (as pictured) portion of the SiC wafer of FIG. 29, with superimposed crosshairs marking positions of "trenches" formed by laser scanning.
Figure 33B:
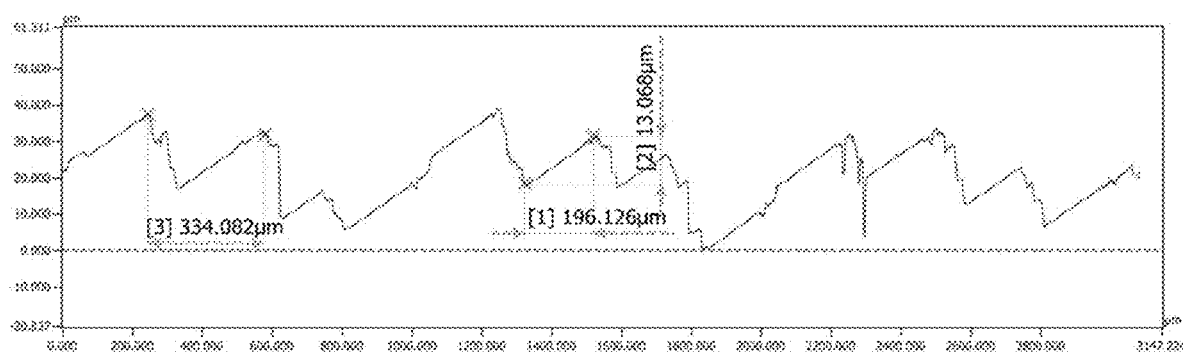
FIG. 33B is a surface profile plot of the bottom-proximate portion of the SiC wafer of FIG. 33A.

FIG. 33A is a confocal laser scanning microscopy image of a larger, bottom-proximate (as pictured) portion of the SiC wafer of FIG. 29, with superimposed crosshairs marking positions of "trenches" formed by laser scanning. FIG. 33B is a surface profile plot of the bottom-proximate portion of the SiC wafer of FIG. 33A. FIG. 33B shows lateral distance variation between adjacent pairs of laser damage lines, with one pair separated by 334 microns, and another separated by 196 microns, but a maximum depth variation of 13 microns.

Fracturing of Substrate Following Formation of Subsurface Laser Damage

As discussed previously herein, subsurface laser damage may be formed within a crystalline material substrate to prepare the substrate for fracturing to remove at least one thin layer of crystalline material (e.g., a wafer) from the substrate. Although examples of specific fracturing techniques are described hereinafter (e.g., cooling a CTE-mismatched carrier joined to a substrate, impinging ultrasonic waves on a substrate, or imparting a bending moment on a carrier mounted to substrate), it is to be appreciated that various subsurface laser damage formation techniques described herein may be used within any suitable fracturing techniques, including fracturing techniques already known to one skilled in the art.

Fracturing by Cooling Rigid Carrier with Carrier/Substrate CTE Mismatch

Figure 34A:
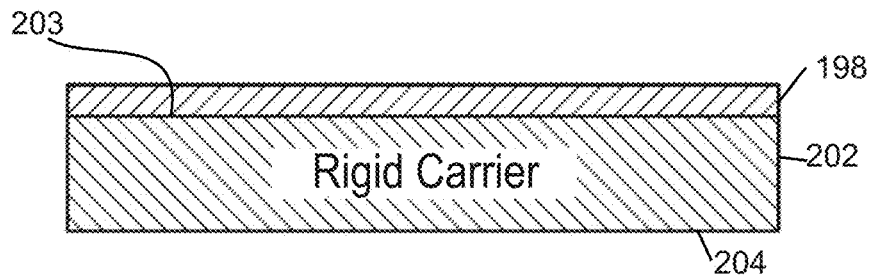
FIG. 34A is a side cross-sectional schematic view of a solid carrier having adhesive material joined to a surface thereof.

FIGS. 34A-34F illustrate steps of a carrier-assisted method for fracturing a crystalline material according to one embodiment of the present disclosure, utilizing a rigid carrier having a greater CTE than the crystalline material joined to the crystalline material. FIG. 34A is side cross-sectional schematic view of a rigid carrier 202 having a layer of adhesive material 198 joined to a first surface 203 of the rigid carrier 202, and having a second surface 204 that opposes the first surface 203.

Figure 34B:
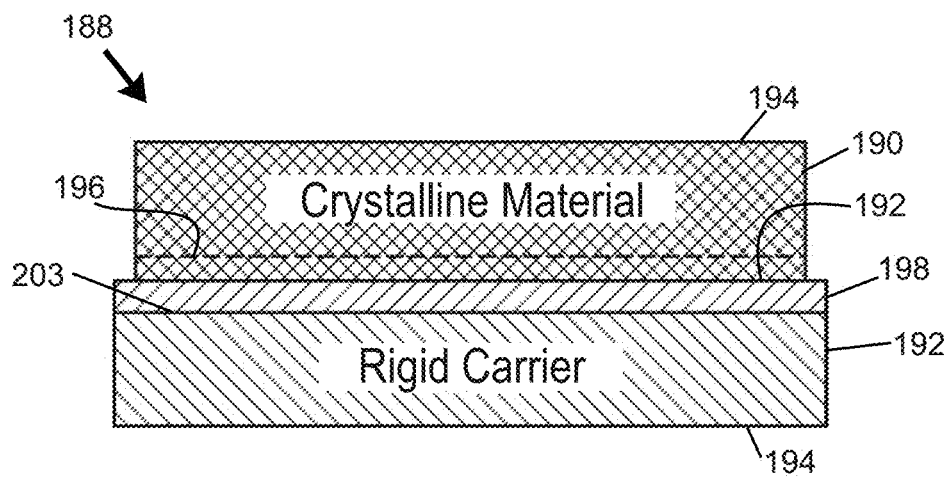
FIG. 34B is a cross-sectional schematic view of an assembly including the solid carrier and adhesive material of FIG. 34A joined to a crystalline material substrate having a subsurface laser damage region proximate to the adhesive material lip.

FIG. 34B is a cross-sectional schematic view of an assembly 188 including the rigid carrier 202 and adhesive material 198 of FIG. 34A joined to a crystalline material substrate 190 having a subsurface laser damage region 196 therein. The rigid carrier 202 has a greater diameter or lateral extent than the substrate 190. The substrate 190 includes a first surface 192 proximate to the adhesive material 198, and includes an opposing second surface 194, with the subsurface laser damage 196 being closer to the first surface 192 than to the second surface 194. The adhesive material 198 extends between a first surface 192 of the crystalline substrate 190 and the first surface 203 of the rigid carrier 202. The adhesive material 198 may be cured according to the requirements of a selected bonding method (e.g., thermocompression adhesive bonding, compression-aided UV bonding, chemically reactive bonding, etc.). In certain embodiments, a second carrier (not shown) may be bonded to the second surface 194 of the substrate 190, with the second carrier optionally being no wider than and/or CTE matched with the substrate 190.

Figure 34C:
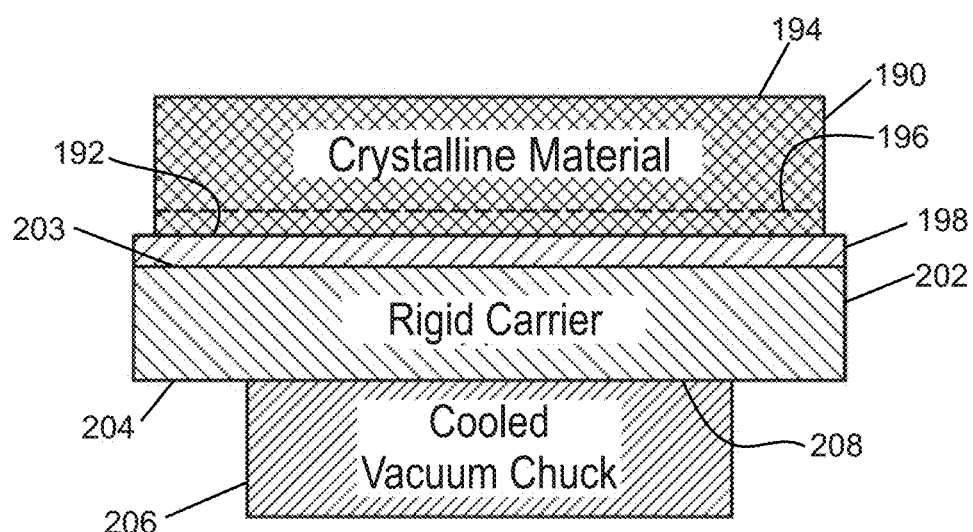
FIG. 34C is a cross-sectional schematic view of the assembly of FIG. 34B, with a surface of the solid carrier being positioned on a cooling apparatus in the form of a liquid-cooled chuck.

FIG. 34C is a cross-sectional schematic view of the assembly of FIG. 34B, following positioning of the second surface 204 of the rigid carrier 202 on a support surface 208 of cooling apparatus in the form of a cooled chuck 206 configured to receive a cooling liquid. Contact between the rigid carrier 202 and the cooled chuck 206 causes heat to be transferred from the rigid carrier 202 to the cooled chuck 206. During the cooling process, the rigid carrier 202 will laterally contract to a greater extent than the crystalline material substrate 190 due to a greater CTE of the carrier 202 than the substrate 190, such that the carrier 202 exerting shear stress on the substrate 190. Due to the presence of subsurface laser damage 196 near the adhesive layer 198 that joins the rigid carrier 202 to the substrate 190, the exertion of shear stress on the substrate 190 causes the crystalline material to fracture along or proximate to the subsurface laser damage region 196.

In certain embodiments, the cooled chuck 206 has a smaller diameter than a diameter of the rigid carrier 202. Although the cooled chuck 206 may be supplied with a cooling liquid, it is not necessary for the rigid carrier 202 to reach the liquid nitrogen temperature (−160° C.) to successfully complete thermal-induced fracture of the crystalline material substrate 190. Favorable separation results have been obtained for fracturing single crystal SiC material supported by a single crystal sapphire substrate using a cooled chuck maintained at −70° C. Such temperature can be maintained using various cooling liquids, such as liquid methanol (which remains flowable above its freezing point at −97° C.) received from a two-phase pumped evaporative cooling system. Favorable separation results have also been obtained by cooling a carrier, adhesive, and a substrate in a freezer maintained at −20° C., wherein such temperature may be maintained using a single phase evaporative cooling system. The ability to use a single phase evaporative cooling system or a two-phase pumped evaporative cooling system rather than liquid nitrogen significantly reduces operating costs.

Figure 34D:
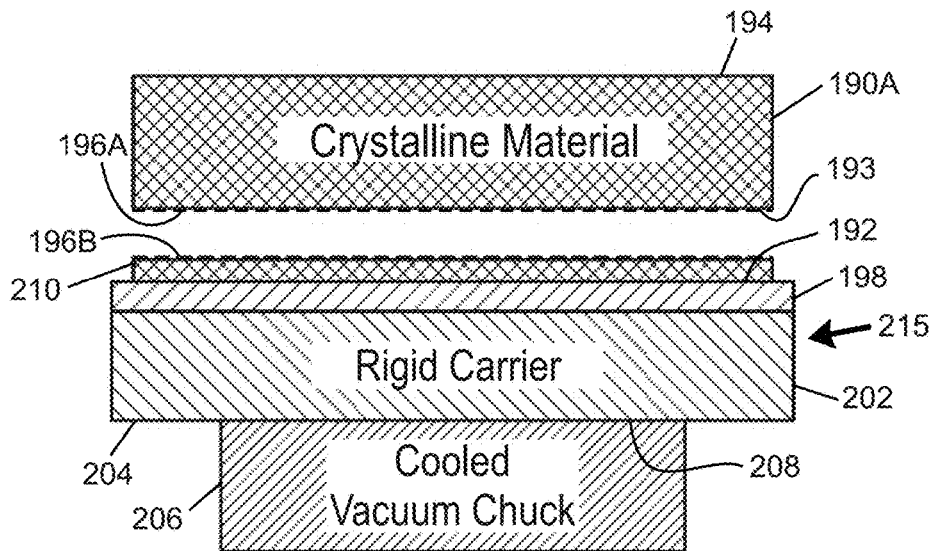
FIG. 34D is a cross-sectional schematic view of a majority of the crystalline material substrate separated from a bonded assembly (atop the liquid-cooled chuck) including the solid carrier and a portion of the crystalline material removed from the substrate, following fracture of the crystalline material along the subsurface laser damage region.

FIG. 34D is a cross-sectional schematic view of a remainder of the crystalline material substrate 190A separated from a bonded assembly that includes the rigid carrier 202, adhesive material 198, and a portion of the crystalline material 210 removed from the remainder of the substrate 190A, following fracture of the crystalline material along the subsurface laser damage region. The remainder of the crystalline material substrate 190A is bounded by a new first surface 193 (having residual laser damage 196A) that opposes the second surface 194. Correspondingly, the removed portion of crystalline material 210 is bounded by a new second surface 212 (having residual laser damage 196B) that opposes the first surface 192. Thereafter, the bonded assembly 215 including the rigid carrier 202, the adhesive material 198, and the removed portion of crystalline material 160 may be withdrawn from the cooled chuck 206.

Figure 34E:
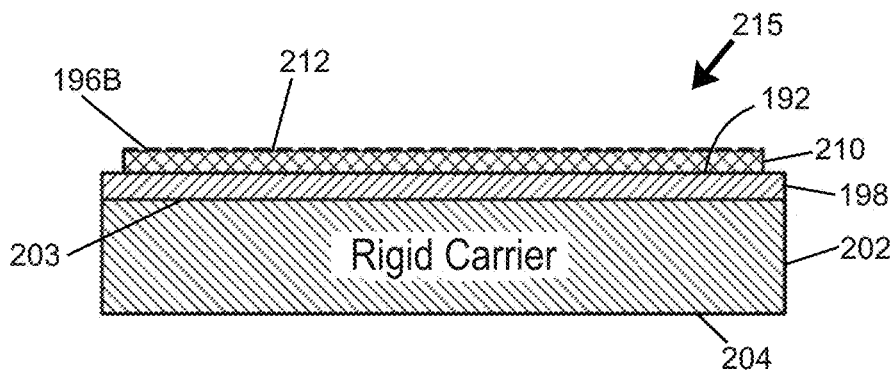
FIG. 34E is a cross-sectional schematic view of the bonded assembly of FIG. 34D following removal from the liquid-cooled chuck, with residual laser damage along an upward facing surface.

FIG. 34E is a cross-sectional schematic view of the bonded assembly 215 of FIG. 34D, following withdrawal from the liquid-cooled chuck 206. Maintaining the removed portion of crystalline material 210 attached to the rigid carrier 202 beneficially provides mechanical support for the removed portion of crystalline material 210 to permit one or more surface processing steps (e.g., grinding, polishing, etc.) to be performed on the new surface 212, to remove the residual laser damage 1968 and achieve a desirable thickness of the crystalline material 210 (e.g., via grinding, optionally followed by chemical mechanical planarization and/or polishing steps). In certain embodiments, laser damage removal and thinning may include sequential grinding/polishing operations, and any suitable polishing and cleaning steps to prepare the new surface 212 for subsequent operations (e.g., surface implantation, laser marking (e.g., along a wafer flat), formation of epitaxial layers, metallization, etc.).

Figure 34F:
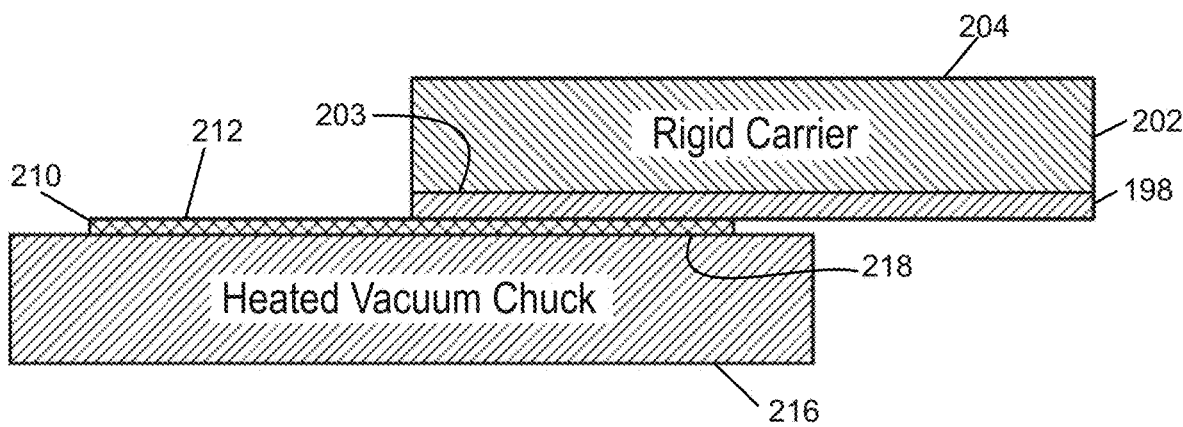
FIG. 34F is a cross-sectional schematic view of the portion of the crystalline material supported by a heated vacuum chuck, with the solid carrier and adhesive material being laterally translated away from the crystalline material portion following thermal softening and release of the adhesive material.

FIG. 34F is a cross-sectional schematic view of the removed portion of the crystalline material 210 supported by an upper surface 218 of a heated vacuum chuck 216, with the rigid carrier 202 and adhesive material 198 being laterally translated away from the removed portion of crystalline material 212 portion following elevated temperature softening and release of the adhesive material 198. That is, the heated vacuum chuck 216 may heat the adhesive material 198 to a sufficient temperature to soften and/or flow, such that upon application of an external shear stress to the second surface 204 of the rigid carrier 202, the rigid carrier 202 is permitted to laterally translate away from the removed portion of crystalline material 212 that is temporarily held in place by the heated vacuum chuck 216. Thereafter, the heated vacuum chuck 216 may be deactivated, and the removed portion of crystalline material 212 embodies a free-standing material. If desired, any residue from the adhesive 198 may be removed and cleaned from the first surface 203 of the rigid carrier 202, and the rigid carrier 202 optionally may be re-used for another fracturing operation. The removed crystalline material can then be used as a growth substrate for deposition of one or more epitaxial layers and conducting metal layers to from a device wafer then singulated to form discrete semiconductor devices.

Fracturing Induced by Ultrasonic Energy

Figure 35:
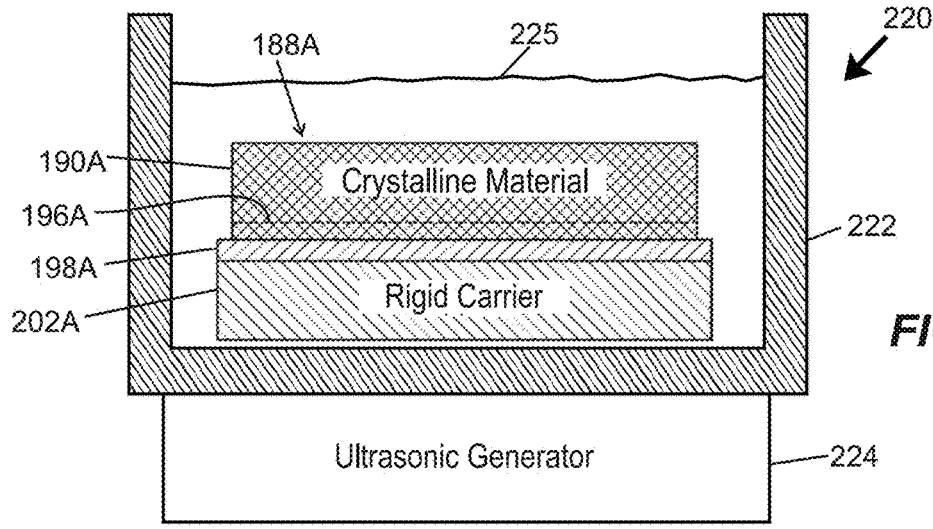
FIG. 35 is a cross-sectional schematic view of a crystalline material having subsurface laser damage and bonded to a rigid carrier, with the crystalline material and carrier arranged in a liquid bath of an ultrasonic generator.

Another method for effectuating fracture along a laser-induced subsurface damage zone of a crystalline material bonded to a rigid carrier involves application of ultrasonic energy to the crystalline material while in the bonded state. FIG. 35 is a cross-sectional schematic view of an assembly 188A including a crystalline material 190A having subsurface laser damage 196A and bonded to a rigid carrier 202A using an intervening adhesive material 198A, with assembly 188A arranged in a liquid bath 225 of an ultrasonic generator apparatus 220. The apparatus 220 further includes a vessel 222 arranged in contact with an ultrasonic generating element 224, with the vessel 222 containing the liquid bath 225. Presence of the rigid carrier 202A may reduce or eliminate breakage of the crystalline material 190A when subjected to ultrasonic energy, particularly if residual stress remains between the rigid carrier 202A and the crystalline material 190A prior to separation (e.g., due to a CTE mismatch). Such residual stress may reduce the amount of ultrasonic energy required to initiate fracture of the crystalline material, thereby reducing the likelihood of material breakage.

Fracturing Induced by Mechanical Force

In certain embodiments, fracturing of a crystalline material bonded to a rigid carrier may be promoted by (i) application of a mechanical force (e.g., optionally localized at one or more points) proximate to at least one edge of the carrier. Such force may impart a bending moment in at least a portion of the carrier, with such bending moment being transmitted to the subsurface laser damage region to initiate fracture. An exemplary embodiment is shown in FIGS. 36A-36C.

Figure 36A:
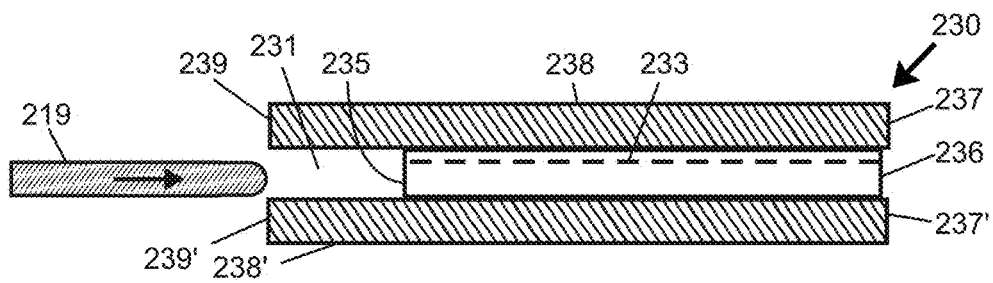
FIGS. 36A-36C are cross-sectional schematic views illustrating steps for fracturing a crystalline material having subsurface laser damage including application of a mechanical force proximate to one edge of a carrier to impart a bending moment in at least a portion of the carrier.
Figure 36B:
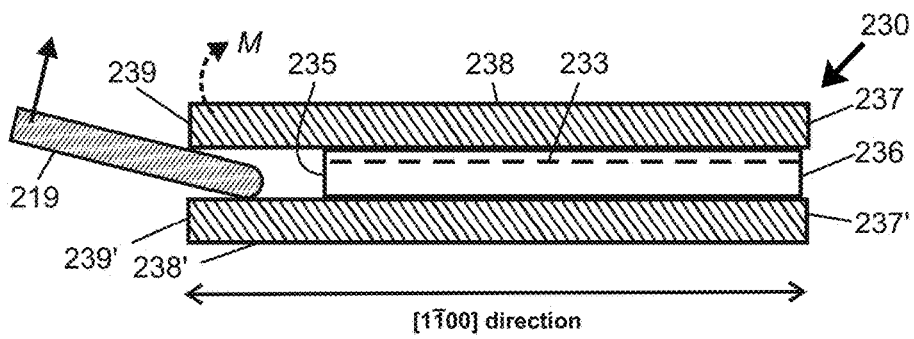
Figure 36C:
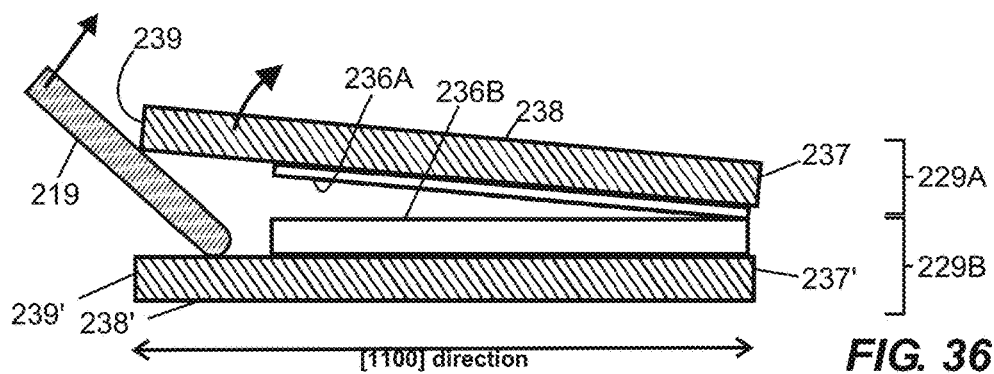

FIGS. 36A-36C are cross-sectional schematic views illustrating steps for fracturing a crystalline material substrate 236 having subsurface laser damage 233 by application of a mechanical force proximate to one edge of a carrier 238 to which the substrate 236 is bonded. The bonded assembly includes a crystalline material substrate 236 having a subsurface laser damage region 233 being bonded between rigid carriers 238, 238'. Each rigid carrier 238, 238' includes a laterally protruding tab portion 239, 239' registered with a flat 235 of the substrate 236, providing a local increased border region that defines a recess 231 into which a tool 219 may be inserted. FIG. 36A illustrates a state prior to insertion of the tool 219 into the recess 191. FIG. 36B illustrates a state following insertion of the tool 219 into the recess, when the tool 216 is tilted upward, thereby exerting a prying force in a direction tending to promote separation between the rigid carriers 238, 238', thereby exerting a bending moment Mon at least one carrier 238. In certain embodiments, the substrate 236 comprises a material (e.g., 4H—SiC) having hexagonal crystal structure and the bending moment M is oriented within ±5 degrees of perpendicular to the [11$\bar{2}$0] direction (or, equivalently, within ±5 degrees of parallel to the [1-100] direction) of the hexagonal crystal structure. FIG. 36C illustrates a state following initial fracture of the crystalline substrate 236 along the subsurface laser damage region 233, whereby an upper portion 236 of the crystalline material remains bonded to the upper carrier 238, and a lower portion 236B of the crystalline material remains bonded to the lower carrier 238', and the upper carrier 238 is tilted upward relative to the lower carrier 238'. Such fracture yields a first bonded assembly 229A (including the upper carrier 238 and the upper portion 236A of the crystalline material) separated from a second bonded assembly 229B (including the lower carrier 238' and the lower portion 236B of the crystalline material). In certain embodiments, mechanical force may be applied proximate to opposing edges of a rigid carrier to which a substrate is bonded to promote fracture of a crystalline material having subsurface laser damage that is bonded to the carrier.

It is noted that it is specifically contemplated to combine two or more fracturing techniques (e.g., CTE mismatch and ultrasonic induced fracturing; or CTE mismatch and mechanical induced fracturing; or ultrasonic induced and mechanical induced fracturing). In certain embodiments, liquid of an ultrasonic bath may be cooled either before or during application of ultrasonic energy. Amount of mechanical force that may be required to complete fracture may be affected by CTE differential between a substrate and a carrier. In certain embodiments, CTE differential and mechanical force may be combined. If a CTE differential between a carrier and substrate is small or nonexistent (i.e., matched CTE), then more mechanical force may be required to complete fracture. Conversely, if a CTE mismatch is large, then reduced mechanical force or no mechanical force may be required to complete fracture.

Device Wafer Splitting Process

In certain embodiments, a laser- and carrier-assisted separation method may be applied to a crystalline material after formation of at least one epitaxial layer thereon (and optionally at least one metal layer) as part of an operative semiconductor-based device. Such a device wafer splitting process is particularly advantageous for the ability to increase yield (and reduce waste) of crystalline material by significantly reducing the need for grinding away substrate material following device formation.

Figure 37A:
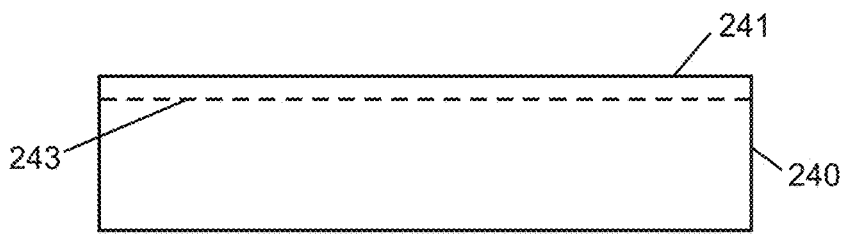
FIGS. 37A-37O are cross-sectional schematic views illustrating steps of a device wafer splitting process, according to which a thick wafer is fractured from a crystalline material, at least one epitaxial layer is grown on the thick wafer, and the thick wafer is fractured to form a first and second bonded assemblies each including a carrier and a thin wafer divided from the thick wafer, with the first bonded assembly including the at least one epitaxial layer as part of an operative semiconductor-based device.
Figure 37B:
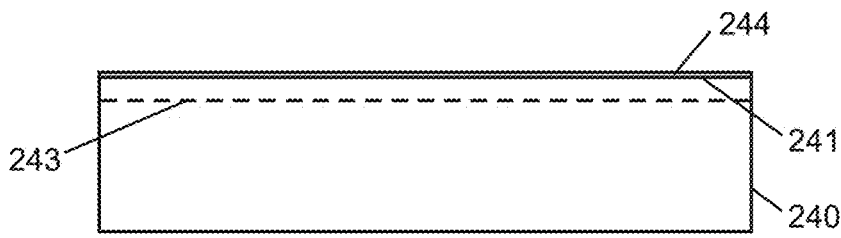
Figure 37C:
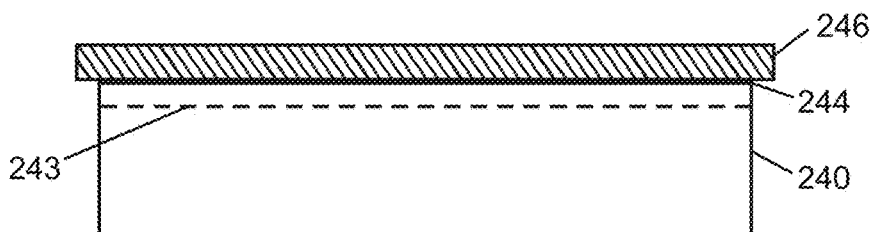
Figure 37D:
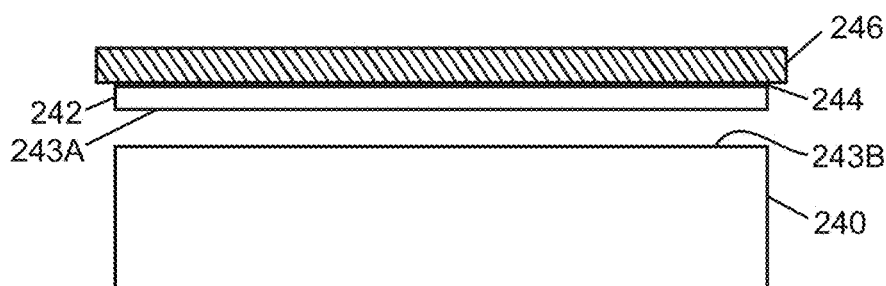
Figure 37E:
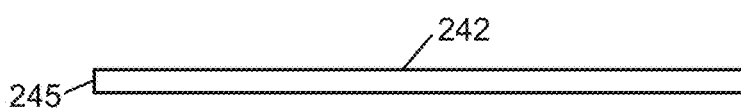
Figure 37F:
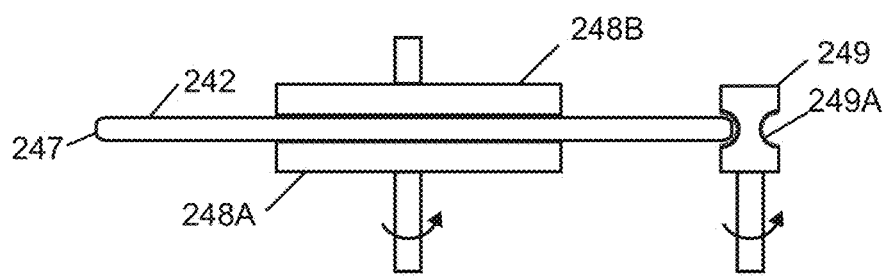
Figure 37G:
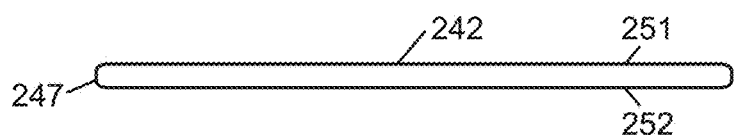
Figure 37H:
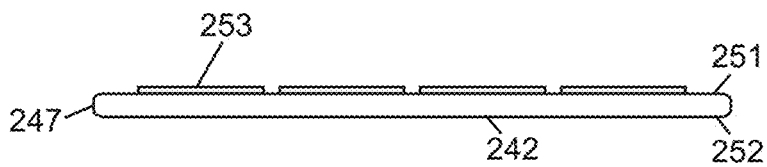
Figure 37I:
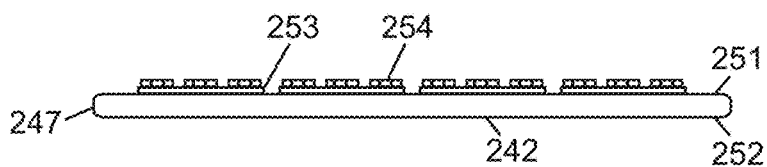
Figure 37J:
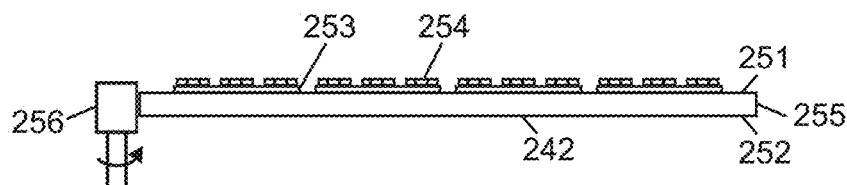
Figure 37K:
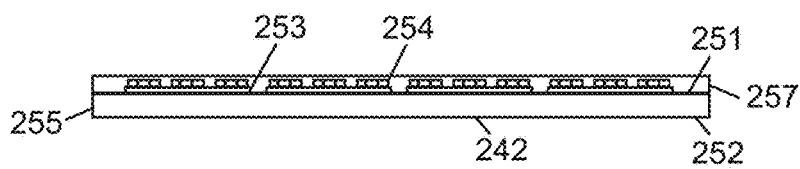
Figure 37L:
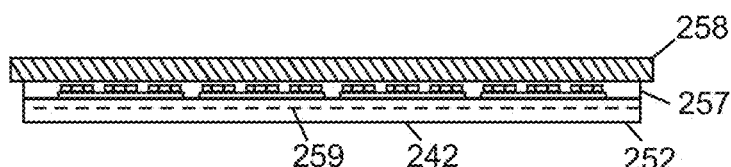
Figure 37M:
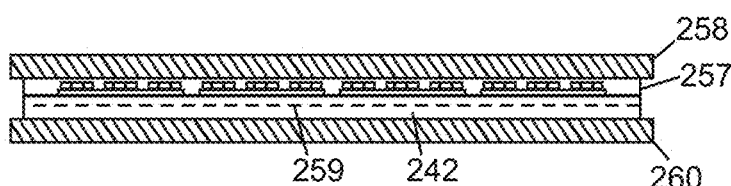
Figure 37N:
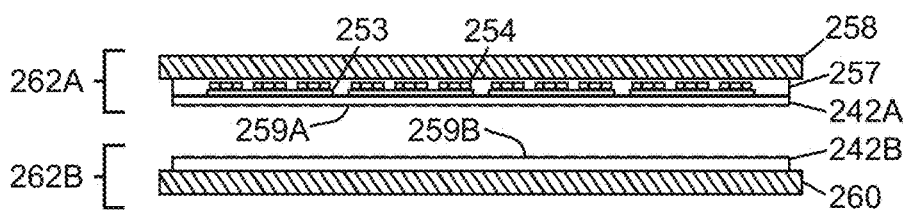
Figure 37O:
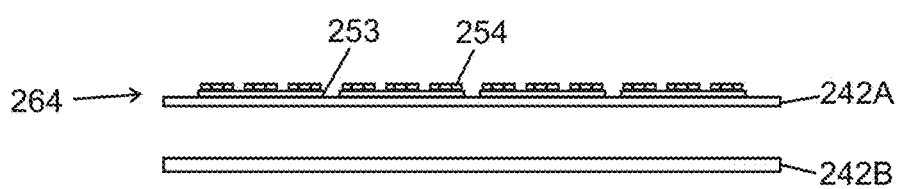

FIGS. 37A-37O are cross-sectional schematic views illustrating steps of a device wafer splitting process, according to which a thick wafer is fractured from a crystalline material, at least one epitaxial layer is grown on the thick wafer, and the thick wafer is fractured to form a first and second bonded assemblies each including a carrier and a thin wafer divided from the thick wafer, with the first bonded assembly including the at least one epitaxial layer as part of an operative semiconductor-based device.

FIG. 37A illustrates a crystalline material substrate 240 having a first surface 241 and subsurface laser damage 243 arranged at a depth relative to the first surface. FIG. 37B illustrates the substrate 240 of FIG. 37A following addition of adhesive material 244 over the first surface 241. FIG. 37C illustrates the items depicted in FIG. 37B following bonding of a rigid carrier 246 to the substrate 240 using the adhesive material 244. FIG. 37D illustrates the items of FIG. 37D following fracturing of the substrate 240 along the subsurface laser damage 243 (e.g., using one or more methods disclosed herein), yielding a remainder of the substrate 240 that is separated from a bonded assembly that includes the carrier 246, the adhesive material 244, and a crystalline material portion (e.g., a thick wafer) 242 removed from the substrate 240. In certain embodiments, the thick wafer 242 may have a thickness in a range of roughly 350 to 750 microns. Exposed surfaces 243A, 243B of the thick wafer 242 and the remainder of the substrate 240, respectively may exhibit surface irregularities that may be reduced by surface processing steps such as grinding, CMP, polishing, etc. FIG. 37E shows the thick wafer 242 following de-bonding and removal from the carrier 246, with the thick wafer 242 including a perpendicular edge profile. Perpendicular edges of wafers fracture readily, producing unacceptable edge chips and particles during wafer handling. To reduce the risk of breakage, a wafer edge may be edge ground to produce a non-perpendicular wafer edge having a beveled or rounded edge. FIG. 37F shows the thick wafer 242 supported between opposing upper and lower gripping portions 248A, 248B of a turntable proximate to a rotary profile grinding tool 249 having a concave cutting surface 249A (e.g., impregnated with diamond particles) configured to impart a rounded edge profile 247 to the thick wafer 242. FIG. 37G shows the thick wafer 242 after edge grinding (also known as edge profiling), with the thick wafer including a rounded edge 247 providing a boundary between first and second wafer surfaces 251, 252.

FIG. 37H shows the thick wafer 242 of FIG. 37G following deposition of one or more epitaxial layers 253 on or over the first surface 251 of the thick wafer 251. Due to the incompatibility of adhesives with the high temperatures inherent to epitaxy, carrier shown in FIG. 37D is not present. FIG. 37I shows the structure FIG. 37H, following formation of conductive (e.g., metal) contacts 254 over the epitaxial layers 253 to form at least one operative semiconductor device, with the thick wafer 242 still having a rounded edge 247. Conventionally, grinding would be performed on the second surface 252 to thin the thick wafer 242 to an appropriate thickness for the resulting device (e.g., 100 to 200 microns for a Schottky diode or MOSFET). The approach disclosed herein reduced the need for wafer grinding, and instead utilizes laser- and carrier-assisted separation to remove a portion of the thick wafer so that it can be surface finished and used to fabricate another operative semiconductor device.

The inventors have found that presence of the rounded edge 247 on the thick wafer 242 inhibits controlled formation of subsurface laser damage proximate to the edge 247, since the rounded profile negatively affects laser focus and depth control. To address this issue, the rounded edge 247 of the thick wafer 242 may be removed prior to further laser processing. FIG. 37J shows the structure of FIG. 37I being subjected to grinding with an edge grinder 256 to grind away the rounded edge 247 and impart a substantially perpendicular edge 255 extending between the first and second surfaces 251, 252 of the thick wafer 242, with the epitaxial layers 253 and contacts 254 arranged over the first surface 251.

FIG. 37K shows the structure of FIG. 37J following addition of temporary adhesive material 257 over the first surface 251 of the thick wafer 242, the epitaxial layers 253, and the contacts 254, in preparation for receiving and adhering a first carrier. FIG. 37L shows the structure of FIG. 37K following addition of a first carrier 258 over the temporary adhesive material 257, and following formation of subsurface laser damage 259 within the thick wafer 242 by impingement of focused laser emissions through the second surface 252 of the thick wafer 242. FIG. 37M shows the structure of FIG. 37L following bonding of a rigid second carrier 260 to the second surface 252 of the thick wafer 242 proximate to the subsurface laser damage 259. For purposes of separation, the rigid second carrier 260 will serve as a frontside carrier intended to remove a portion (i.e., a layer) of the thick wafer 242.

In certain embodiments, laser emissions can be applied to a freestanding device thick wafer, and first and second carriers may be bonded to the frontside and backside of the thick wafer at substantially the same time. In certain embodiments, adhesive material may be applied on carriers or the wafers for one or both of the front and back sides.

FIG. 37N shows the items of FIG. 37M following application of at least one fracturing process as disclosed herein to fracture the thick wafer 242 along the subsurface laser damage 259 to yield first and second bonded subassemblies 262A, 262B. The first bonded subassembly 262A includes a first thin wafer portion 242A (separated from the thick wafer 242 of FIG. 37M), the epitaxial layers 253, the contacts 254, the temporary adhesive material, and the first carrier 258. The second bonded subassembly 262B includes a second thin wafer portion 242B (separated from the thick wafer 242 of FIG. 37M) and the second carrier 260. Exposed surfaces 259A, 259B of the thin wafer portions 242A, 242B may exhibit surface irregularities due to laser damage and/or fracturing that may be reduced by conventional surface processing steps (e.g., grinding, CMP, and/or polishing). FIG. 37O shows an operative semiconductor device 264 derived from the first bonded subassembly 262A by removal of the temporary adhesive 257 and the first carrier 258. Such figure also the second thin wafer portion 242B following removal of the second carrier 260, to prepare the second thin wafer portion 242B for further processing (e.g., epitaxial growth).

Exemplary Method Including Re-use of Carrier Wafers

Figure 38:
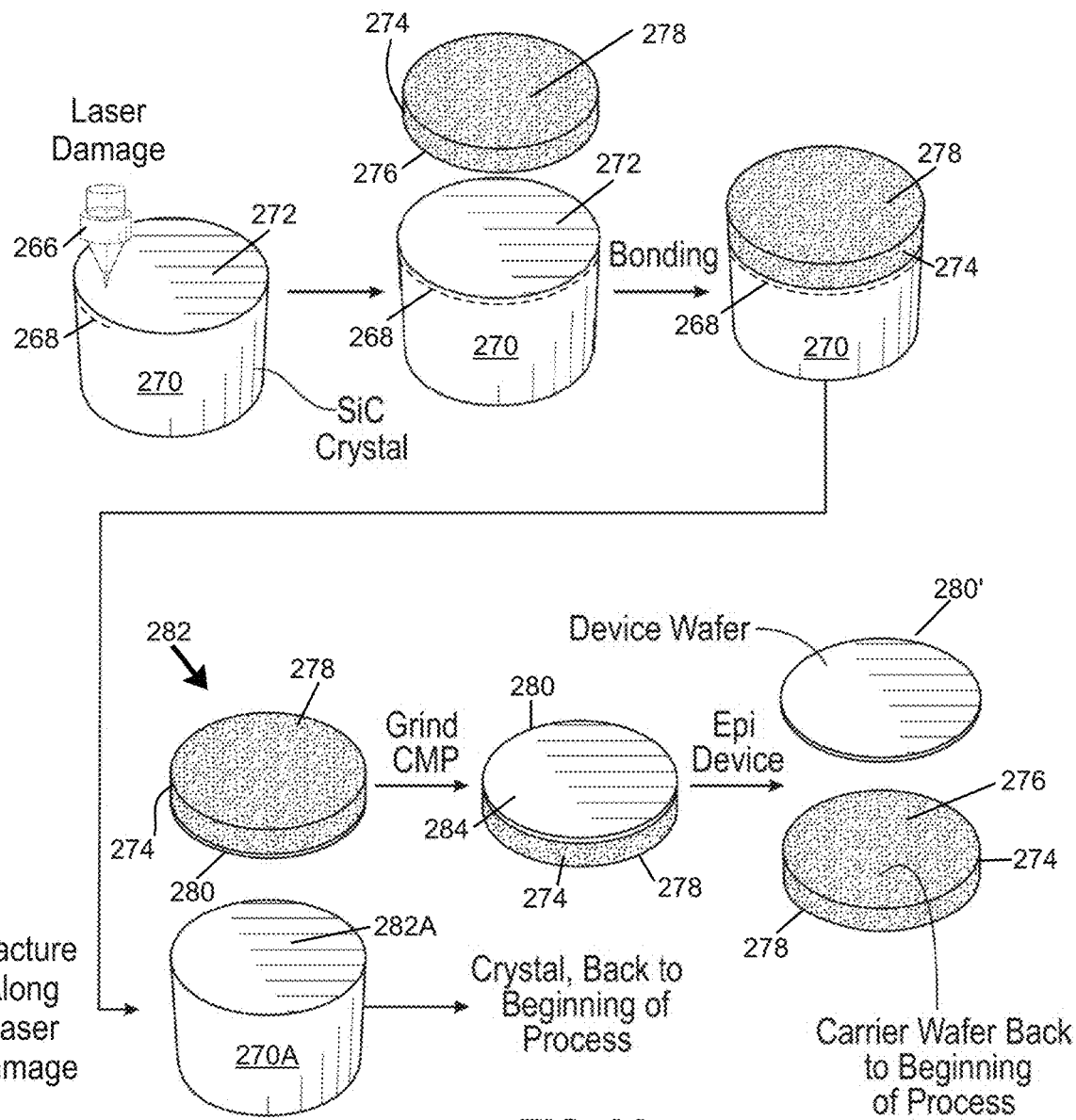
FIG. 38 is a flowchart schematically illustrating steps for producing subsurface laser damage and bonding a rigid carrier to a crystalline (e.g., SiC) material ingot, followed by laser parting of a bonded assembly including the carrier and a portion of the crystalline material, followed by further processing of the bonded assembly and formation of epitaxial layers on a device wafer, with return of the ingot and the rigid carrier to a beginning of the process.

FIG. 38 is a flowchart schematically illustrating steps of a method according to the present disclosure. Starting at upper left, a laser 266 may focus laser emissions below a first surface 272 of a thick crystalline material substrate 270 (e.g., a SiC ingot) to produce a subsurface laser damage region 268. Thereafter, a carrier wafer 224 may be bonded to the first surface 272 of the crystalline material substrate 270, with the carrier wafer 274 including a first surface 276 (proximal to the first surface 272 of the substrate 270) and a second surface 278 that opposes the first surface 276 of the carrier wafer 274. Such bonding between the carrier wafer 278 and the crystalline material substrate 270 may be performed by any method disclosed herein, such as adhesive bonding or anodic bonding. Details concerning anodic bonding between crystalline material substrates and carriers are disclosed in U.S. Patent Application Publication No. 2016/0189954, with the contents of such publication hereby being incorporated by reference herein, for all purposes. Thereafter, a fracturing process as disclosed herein (e.g., cooling a CTE mismatched carrier, application of ultrasonic energy, and/or application of mechanical force) is applied to fracture the crystalline material 270 along the subsurface laser damage region 218, causing a crystalline material portion 280 bound to the carrier wafer 278 to be separated from a remainder of the crystalline material substrate 270A. A newly exposed surface 282A of the remainder of the crystalline material substrate 270A having residual laser damage is ground smooth and cleaned, and returned to the beginning of the process (at upper left in FIG. 38). Also, a newly exposed surface 284 of the removed crystalline material 280 is ground smooth while attached to the carrier 274. Thereafter, the carrier wafer 274 may be separated from the removed portion of the crystalline material 280, and the crystalline material 280 may be subject to epitaxial growth of one or more layers to form an epitaxial device 280', while the carrier wafer 274 is cleaned and returned to the beginning of the process (at upper left in FIG. 38) to effectuate removal of another relatively thin section of the crystalline material substrate 270.

Figure 39:
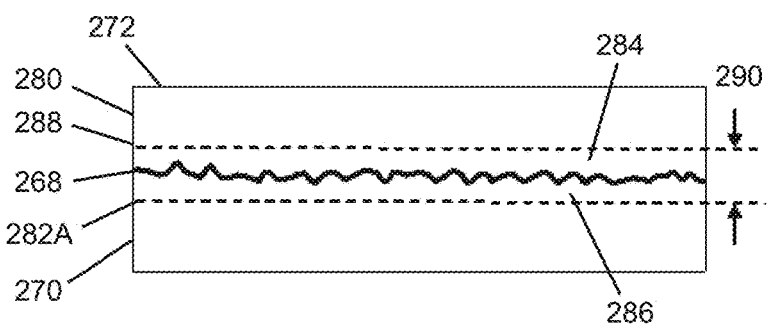
FIG. 39 is a cross-sectional schematic view of a portion of the crystalline material substrate of FIG. 38 showing subsurface laser damage with superimposed dashed lines identifying an anticipated kerf loss material region attributable to laser damage and subsequent surface processing (e.g., grinding and planarization).

FIG. 39 is a cross-sectional schematic view of a portion of the crystalline material substrate (e.g., SiC ingot) 270 of FIG. 38 showing subsurface laser damage 268 with superimposed dashed lines identifying an anticipated kerf loss material region 290. The anticipated kerf loss material region 290 includes laser damage 268, plus material 284 to be mechanically removed (e.g., by grinding and polishing) from a lower face 288 (e.g., Si-terminated face) of the crystalline material portion 280 (e.g., SiC wafer) to be separated from the substrate 270, plus material 286 to be mechanically removed (e.g., by grinding and polishing) from an upper face 282A (e.g., C-terminated) face of the remainder 270A of the substrate 270. The lower face 288 of the crystalline material portion 280 opposes an upper face 272 thereof. In certain embodiments, the entire kerf loss material region may have a thickness in a range of from 80-120 microns for SiC to provide a substrate upper face 282A and a wafer lower face 288 sufficient for further processing.

Material Processing with Multiple Grinding Stations/Steps

In certain embodiments, crystalline material subjected to laser processing and fracturing may be further processed with multiple surface grinding steps to remove subsurface damage and edge grinding to impart a beveled or rounded edge profile, wherein an order of grinding steps is selected and/or a protective surface coating is employed to reduce the likelihood of imparting additional surface damage and to render a crystalline material wafer ready for chemical mechanical planarization. Such steps may be performed, for example, using material processing apparatuses according to embodiments disclosed herein, wherein an exemplary apparatus includes a laser processing station, a fracturing station, multiple coarse grinding stations arranged in parallel downstream of the fracturing station, and at least one fine grinding station arranged downstream of the coarse grinding stations. When processing wafers cut by wire sawing, it is commonplace to perform edge grinding prior to surface grinding or polishing to remove wire-sawing surface damage. However, it has been found by the inventors that edge grinding of substrate portions (e.g., wafers) having laser damage in combination with fracture damage, increases the likelihood of cracking a substrate portion. While not wishing to be bound by any specific theory as to the reason for this phenomenon, it is believed that exposed cleave planes resulting from surface fracturing renders the surfaces susceptible to cracking if edge grinding is performed prior to at least some surface processing (grinding and/or polishing). For this reason, it has been found to be beneficial to perform at least some surface processing (e.g., grinding and/or polishing) prior to edge grinding.

It has been found that coarse grinding steps (i.e., to remove laser damage and fracture damage along fractured surfaces of a substrate portion and a bulk substrate) tend to require significantly longer to complete than the preceding steps of laser processing and fracturing, and significantly longer than subsequent steps of fine grinding. For that reason, multiple coarse grinding stations are provided in parallel to remove a bottleneck in fabrication of multiple wafers from a bulk crystalline material (e.g., an ingot). In certain embodiments, robotic handlers may be arranged upstream and downstream of the multiple coarse grinding stations to control loading and unloading of substrate portions. In certain embodiments, a carrier bonding station may be provided between a laser processing station and a fracturing station, and a carrier removal station may be provided upstream (either directly or indirectly) of an edge grinding station. A carrier may desirably remain bonded to a substrate portion during at least some surface grinding steps to reduce the potential for breakage, particularly for thin substrate portions (e.g., wafers); however, the carrier is preferably removed prior to edge grinding (or prior to coating wafer with a protective coating preceding edge grinding).

In certain embodiments, a carrier bonding station may use carriers pre-coated with temporary bonding media, align and press the carrier to a substrate surface, and subject the bonding media with the necessary conditions (e.g., heat and pressure) to effectuate bonding between the carrier and the substrate. Alternatively, a carrier bonding station may include a coating station that may be used to coat the carriers or substrates on demand.

Figure 40:
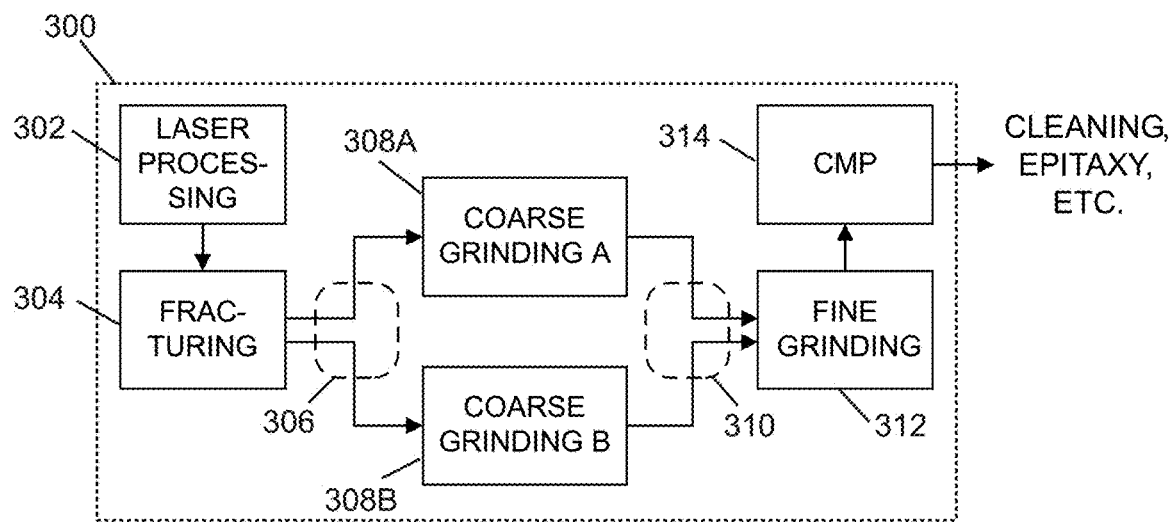
FIG. 40 is a schematic illustration of a material processing apparatus according to one embodiment, including a laser processing station, a material fracturing station, multiple coarse grinding stations arranged in parallel, a fine grinding station, and a CMP station.

FIG. 40 is a schematic illustration of a material processing apparatus 300 according to one embodiment, including a laser processing station 302, a carrier bonding station 303, a material fracturing station 304, multiple coarse grinding stations 308A, 308B arranged in parallel, a fine grinding station 312, a carrier removal station 313, and a CMP station 314. The laser processing station 302 includes at least one laser, and a holder for at least one substrate arranged to receive at least one laser beam for formation of subsurface laser damage in a crystalline material (e.g., an ingot). The carrier bonding station 303 is configured to bond the crystalline material (having subsurface laser damage therein) to at least one rigid carrier. The fracturing station 304 is arranged to receive one or more assemblies (each including a substrate bonded to a rigid carrier) from the carrier bonding station 303, and to fracture the at least one substrate along a subsurface laser damage region to remove a substrate portion (which may resemble a wafer bonded to a carrier). First and second coarse grinding stations 308A, 308B are arranged in parallel downstream of the fracturing station 304, with a first robotic handler 306 provided to alternately deliver substrate portions (as part of bonded assemblies) received from the fracturing station 304 to either the first coarse grinding station 308A or the second coarse grinding station 3048B. Downstream of the first and second coarse grinding stations 308A, 308B, a second robotic handler 310 is provide to deliver coarse ground substrate portions (as part of bonded assemblies) to a fine grinding station 312. A carrier removal station 313 is provided downstream of the fine grinding station 312, and serves to separate ground substrate portions from carriers. A chemical mechanical planarization (CMP) station 314 is arranged downstream of the carrier removal station 313 to prepare substrate portions for further processing, such as cleaning and epitaxial growth. The CMP station 314 functions to remove damage remaining after fine grinding, which itself removes damage remaining after coarse grinding. In certain embodiments, each coarse grinding station 308A, 308B comprises at least one grinding wheel having a grinding surface of less than 5000 grit, and the fine grinding station 312 comprises at least one grinding wheel having a grinding surface of at least 5000 grit. In certain embodiments, each coarse grinding station 308A, 308B is configured to remove a thickness of 20 microns to 100 microns of crystalline material from a crystalline material portion (e.g., wafer), and the fine grinding station 312 is configured to remove a thickness of 3 to 15 microns of crystalline material. In certain embodiments, each coarse grinding station 308A, 308B and/or fine grinding station 312 may include multiple grinding substations, in which different substations comprise grinding wheels of different grits.

An apparatus according to that of FIG. 40 may be modified to accommodate edge grinding to impart a rounded or beveled edge profile of a crystalline substrate portion, such as a wafer. Such an edge profile will reduce the risk of breakage of a wafer edge. The edge grinding may not be performed when a substrate portion is bonded to a carrier; accordingly, a carrier removal station may be arranged upstream (either directly or indirectly) of an edge grinding station.

Figure 41:
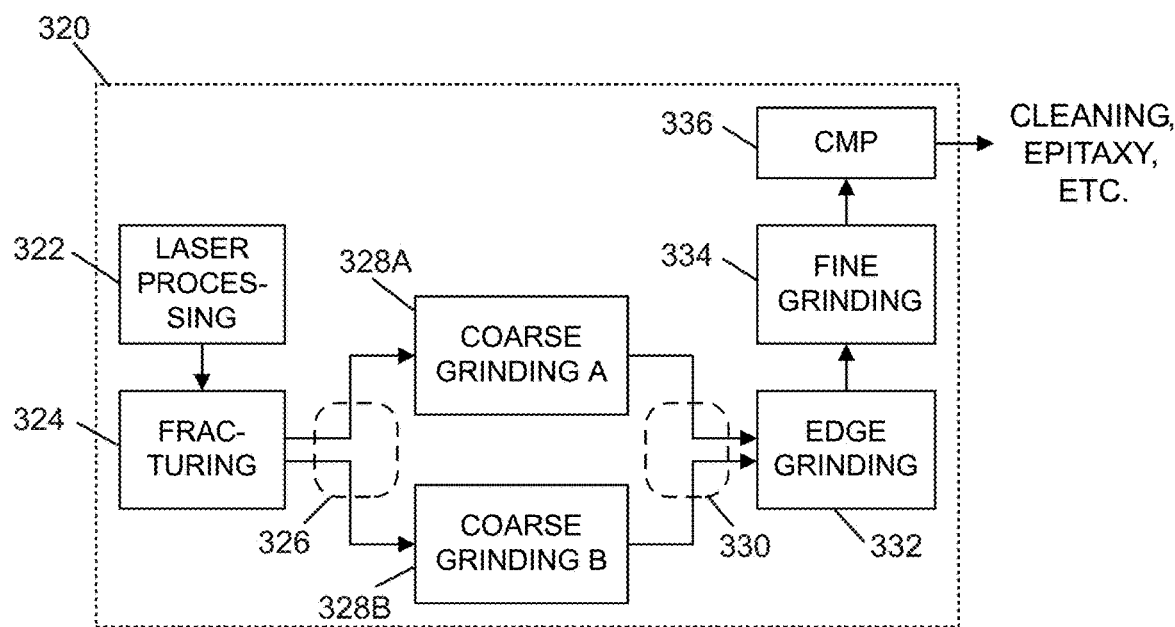
FIG. 41 is a schematic illustration of a material processing apparatus according to one embodiment similar to that of FIG. 40, but with an edge grinding station arranged between the fine grinding station and the coarse grinding stations.

FIG. 41 illustrates a material processing apparatus 320 according to one embodiment similar to that of FIG. 40, but incorporating an edge grinding station 332. The material processing apparatus 320 includes a laser processing station 322, a carrier bonding station 323, a material fracturing station 324, a first robotic handler 326, multiple coarse grinding stations 328A, 328B arranged in parallel, a second robotic handler 328, a carrier removal station 331, an edge grinding station 332, a fine grinding station 334, and a CMP station 336. An exemplary edge grinding station 332 may be arranged to grip a wafer between upper and lower gripping portions of a turntable arranged proximate to a rotary grinding tool having a concave during surface (e.g., such as illustrated in FIG. 37G). Gripping of a wafer in this manner may undesirably impart damage to a wafer surface (e.g., a Si-terminated surface of a SiC wafer). For this reason, the edge grinding station 332 shown in FIG. 41 is arranged upstream of the fine grinding station 334, to permit any surface damage imparted by the edge grinding station 332 to be removed in the fine grinding station 334. Although the fine grinding station 334 may remove a small degree of thickness of a wafer, thereby altering a rounded or beveled edge profile produced by the edge grinding station 332, a sufficient degree of a rounded or beveled edge profile will remain to inhibit fracture of a wafer edge.

The apparatus 320 according to FIG. 41 may be used to perform a method for processing a crystalline material wafer comprising a first surface having surface damage thereon, with the first surface being bounded by an edge. The method comprises grinding the first surface with at least one first grinding apparatus to remove a first part of the surface damage; following the grinding of the first surface with the at least one first grinding apparatus, edge grinding the edge to form a beveled or rounded edge profile; and following the edge grinding, grinding the first surface with at least one second grinding apparatus to remove a second part of the surface damage sufficient to render the first surface suitable for further processing by chemical mechanical planarization. In certain embodiments, the first grinding apparatus may be embodied in the coarse grinding stations 328A, 328B, the edge grinding may be performed by the edge grinding station 332, and the second grinding apparatus may be embodied in the find grinding station 312. In certain embodiments, a carrier removal step may be performed following the grinding of the first surface with the at least one first grinding apparatus, and prior to edge grinding the edge to form the beveled or rounded edge profile.

In certain embodiments, a protective surface coating may be employed to reduce the likelihood of imparting additional surface damage during edge grinding and to render a crystalline material wafer ready for chemical mechanical planarization. Such a surface coating may include photoresist or any other suitable coating material, may be applied prior to edge grinding, and may be removed after edge grinding.

FIG. 42 is a schematic illustration of a material processing apparatus 340 according to one embodiment similar to that of FIG. 40, but incorporating a surface coating station 354 between a fine grinding station 352 and an edge grinding station 356, and incorporating a coating removal station 358 between the edge grinding station 356 and a CMP station 360. The material processing apparatus 340 further includes a laser processing station 342, a material fracturing station 344, a first robotic handler 346, multiple coarse grinding stations 348A, 348B arranged in parallel, and a second robotic handler 348 upstream of the fine grinding station 352. The coating station 354 may be configured to apply a protective coating (e.g., photoresist) by a method such as spin coating, dip coating, spray coating, or the like. The protective coating should be of sufficient thickness and robustness to absorb any damage that may be imparted by the edge grinding station 365. For a SiC wafer, the Si-terminated surface may be coated with the protective coating, since the Si-terminated surface is typically the surface on which epitaxial growth is performed. The coating removal station 358 may be configured to strip the coating by chemical, thermal, and/or mechanical means.

The apparatus 340 according to FIG. 42 may be used to perform a method for processing a crystalline material wafer comprising a first surface having surface damage thereon, with the first surface being bounded by an edge. The method comprises grinding the first surface with at least one first grinding apparatus (e.g., the coarse grinding stations 348A, 348B) to remove a first part of the surface damage; thereafter grinding the first surface with at least one second grinding apparatus (e.g., the fine grinding station 352) to remove a second part of the surface damage sufficient to render the first surface suitable for further processing by chemical mechanical planarization; thereafter forming a protective coating on the first surface (e.g., using the surface coating station 354); thereafter edge grinding the edge to form a beveled or rounded edge profile (e.g., using the edge grinding station 356); and thereafter removing the protective coating from the first surface (e.g., using the coating removal station). The first surface may thereafter be processed by chemical mechanical planarization (e.g., by the CMP station 360), thereby rendering the first surface (e.g., a Si terminated surface of the wafer) ready for subsequent processing, such as surface cleaning and epitaxial growth.

In certain embodiments, a gripping apparatus may be configured for holding an ingot having end faces that are non-perpendicular to a sidewall thereof to permit an end face to be processed with a laser for formation of subsurface damage. In certain embodiments, gripping effectors may conform to a sloped sidewall having a round cross-section when viewed from above. In certain embodiments, gripping effectors may include joints to permit gripping effectors to conform to the sloped sidewall.

FIG. 43A is a schematic side cross-sectional view of a first gripping apparatus 362 for holding an ingot 364 having end faces 366, 368 that are non-perpendicular to a sidewall 370 thereof, according to one embodiment. The upper end face 366 is horizontally arranged to receive a laser beam 376. The lower end face 368 may have a carrier 372 attached thereto, with a chuck 374 (e.g., a vacuum chuck) retaining the carrier 372. Gripping effectors 378 having non-vertical faces are provided to grip sidewalls 370 of the ingot 364, wherein the gripping effectors 378 are arranged at non-perpendicular angles A1, A2 relative to horizontal actuating rods 380. Holding the ingot 364 as shown (e.g., proximate to a bottom portion thereof) using the gripping apparatus 362 leaves the upper end face 366 and upper portions of the sidewall 370 available for processing using methods disclosed herein.

FIG. 43B is a schematic side cross-sectional view of a second gripping apparatus 362' for holding an ingot 364' having end faces 366', 368' that are non-perpendicular to a sidewall 370' thereof, according to one embodiment. The upper end face 366' is horizontally arranged to receive a laser beam 376, whereas the lower end face 368' may have a carrier 372' attached thereto, with the carrier 372' retained by a chuck 374'. Gripping effectors 378' having non-vertical faces are provided to grip sidewalls 370' of the ingot 364', wherein the gripping effectors 378' are arranged at non-perpendicular angles A1, A2 relative to horizontal actuating rods 380'. Pivotable joints 382' are provided between the actuating rods 380' and the gripping effectors 378', thereby facilitating automatic alignment between the gripping effectors 378' and sidewalls 370' of the ingot 364'.

In one example, a 150 mm diameter single crystal SiC substrate (ingot) having a thickness of more than 10 mm is used as a starting material for production of a SiC wafer having a thickness of 355 microns. Laser emissions are impinged through a C-terminated upper face of the SiC substrate to form subsurface laser damage. A sapphire carrier is bonded to the upper face of the SiC substrate using a thermoplastic adhesive material disclosed herein, and thermal-induced fracture is performed to separate an upper (wafer) portion of SiC from a remainder of the ingot. Both the Si-terminated face of the separated wafer portion and the C-terminated face of the ingot remainder are coarse ground using a 2000 grit grind wheel (e.g., a metal, vitreous, or resin bond-type grinding wheel) to removal all visible laser and fracture damage. Thereafter, both the Si-terminated face of the separated wafer portion and the C-terminated face of the ingot remainder are fine ground (e.g., using a vitreous grinding surface) with a 7000 or higher grit (e.g., up to 30,000 grit or higher) to yield smoother surfaces, preferably less than 4 nm average roughness (Ra), more preferably in a range of 1-2 nm Ra. On the ingot remainder, a smooth surface is required to avoid any impact on the subsequent laser processing. The wafer is to be CMP ready and of sufficient smoothness to minimize required CMP removal amounts, since CMP is typically a higher cost process. Typical material removal during fine grind processing may be in a thickness range of 5 to 10 microns to remove all residual subsurface damage from the coarse grind and any remaining laser damage (both visible and non-visible to the naked eye). Thereafter, the ingot remainder is returned to a laser for further processing, and the wafer is edge ground and subjected to chemical mechanical planarization (CMP) to be ready for epitaxial growth. Edge grinding may be performed between coarse and fine surface grinding to avoid any risk of scratching the fine ground Si face. Material removal during CMP may be in a thickness range of about 2 microns. Total material consumed from the substrate (ingot) may be less than 475 microns. Given the 355 micron final wafer thickness, the kerf loss is less than 120 microns.

Variability in Wafer-to-Wafer Thickness Influenced by Laser Power and Crystal Variation As noted previously herein, progressively higher laser power levels may be necessary for formation of laser damage sufficient to part crystalline material by fracturing, starting at a position distal from the seed crystal and obtaining wafers at cross-sectional positions progressively approaching the seed crystal. Use of high laser power at each sequential depth position when forming subsurface damage would entail unnecessary material loss, and would also significantly increase wafer-to-wafer thickness spread due to variability in both the damage depth and the point at which decomposition is reached relative to a laser beam waist. Such concept may be understood with reference to FIGS. 44 and 45.

Figure 44:
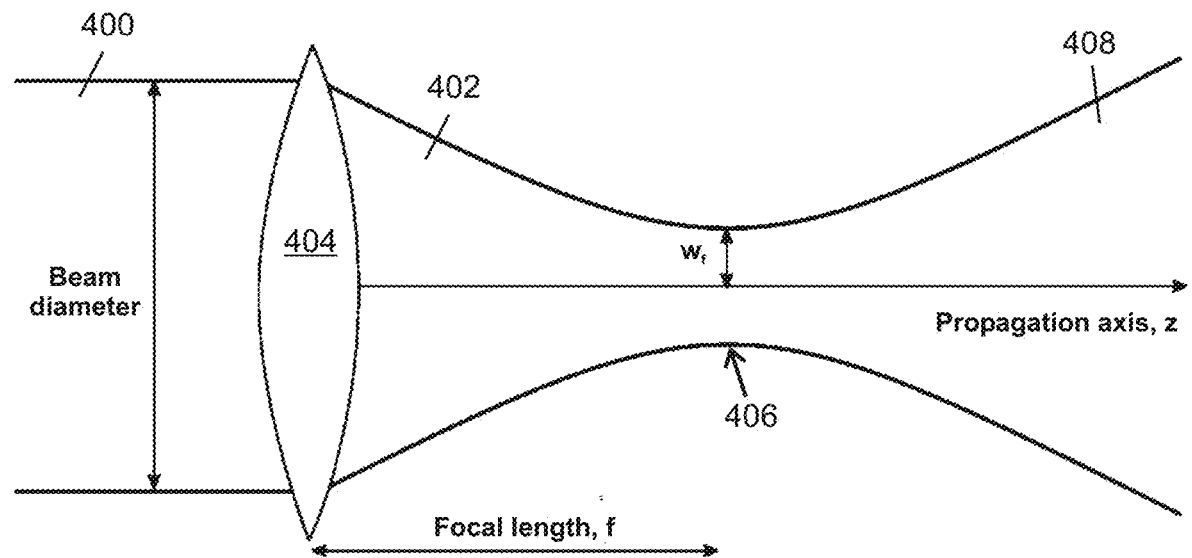
FIG. 44 is a schematic side cross-sectional view of a conventional laser focusing apparatus that focuses an incoming horizontal beam with a lens, forming an outgoing beam having a beam waist pattern having a minimum width at a downstream position corresponding to a focal length of the lens.
Figure 45:
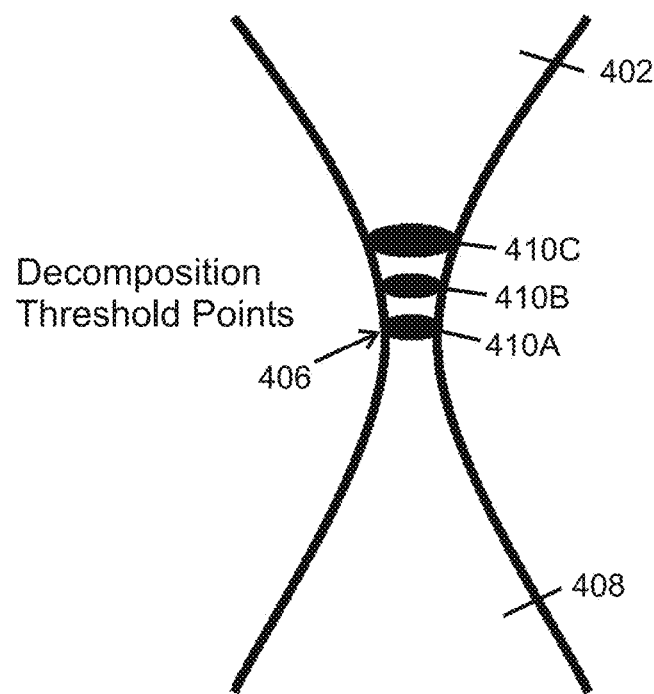
FIG. 45 is a schematic side cross-sectional view of a vertically oriented focused laser beam exhibiting a beam waist within a crystalline material, with illustration of decomposition threshold points at different vertical positions relative to the beam waist.

FIG. 44 is a schematic side cross-sectional view of a conventional laser focusing apparatus that focuses an incoming horizontal beam 400 in a propagation direction with a lens 404, forming an outgoing beam 402 having a beam waist pattern having a minimum width Wf at a position 406 corresponding to a focal length f of the lens 404. Downstream of this position 406, the beam width broadens to a wider region 408. FIG. 45 is a schematic side cross-sectional view of a vertically oriented focused laser beam 402 that may be directed into a crystalline material and exhibits a beam waist pattern (with a minimum width at a position 406 corresponding to a focal length of a lens (not shown)), with the beam width broadening thereafter to a wider region 408. When the focused laser beam 402 is directed within a crystalline material (e.g., a substrate such as a SiC ingot), the crystalline material will thermally decompose at different threshold points (i.e., depths) depending on factors such as laser power, degree of absorption of radiation by the crystalline material (which may be influenced by presence or absence of dopants and/or crystal defects that may vary with depth (and width) position within the substrate), and degree of focusing which is dependent on vertical position. Three different decomposition threshold points 410A-410C are shown in FIG. 45.

Methods and apparatuses disclosed herein permit the foregoing issues to be addressed by imaging a top surface of a crystalline material substrate having subsurface laser damage to detect uncracked regions within the substrate, analyzing one or more images to identify a condition indicative of presence of uncracked regions within the substrate, and taking one or more actions responsive to the analyzing (e.g., upon attainment of appropriate conditions). Such actions may include performing an additional laser pass at the same depth position and/or changing an instruction set for producing subsurface laser damage at subsequent depth positions). Such methods and apparatuses facilitate production of substrate portions of uniform thickness without unnecessary material loss.

Figure 46A:
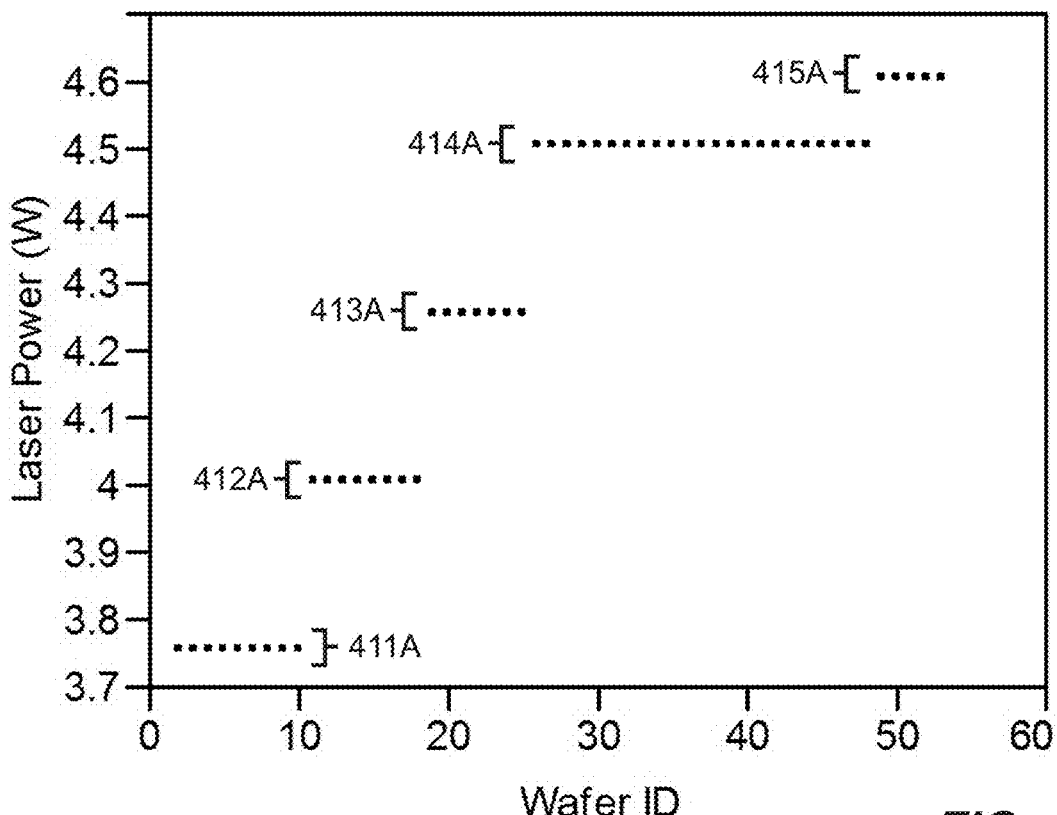
FIGS. 46A-46C provide plots of laser power versus sequential wafer identification for wafers derived from three SiC ingots, respectively, showing an increase in laser power with wafer identification number.
Figure 46B:
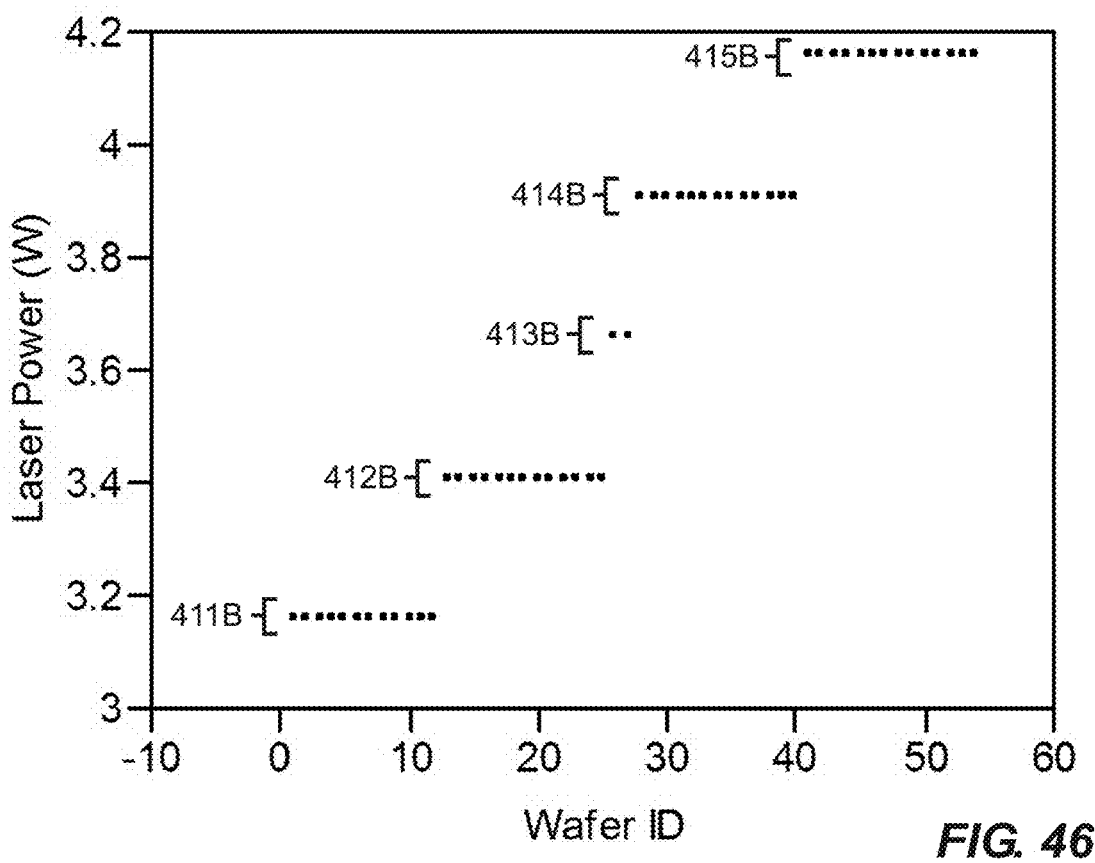
Figure 46C:
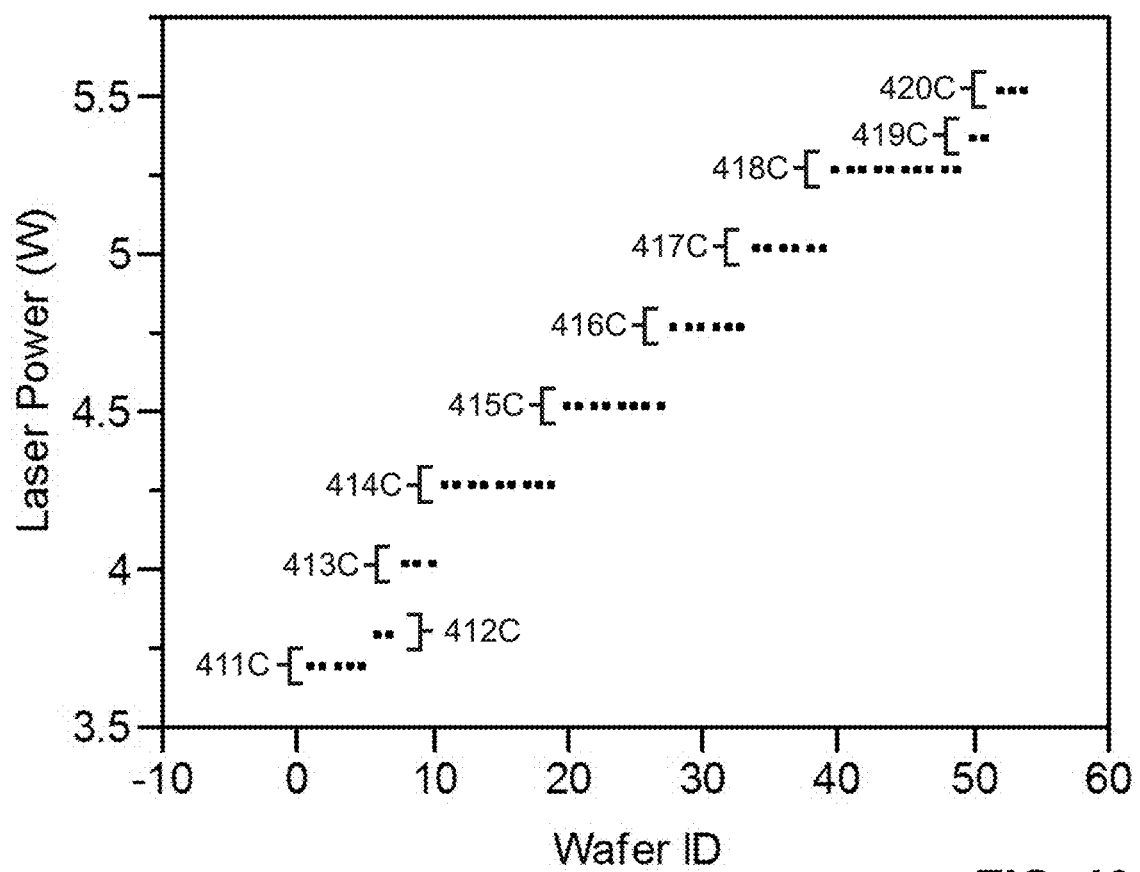

FIGS. 46A-46C provide plots of laser power versus sequential wafer identification for wafers (i.e., sequential wafer identification (ID) numbers from 1 to 55) derived from three SiC ingots, respectively, wherein proximity to the seed crystal increases with increasing wafer ID number in each instance (i.e., with slice 1 being farthest from the seed crystal). FIG. 46A shows results for a first SiC ingot, in which a first wafer group 411A was fractured after formation of subsurface laser damage at a laser power level of about 3.75 W, a second wafer group 412A was fractured after formation of subsurface laser damage at a laser power level of about 4 W, a third wafer group 413A was fractured after formation of subsurface laser damage at a laser power level of about 4.25 W, a fourth wafer group 414A was fractured after formation of subsurface laser damage at a laser power level of about 4.5 W, and a fifth wafer group 415A was fractured after formation of subsurface laser damage at a laser power level of about 4.6 W. FIG. 46B shows results for a second SiC ingot, in which a first wafer group 411B was fractured after formation of subsurface laser damage at a laser power level below 3.2 W, a second wafer group 412B was fractured after formation of subsurface laser damage at a laser power level of about 3.4 W, and third through fifth wafer groups 413B-415B were fractured after formation of subsurface laser damage at higher laser power levels each about 0.25 W greater than the last. FIG. 46C shows that ten different laser power levels were required to successfully form fifty-five wafers sequentially parted (by formation of subsurface laser damage followed by fracturing) from a single SiC ingot, according to wafer groups 411C-420C at laser power levels ranging from about 4 W to about 5.5 W among the different wafer groups 411C-420C. FIGS. 46A-46C therefore show significant variation in laser power requirements from ingot to ingot, as well as within each ingot, to form multiple wafers of substantially the same thickness by laser-assisted parting.

Figure 47:
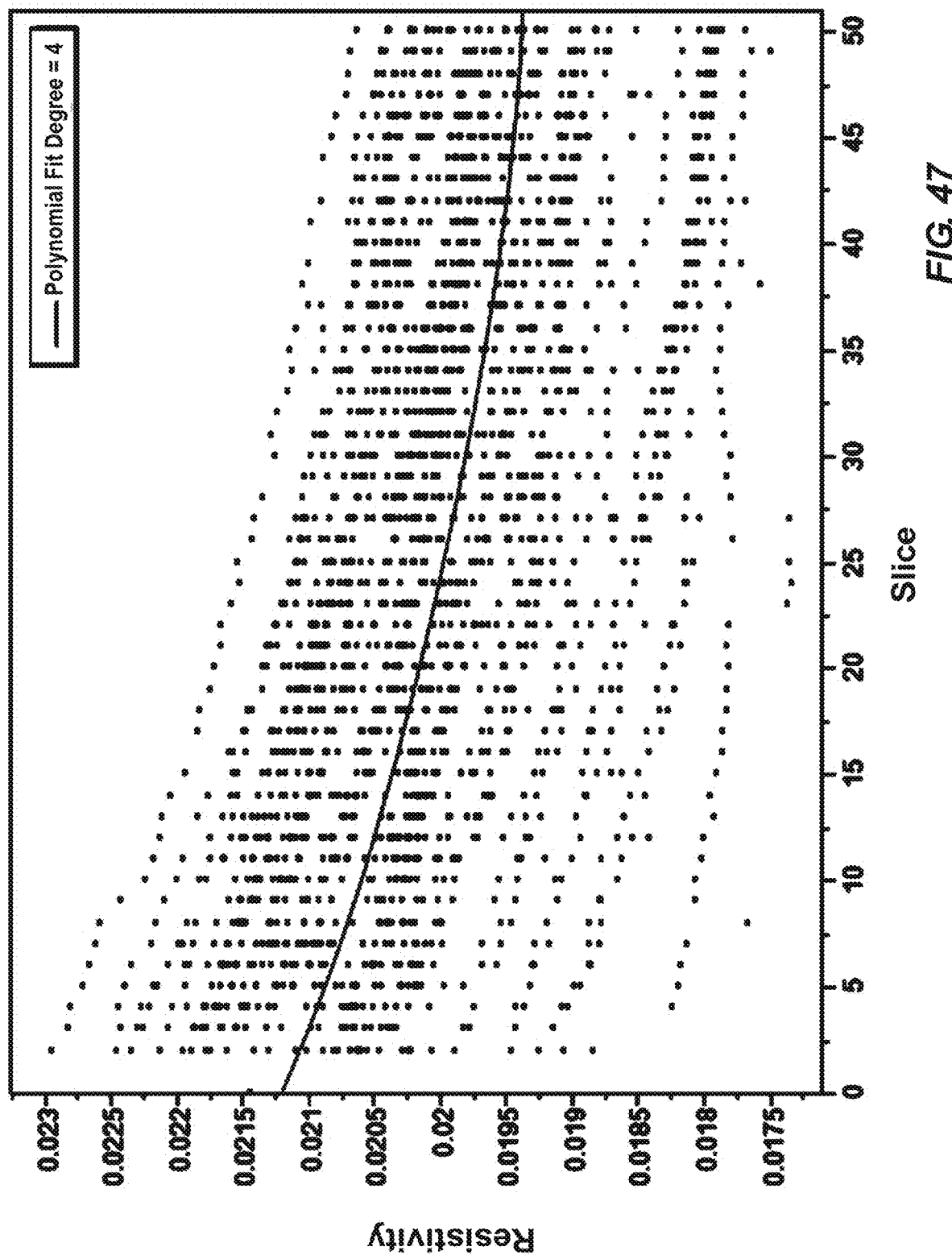
FIG. 47 is a plot of resistivity (Ohm-cm) versus slice number for fifty wafers produced from a SiC ingot with a superimposed polynomial fit showing resistivity decreasing with slice number, wherein an increasing slice number represents increasing proximity to a seed crystal on which the ingot was grown (e.g., via a physical vapor transport (PVT) process).

FIG. 47 is a plot of resistivity (Ohm-cm) versus slice number for fifty wafers per ingot produced from about fifty (50) SiC ingots, with a superimposed polynomial fit showing resistivity decreasing with slice number. In each instance, an increasing slice number represents increasing proximity to a seed crystal on which the ingot was epitaxially grown, with slice 1 representing the top of the ingot farthest from the seed crystal. Although resistivity ranges vary significantly from ingot to ingot, resistivity consistently decreases throughout each ingot with increasing proximity to the seed crystal. The resistivity value range of the y-axis of FIG. 47 is consistent with N-type SiC. A reduction in resistivity corresponds to an increase in doping and an increase in laser absorption.

Figure 48:
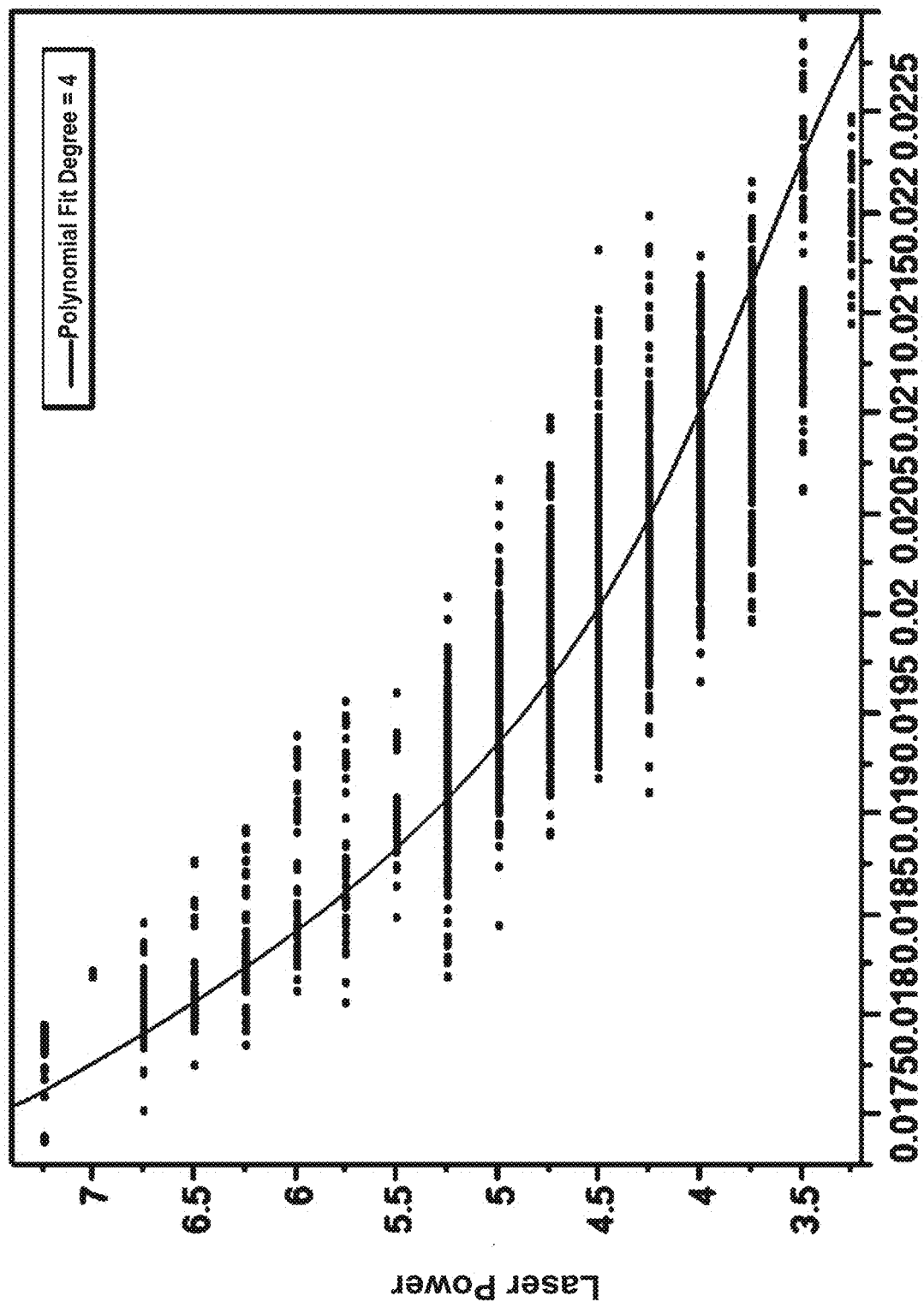
FIG. 48 is a plot of laser power (Watts) versus resistivity for the wafers produced from the SiC ingot of FIG. 47, with a superimposed polynomial fit showing a decrease in laser power required to achieve with increasing resistivity values.

FIG. 48 is a plot of laser power (Watts) versus resistivity for wafers produced from about fifty (50) SiC ingots, with a superimposed polynomial fit, with the laser power representing a value need to achieve successful laser-assisted parting (with fracturing following subsurface laser damage formation) by a method described herein. FIG. 48 shows that, although laser power requirements vary significantly from ingot to ingot, laser power levels necessary to achieve successful parting decrease with increasing resistivity levels of the ingot.

Apparatus Including Diffuse Light Source and Imaging Device

In certain embodiments, a material processing apparatus includes a laser processing station configured to process a substrate of crystalline material to form subsurface laser damage therein, with the laser processing station including illumination and imaging devices configured to permit detection of conditions indicative of presence of uncracked regions in the interior of the crystalline material. Using uncracked regions as a visible indicator to determine when additional laser substrate damage is necessary at a first average depth position (for formation of a first reduced thickness portion of a substrate, such as a first wafer derived from an ingot) and/or when additional laser power is necessary for formation of laser damage at subsequent average depth positions (for formation of a subsequent reduced thickness portions of a substrate, such as subsequent wafers derived from an ingot), a stable and repeatable laser parting process can be provided in terms of wafer thickness distribution while avoiding unnecessary kerf losses. The term "average depth position" is used in this context since slight variation in laser focus depth positions (e.g., typically 10 microns or less) may be used between subsurface laser damage formation passes for forming the same reduced thickness portion of the substrate and/or within a single laser damage formation pass (e.g., to address the presence of an increased doping region such as a doping ring).

Preferably, the illumination and imaging devices are positioned to permit imaging of a substrate surface while the substrate is retained by a laser processing chuck. Such capability permits a substrate to be inspected (e.g., imaged and analyzed in an automated manner) to rapidly assess whether additional laser processing may be necessary prior to fracturing, without requiring the substrate to be removed and reinstalled in a laser processing chuck. This in situ inspection of a substrate while present in a laser processing station increases laser processing tool utilization by avoiding downtime, thereby enhancing laser parting process throughput. In certain embodiments, a laser may be moved away from a substrate retained by a laser processing chuck to permit imaging to be performed without the laser blocking illumination or imaging of the substrate surface.

Figure 49A:
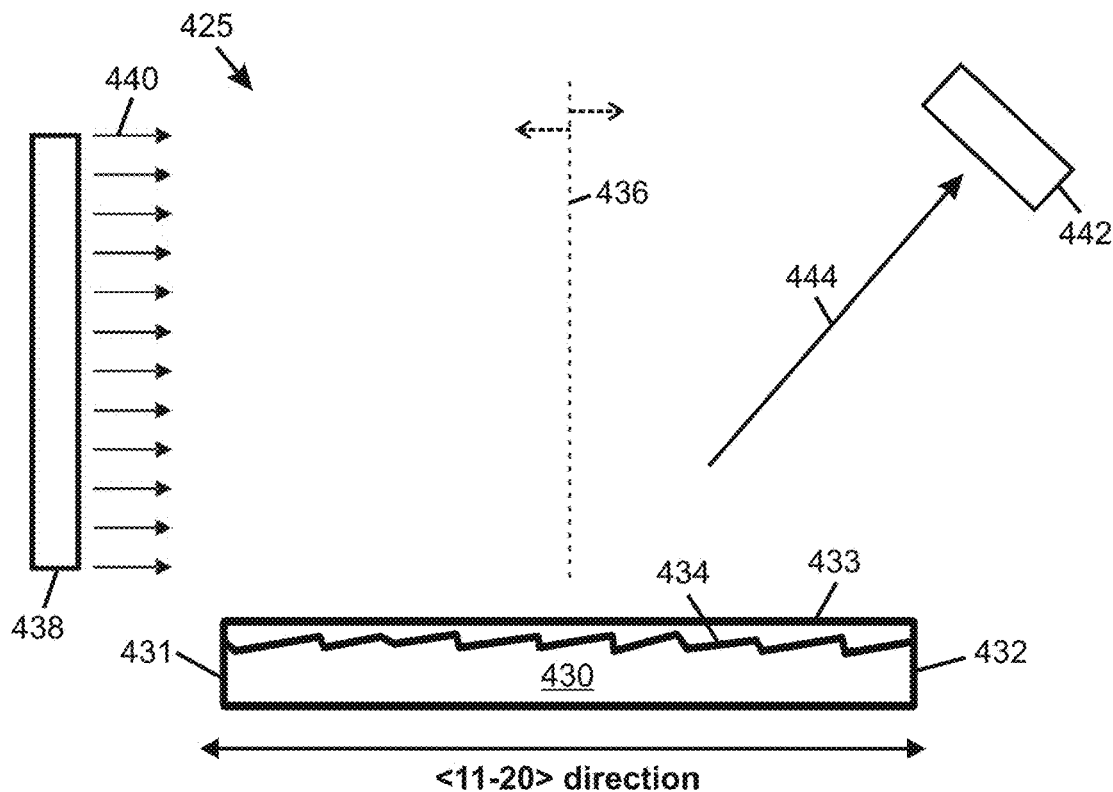
FIGS. 49A and 49B provide schematic side cross-sectional and top plan views, respectively, of a diffuse light source and an imaging device arranged proximate to a substrate within a laser processing station.
Figure 49B:
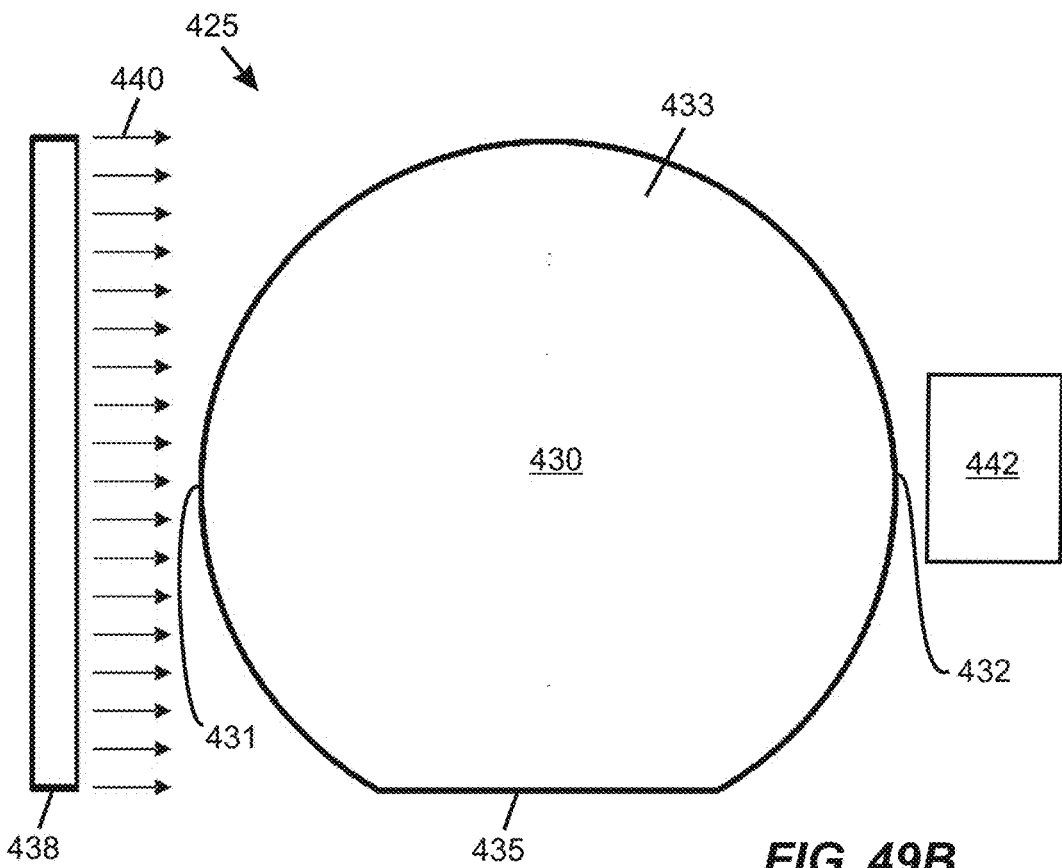

FIGS. 49A and 49B provide schematic side cross-sectional and top plan views, respectively, of a diffuse light source 438 and an imaging device 442 arranged proximate to a crystalline material substrate 430 within a laser processing station 425. Referring to FIG. 49A, the crystalline material substrate 430 includes a top surface 433 and subsurface laser damage 434 arranged within an interior of the substrate 430 below the top surface 433. The subsurface laser damage 434 may roughly resemble an irregular sawtooth pattern in a direction parallel to the <11$\bar{2}$0> direction if the substrate has a hexagonal crystal structure. The substrate 430 includes a central axis 436. The diffuse light source 438 is laterally displaced in a first direction 437A relative to the central axis 436, and the imaging device 442 is laterally displaced in an opposing, second direction 437B relative to the central axis 436. Both the diffuse light source 438 and the imaging device 442 may be upwardly displaced relative to the top surface 433 of the substrate 430. Additionally, the diffuse light source 438 may be arranged to a first lateral side 431 of the substrate 430, and the imaging device 442 may be arranged to an opposing, second lateral side 432 of the substrate 430. In certain embodiment, an angle definable between a light emitting surface of the diffuse light source 438 and a light receiving surface of the imaging device 442 (optionally representable as an angle between beams 440 exiting the diffuse light source 438 and an incident light beam 444 received by the imaging device 442) may be in a range between about 100 degrees and about 170 degrees. In certain embodiments, the diffuse light source 438 may include any suitable one or more light emitting devices (e.g., light emitting diodes), with a diffuser arranged between the light emitting device(s) and light beams 440 exiting the diffuse light source 438. In certain embodiments, the imaging device 442 may include one or more charge-coupled device (CCD) or complementary metal-oxide semiconductor (CMOS) image sensors, optionally arranged in an array.

FIG. 49B provides a top plan view of the same elements as depicted in FIG. 49A. The substrate 430 may include a primary flat 435 (shown in FIG. 49B) that is substantially parallel to the <11-20> direction (shown in FIG. 49A). The inventors have found orientation of the diffuse light source 438 and the imaging device 442 relative to the substrate 430 to be important to aid in imaging of subsurface laser damage. In certain embodiments, the light source may be positioned substantially perpendicular to the primary flat 435 of the substrate 430 and/or within ±5 degrees of perpendicular to a <11$\bar{2}$0> direction of a hexagonal crystal structure of the substrate 430, to enhance visibility of uncracked regions through the top surface 433 of the substrate 430.

Figure 50A:
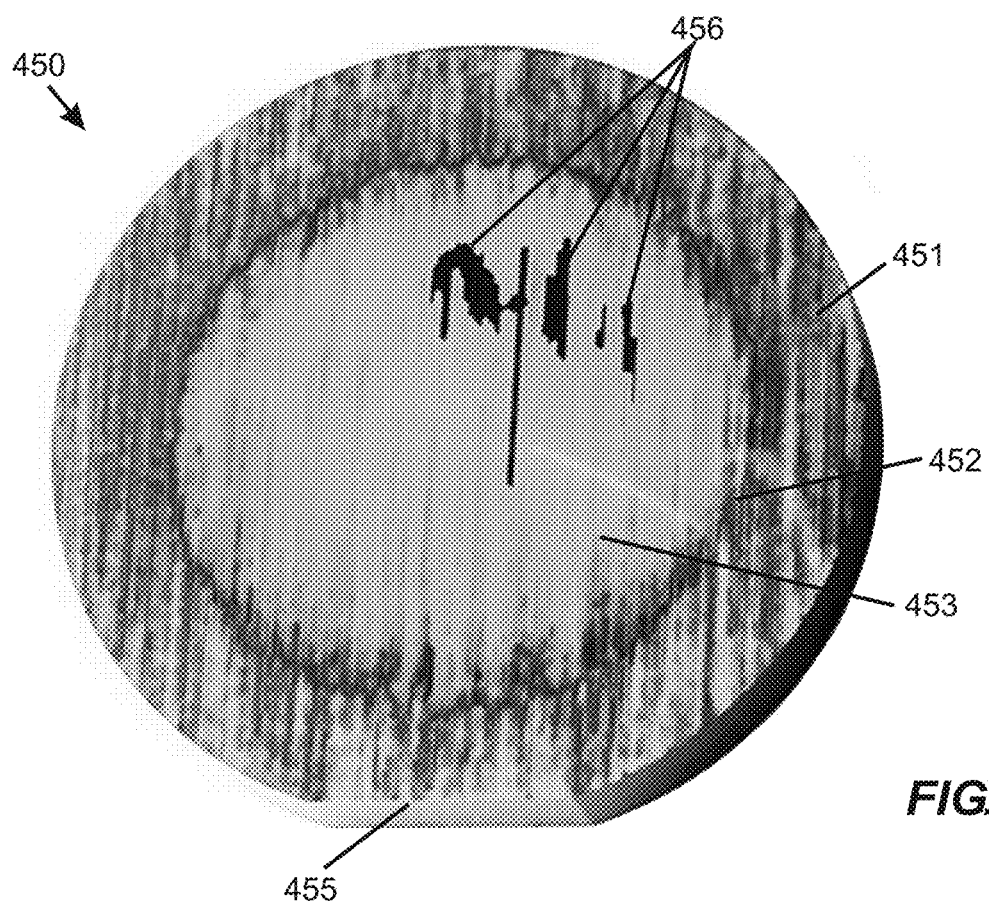
FIG. 50A is an image of a top surface of a crystalline SiC substrate having subsurface laser damage, showing regions of different colors and irregularly shaped dark regions corresponding to uncracked regions within the substrate.

FIG. 50A is an image of a top surface of a crystalline SiC substrate 450 having subsurface laser damage and imaged with an apparatus similar to that shown in FIGS. 49A-49B. The substrate 450 of FIG. 50A includes three regions 451-453 of different colors (in the original image) and irregularly shaped dark regions 456 corresponding to uncracked regions within the substrate 450. In the original image, an outermost approximately annular region 451 (including a primary flat 455) is predominantly green in color, an intermediate approximately annular region 452 is predominantly red in color, and a central approximately circular region 453 is predominantly gold in color. Within the central region 453, irregularly-shaped black regions 456 are visible. The black regions 456 correspond to presence of uncracked regions along subsurface laser damage below an upper surface of the substrate 450. The different colors (green, red, and gold) of the different regions 451-453 are believed to correspond to degree of cracking damage. In certain embodiments, a method disclosed herein comprises analyzing at least one property of the image to identify areas having different degrees of cracking damage, and adjusting one or more laser damage formation parameters (e.g., laser power, laser focusing depth, laser pulse duration, and/or number of laser damage formation passes, or the like) for formation of supplemental subsurface laser damage at the same (e.g., first) average depth position (to form a first reduced thickness portion of a substrate, such as a first wafer) and/or formation of subsequent subsurface laser damage at different (e.g., second or subsequent) average depth positions (to form second and subsequent reduced thickness portions of the substrate, such as second and subsequent wafers) to address differences in substrate properties that may vary with vertical (depth) position and/or horizontal position within the substrate.

Although FIGS. 49A-49B illustrate use of a diffuse light source 438 and an imaging device 442 arranged along opposing lateral sides of a substrate, in certain embodiments other configurations and/or types of light sources and imaging devices may be used. In certain embodiments, one or more portions (or an entirety) of a top surface of a substrate may be scanned with at least one microscope, such an optical microscope, confocal microscope, a scanning electron microscope, and/or a transmission electronic microscope, with relative translation between the substrate and the microscope(s).

Figure 50B:
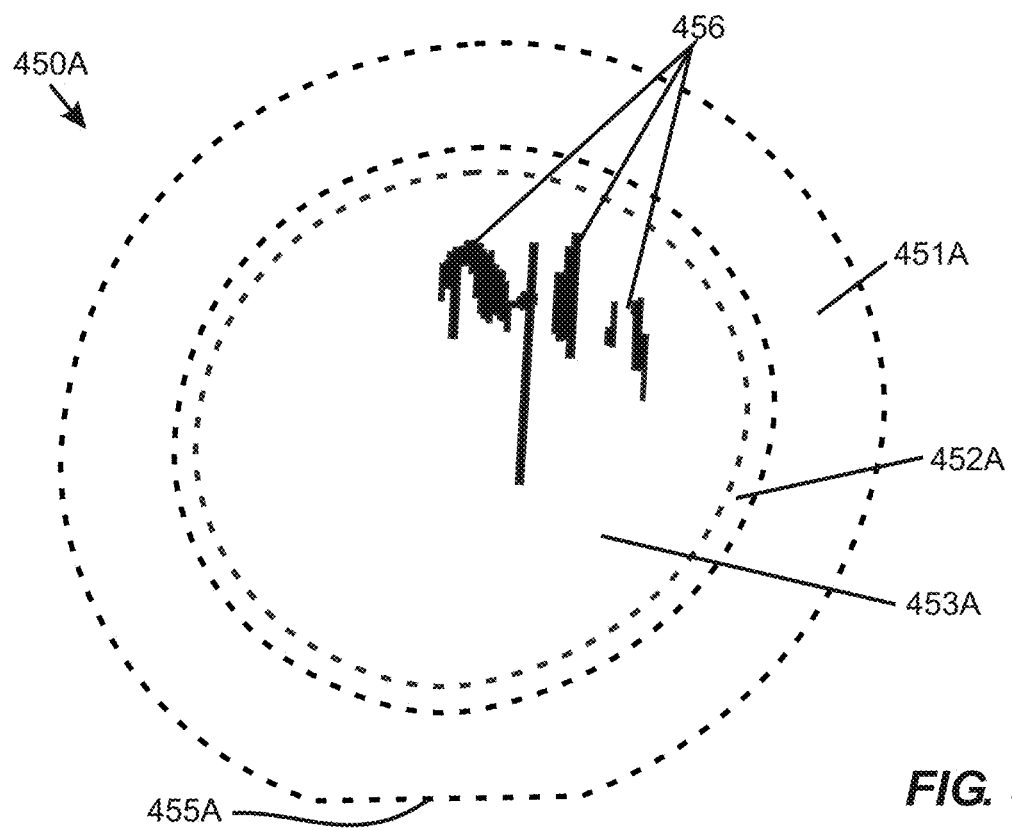
FIG. 50B is a schematic diagram of a substrate representation showing the irregularly shaped dark regions of FIG. 50A within dotted line regions substantially corresponding to boundaries between differently-colored regions of the top surface of the substrate of FIG. 50A.

FIG. 50B is a schematic diagram of a substrate representation 450A showing the irregularly shaped dark regions 456 of FIG.50A within dotted line regions 451A-453A (of which the outermost region 453A encompasses a primary flat 455A) substantially corresponding to boundaries between differently-colored regions 451-453 of the top surface of the substrate 450 of FIG. 50A. In certain embodiments, all regions except the dark regions 456 may be removed from a captured image to facilitate analysis of one or more area properties of the dark regions 456.

Figure 50C:
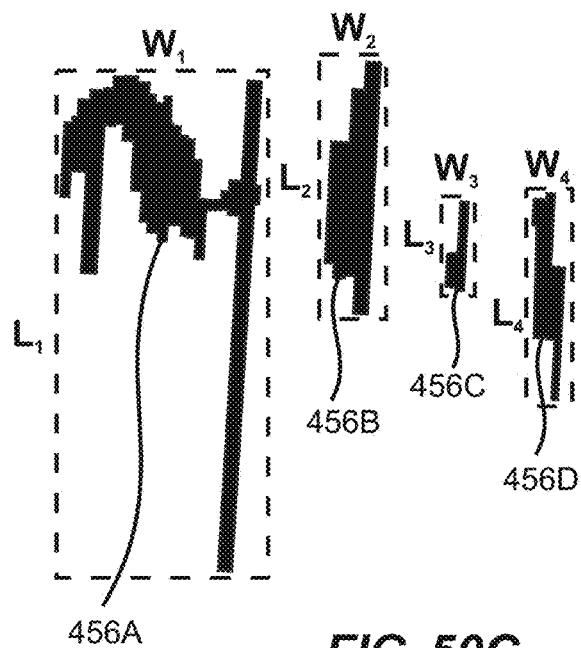
FIG. 50C is a magnified view of the irregularly shaped dark regions of FIGS. 50A-50B with addition of rectangular boxes around individual regions.

FIG. 50C is a magnified view of the irregularly shaped dark regions 456 shown in FIGS. 50A-50B, but with continuous dark regions being individually numbered 456A-456D and with addition of rectangular boxes around individual regions 456A-456D. Each dark region 456A-456D has a maximum length and maximum width, corresponding to $L_1$-$L_4$ and $W_1$-$W_4$, respectively. In certain embodiments, analysis of an image derived from the substrate includes identification of a condition indicative of presence of uncracked regions in the interior of the crystalline material (e.g., dark and/or black regions in certain embodiments), and quantification of a top area property (or at least one top area property) of one or more uncracked regions in the interior. In certain embodiments, a quantified top area property includes an aggregate top area of all uncracked regions. In certain embodiments, a quantified top area property includes separate identification of any continuous uncracked regions, together with quantification of top area of each continuous uncracked region and/or quantification of maximum length and width dimensions of the continuous uncracked regions and/or identification of length/width aspect ratio of the continuous uncracked regions. In certain embodiments, the length and width may be established relative to crystallographic direction and/or a primary flat of the substrate (e.g., with length perpendicular to the primary flat, and with width parallel to the primary flat). The inventors have found that presence of large continuous uncracked regions of a given top area may inhibit fracture more readily than presence of numerous discontinuous uncracked regions of the same aggregate top area. Additionally, the inventors have found that orientation and/or aspect ratio of continuous uncracked regions may affect fracture inhibition. Small localized black regions indicative of uncracked regions generally do not impede separation by fracturing, but as the black regions increase in size (particularly in a width direction generally parallel to the primary flat and/or generally perpendicular to laser damage lines), such regions may identify the need for adding another laser damage formation pass at the same average depth position and/or to increase laser power when forming laser damage regions at subsequent average depth positions. Uncracked regions having a large length (e.g., in a direction perpendicular to the primary flat) may be less problematic in inhibiting fracture than uncracked regions having a large width.

Figure 51:
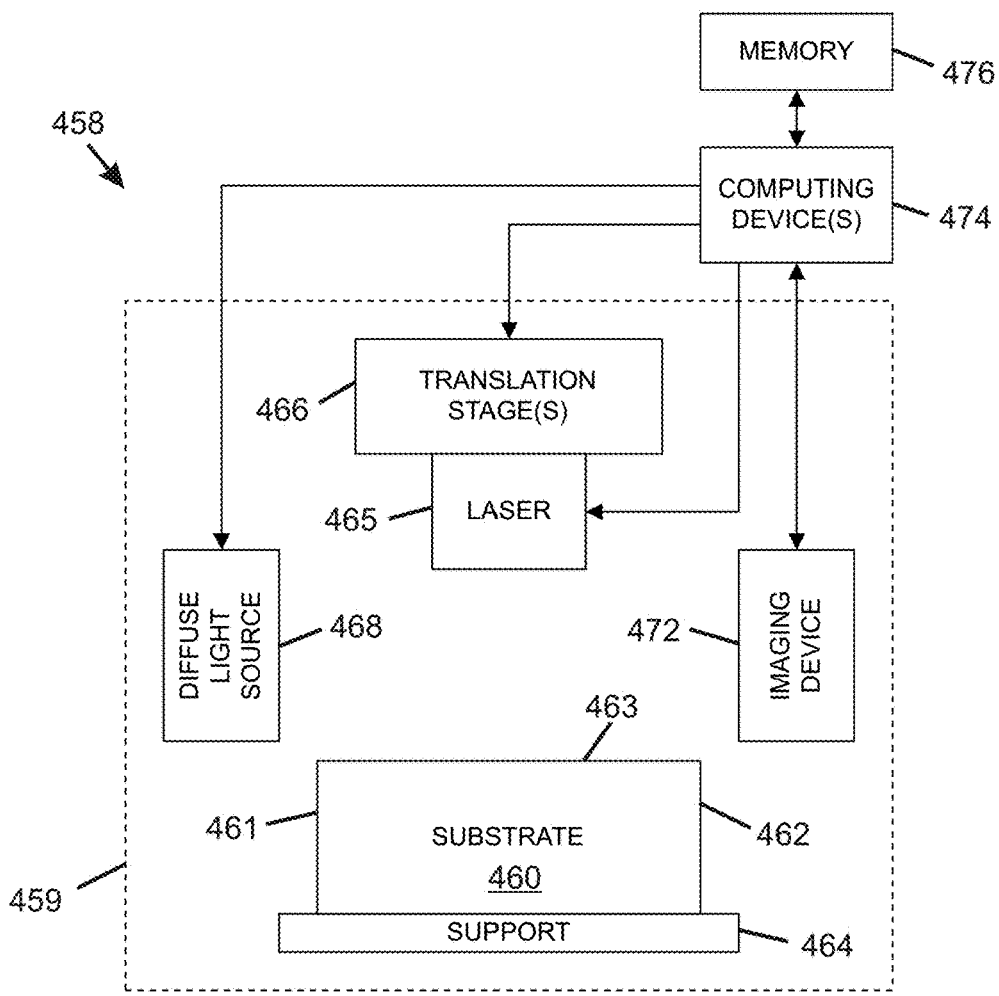
FIG. 51 is a schematic illustration of a material processing apparatus according to one embodiment, including a laser processing station that includes a laser, at least one translation stage, a diffuse light source configured to illuminate a top surface of a substrate, and an imaging device configured to generate at least one image of the top surface of the substrate.

FIG. 51 is a schematic illustration of a material processing apparatus 458 according to one embodiment, including a laser processing station 459 that includes a laser 465, at least one translation stage 466 (e.g., preferably x-y-z translation stages) configured to promote relative movement between the laser 465 and a substrate 460), a diffuse light source 468 configured to illuminate a top surface 463 of the substrate 460, and an imaging device 472 configured to generate at least one image of the top surface 463 of the substrate 460. The substrate 460 is arranged above a support 464, which may include a laser tool chuck. Various items within the material processing apparatus 458 are in electrical communication with at least one computing device 474 having an associated memory 476. The computing device 474 may control operation of the diffuse light source 468, the imaging device 472, the laser 465, and the translation stage(s) 466. The memory 476 may further store substrate-specific instruction sets (e.g., fabrication recipes) that may be used and modified on an individual substrate basis. In certain embodiments, the computing device 474 and memory 476 may be used in performing various steps of methods disclosed herein, including but not limited to analyzing substrate images to identify conditions indicative of presence of uncracked regions in the interior of substrates, quantification of one or more top area properties of uncracked regions, and comparing top area properties to one or more predetermined threshold area properties. In certain embodiments, the computing device 474 may further be used to analyze images and detect presence of differently colored regions (e.g., other than presence of black or dark spots) and adjust operation of the laser 465 to compensate for laser facet contamination responsive to such analysis. In certain embodiments, the computing device 474 may further be used to detect presence of different doping conditions in different regions of a substrate, and responsively alter laser power delivery. In certain embodiments, responsive to detection of the condition indicative of non-uniform doping of the crystalline material, laser power may be altered during formation of subsurface laser damage patterns to provide laser emissions at a first average power level when forming subsurface laser damage in a first doping region, and to provide laser emissions at a second average power level when forming subsurface laser damage in a second doping region, wherein the first and second average power levels differ from one another.

Methods Including Imaging, Comparison, and Lasering/Power Adjustment

Figure 52:
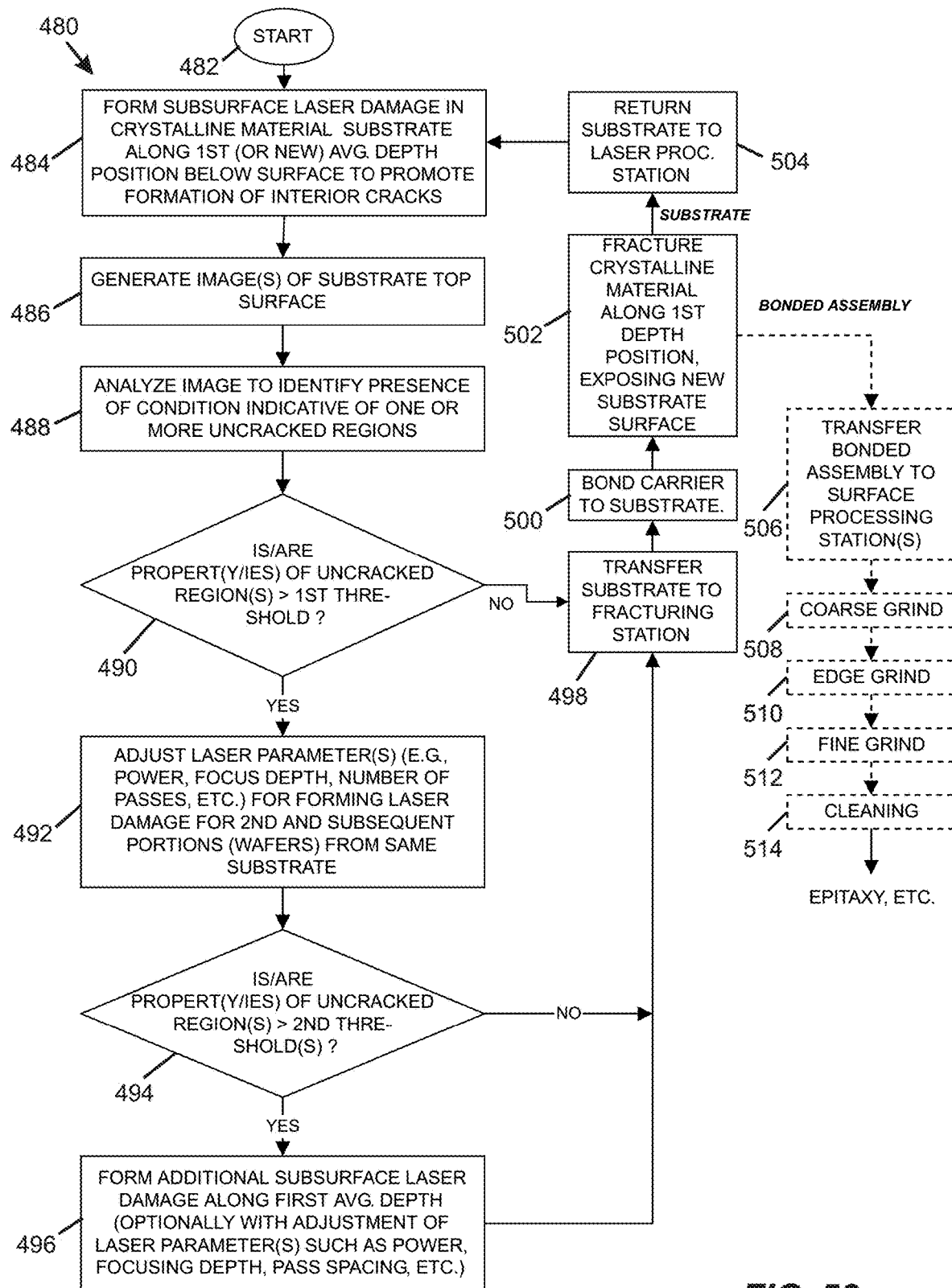
FIG. 52 is a flowchart illustrating steps in a first crystalline material processing method that includes generating an image of a top surface of a substrate having subsurface laser damage, analyzing the image to identify presence of a condition indicative of one or more uncracked regions, comparing one or more properties of the uncracked regions to first and second thresholds, and taking action (i.e., (A) performing an additional laser pass at substantially the same depth position to form supplemental laser damage, optionally with adjustment of one or more laser parameters and/or (B) adjusting one or more laser parameters for forming subsurface laser damage at second and subsequent depth positions) responsive to the comparisons to enhance reliability of producing substrate portions (e.g., wafers) from the substrate.

FIG. 52 is a flowchart 480 illustrating steps in a first crystalline material processing method that generally includes generating an image of a top surface of a substrate having subsurface laser damage, analyzing the image to identify presence of a condition indicative of one or more uncracked regions, comparing one or more properties of the uncracked regions to first and second thresholds, and taking action (i.e., (A) performing an additional laser pass at substantially the same depth position to form supplemental laser damage, optionally with adjustment of one or more laser parameters and/or (B) adjusting one or more laser parameters for forming subsurface laser damage at second and subsequent depth positions) responsive to the comparisons. The method is initiated at block 482. Proceeding to block 484, a first step includes forming subsurface laser damage in a crystalline material substrate having at least one subsurface laser damage pattern (optionally including at least one plurality of substantially parallel lines as disclosed herein) along a first (or new) depth position below a top surface of the substrate, wherein the at least one subsurface laser damage pattern is configured to promote formation of at least one plurality of cracks in the interior of the crystalline material propagating outward from the at least one subsurface laser damage pattern. Proceeding to block 486, a second step includes generating at least one image of the top surface of the substrate. In certain embodiments, the image generating step includes illuminating the top surface with a diffuse light source arranged to a first lateral side of the substrate (preferably arranged substantially perpendicular to a primary flat of the substrate and/or within ±5 degrees of perpendicular to a <11$\bar{2}$0> direction of the hexagonal crystal structure), and capturing the at least one image with an imaging device arranged to a second lateral side of the substrate that opposes the first lateral side. In certain embodiments, one or more alternative or additional imaging methods as disclosed herein may be used.

Proceeding to block 488, a further step includes analyzing the at least one image to identify a condition indicative of presence of uncracked regions in the interior of the crystalline material (e.g., dark and/or black regions in certain embodiments). Optionally, at least one top area property of one or more uncracked regions in the interior may be quantified, wherein a quantified top area property may optionally include an aggregate top area of all uncracked regions. In certain embodiments, a quantified top area property includes separate identification of any continuous uncracked regions, together with quantification of the top area of each continuous uncracked region and/or quantification of maximum length and width dimensions of the continuous uncracked regions and/or identification of length/width aspect ratio of the continuous uncracked regions. In certain embodiments, the length and width may be established relative to crystallographic direction and/or a primary flat of the substrate (e.g., with length perpendicular to the primary flat, and with width parallel to the primary flat). The inventors have found that presence of large continuous uncracked regions of a given top area may inhibit fracture more readily than presence of numerous discontinuous uncracked regions of the same aggregate top area. Additionally, the inventors have found that orientation and/or aspect ratio of continuous uncracked regions may affect fracture inhibition. Small localized black regions indicative of uncracked regions generally do not impede separation by fracturing, but as the black regions increase in size (particularly in a width direction generally parallel to the primary flat and/or generally perpendicular to laser damage lines), such regions may identify the need for adding another laser damage formation pass at the same average depth position and/or to increase laser power when forming laser damage regions at subsequent average depth positions. Uncracked regions having a large length (e.g., in a direction perpendicular to the primary flat) may be less problematic in inhibiting fracture than uncracked regions having a large width.

Proceeding to decision block 490, one or more properties of the uncracked region(s) (optionally including at least one quantified top area property) is compared to at least one first predetermined threshold. The first threshold may include (without necessarily being limited to) any one or more of: a continuous uncracked region top area threshold, an aggregate uncracked top area threshold, a maximum uncracked width threshold, a maximum length/width aspect ratio threshold, or the like. If the at least one property of the uncracked region(s) does not exceed the at least one first predetermined threshold, then the method proceeds to block 498, according to which the substrate is transferred to a fracturing station for producing a first reduced thickness portion of the substrate (e.g., a first wafer from an ingot) generally corresponding in thickness to the first average depth position. Conversely, if the at least one property of the uncracked region(s) does exceed the at least one first predetermined threshold, then the method proceeds to block 492, according to which an instruction set (e.g., fabrication recipe), associated with the substrate, is modified by incrementally adjusting at least one laser parameter for formation of subsurface laser damage when producing subsurface laser damage patterns at a second average depth position and any subsequent average depth positions in the substrate (e.g., for formation of at least one additional reduced thickness portion of the substrate, such as second and subsequent wafers from an ingot). Laser parameters that may be adjusted include any one or more of laser power, laser focus depth, number of laser passes, laser pass spacing, laser pulse width, etc. In certain embodiments involving alteration of laser power, the instruction set is modified to increase average laser power by a value in a range of from 0.10 to 0.50 watts, or from 0.15 to 0.35 watts, or from 0.20 to 0.30 watts, or by a value of about 0.25 watts. The adjustment of one or more laser parameters for formation of subsequent laser damage at second and subsequent average depth positions is not necessarily followed by formation of additional damage at the previously established first average depth position. Determining whether additional laser damage at the first average depth position may be necessary to promote fracture is performed at decision block 494.

Decision block 494 includes a step of comparing one or more properties of uncracked region(s) (optionally including at least one quantified top area property) to at least one second predetermined threshold. In certain embodiments, the second predetermined threshold is greater than the first predetermined threshold. The second threshold may include (without necessarily being limited to) any one or more of: a continuous uncracked region top area threshold, an aggregate uncracked top area threshold, a maximum uncracked width threshold, a maximum length/width aspect ratio threshold, or the like. If the at least one property of the uncracked region(s) does not exceed the at least one second predetermined threshold, then the method proceeds to block 498, according to which the substrate is transferred to a fracturing station, since no additional laser damage is deemed necessary to support fracture of the substrate along the first average depth position. Conversely, if the at least one property of the uncracked region(s) does exceed the at least one second predetermined threshold, then the method proceeds to block 496, according to which additional subsurface laser damage is formed along the first average depth position. In certain embodiments, this entails effecting relative movement between the laser and the substrate while supplying emissions of the laser focused within the interior of the substrate, at least in the uncracked region(s) but optionally over the entire substrate, to form supplemental subsurface laser damage at or proximate to the first average depth position to supplement the at least one subsurface laser damage pattern and promote formation of additional cracks in the interior of the crystalline material propagating outward from supplemented at least one subsurface laser damage pattern. Following formation of this supplemental subsurface laser damage, the method proceeds to block 498, according to which the substrate is transferred to a fracturing station.

Proceeding to block 500, in certain embodiments a carrier may be bonded to the substrate at the fracturing station to form a bonded assembly. Thereafter, according to block 502, the crystalline material is fractured along the first depth position to separate the bonded assembly (including the carrier and a removed portion of the substrate) from the remainder of the substrate, with such step serving to expose a new top surface of the substrate. Thereafter, according to block 504, the substrate may be returned to the laser processing station (optionally after surface treatment such as grinding and/or polishing of the newly exposed substrate surface) to enable performance of another subsurface laser damage step according to block 484. If the instruction set associated with the substrate was modified to increase average laser power according to block 492, then the modified instruction set will be used for formation of subsurface damage in performance of the step described at block 484. This modified instruction set is preferably stored in a memory and associated with the particular substrate (e.g., in a record of a relational database including a substrate identifier and parameters for formation of subsurface laser damage within the substrate). In this manner, a substrate-specific recipe for forming subsurface laser damage is maintained and may be dynamically updated.

Following fracturing of the bonded assembly from the substrate at block 502, the bonded assembly may be transferred to one or more surface processing stations (according to block 506) to alter the substrate portion attached to the carrier. Examples of surface processing steps that may be performed include coarse grinding, edge grinding, fine grinding, and cleaning according to blocks 508, 510, 512, and 514, respectively. Thereafter, the processed substrate portion may be ready for epitaxial growth.

Figure 53:
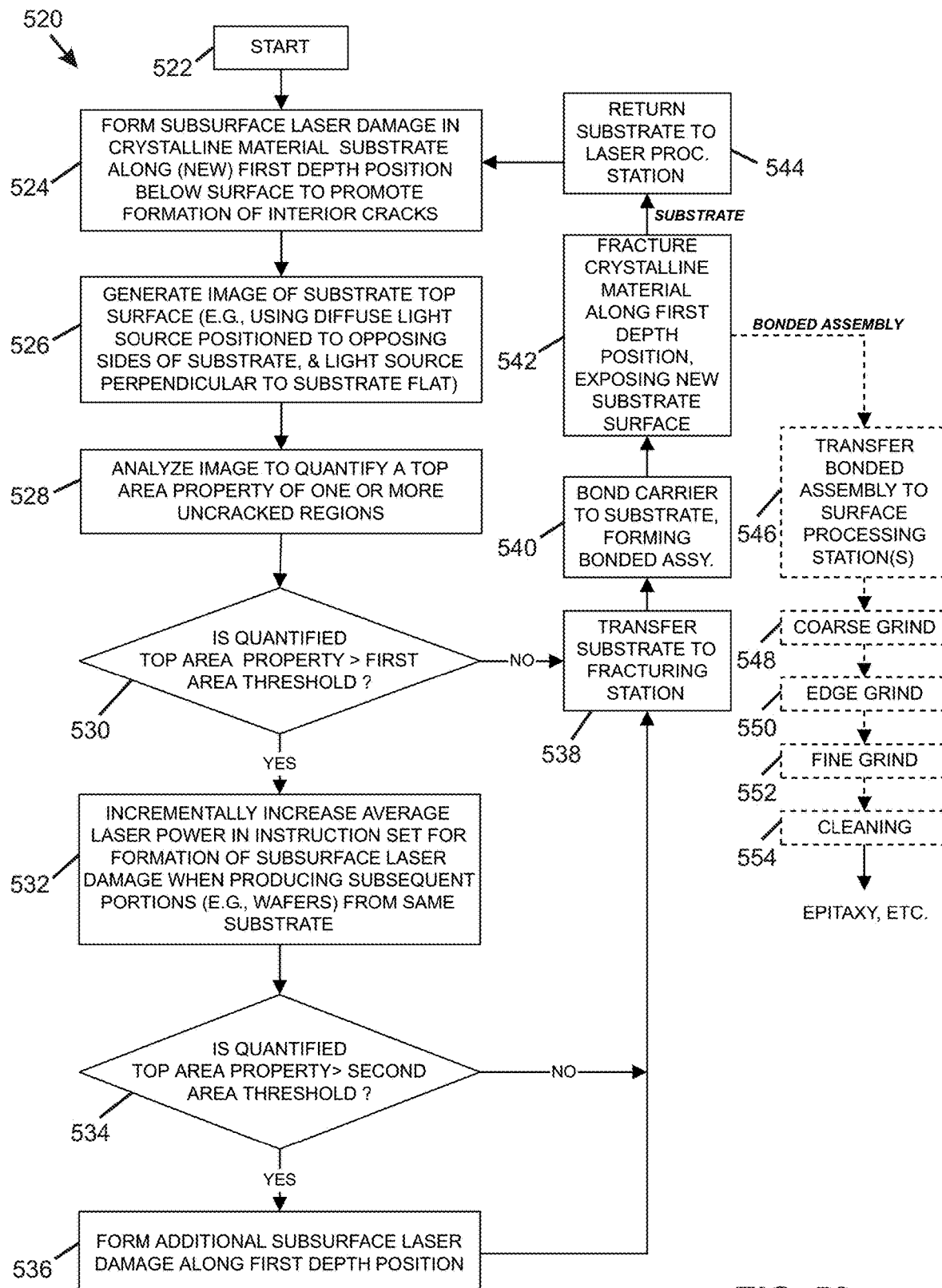
FIG. 53 is a flowchart illustrating steps in a second crystalline material processing method that includes generating an image of a top surface of a substrate having subsurface laser damage, analyzing the image to quantify a top area property of one or more uncracked regions, comparing the top area property to first and second threshold area properties, and taking action (i.e., performing an additional laser pass at the same depth position and/or adjusting power for subsurface laser damage at subsequent depth positions) responsive to the comparisons to enhance reliability of producing substrate portions (e.g., wafers) from the substrate.

FIG. 53 is a flowchart 520 illustrating steps in a second crystalline material processing method that generally includes generating an image of a top surface of a substrate having subsurface laser damage, analyzing the image to quantify a top area property of one or more uncracked regions, comparing the top area property to first and second threshold area properties, and taking action (i.e., perform an additional laser pass at the same depth position and/or adjust power for subsurface laser damage at subsequent depth positions) responsive to the comparisons to enhance reliability of producing substrate portions (e.g., wafers) from the substrate. The method is initiated at block 522. Proceeding to block 524, a first step includes forming subsurface laser damage in a crystalline material substrate having at least one subsurface laser damage pattern (optionally including at least one plurality of substantially parallel lines) along a (new) first depth position below a top surface of the substrate, wherein the at least one subsurface laser damage pattern is configured to promote formation of at least one plurality of cracks in the interior of the crystalline material propagating outward from substantially the at least one subsurface laser damage pattern. Proceeding to block 526, a second step includes generating at least one image of the top surface of the substrate. In certain embodiments, the image generating step includes illuminating the top surface with a diffuse light source arranged to a first lateral side of the substrate (preferably arranged substantially perpendicular to a primary flat of the substrate and/or within ±5 degrees of perpendicular to a <11$\bar{2}$0> direction of the hexagonal crystal structure), and capturing the at least one image with an imaging device arranged to a second lateral side of the substrate that opposes the first lateral side. In certain embodiments, one or more alternative or additional imaging methods as disclosed herein may be used.

Proceeding to block 528, a further step includes analyzing the at least one image to identify a condition indicative of presence of uncracked regions in the interior of the crystalline material (e.g., dark and/or black regions in certain embodiments), and to quantify a top area property (or at least one top area property) of one or more uncracked regions in the interior. In certain embodiments, a quantified top area property includes an aggregate top area of all uncracked regions. In certain embodiments, a quantified top area property includes separate identification of any continuous uncracked regions, together with quantification of top area of each continuous uncracked region and/or quantification of maximum length and width dimensions of the continuous uncracked regions and/or identification of length/width aspect ratio of the continuous uncracked regions. In certain embodiments, the length and width may be established relative to crystallographic direction and/or a primary flat of the substrate (e.g., with length perpendicular to the primary flat, and with width parallel to the primary flat).

Proceeding to decision block 530, the at least one quantified top area property is compared to at least one first predetermined area (or area property) threshold. The first threshold may include any one or more of: a continuous uncracked region top area threshold, an aggregate uncracked top area threshold, a maximum uncracked width threshold, a maximum length/width aspect ratio threshold, or the like. If the at least one quantified top area property does not exceed the at least one first predetermined threshold area property, then the method proceeds to block 538, according to which the substrate is transferred to a fracturing station. Conversely, if the at least one quantified top area property does exceed the at least one first predetermined threshold area property, then the method proceeds to block 532, according to which an instruction set (e.g., fabrication recipe), associated with the substrate, is modified by incrementally increasing average laser power for formation of subsurface laser damage when producing subsurface laser damage patterns at a second average depth position and any subsequent average depth positions in the substrate. (Laser parameters that may be adjusted may additionally or alternatively include any one or more of laser focus depth, number of laser passes, laser pass spacing, laser pulse width, etc.) In certain embodiments, the instruction set is modified to increase average laser power by a value in a range of from 0.10 to 0.50 watts, or from 0.15 to 0.35 watts, or from 0.20 to 0.30 watts, or by a value of about 0.25 watts. The incrementing of laser power for formation of subsequent laser damage at second and subsequent average depth positions is not necessarily followed by formation of additional damage at the previously established first average depth position. Determining whether additional laser damage may be necessary to promote fracture is performed at decision block 534.

Decision block 534 includes a step of comparing the at least one quantified top area property to at least one second predetermined threshold area property. In certain embodiments, the second predetermined threshold area property is greater than the first predetermined threshold area property. The second threshold area property may include any one or more of: a continuous uncracked region top area threshold, an aggregate uncracked top area threshold, a maximum uncracked width threshold, a maximum length/width aspect ratio threshold, or the like. If the at least one quantified top area property does not exceed the at least one second predetermined threshold area property, then the method proceeds to block 538, according to which the substrate is transferred to a fracturing station, since no additional laser damage is deemed necessary to support fracture of the substrate along the first average depth position. Conversely, if the at least one quantified top area property does exceed the at least one second predetermined threshold area property, then the method proceeds to block 536, according to which supplemental subsurface laser damage is formed along the first average depth position. In certain embodiments, this entails effecting relative movement between the laser and the substrate while supplying emissions of the laser focused within the interior of the substrate to form supplemental subsurface laser damage at or proximate to the first average depth position to supplement the at least one subsurface laser damage pattern and promote formation of additional cracks in the interior of the crystalline material propagating outward from the supplemented at least one subsurface laser damage pattern. Following formation of this supplemental subsurface laser damage, the method proceeds to block 538, according to which the substrate is transferred to a fracturing station.

Proceeding to block 540, in certain embodiments a carrier may be bonded to the substrate at the fracturing station to form a bonded assembly. Thereafter, according to block 542, the crystalline material is fractured along the first depth position to separate the bonded assembly (including the carrier and a removed portion of the substrate) and the remainder of the substrate, with such step serving to expose a new top surface of the substrate. Thereafter, according to block 544, the substrate may be returned to the laser processing station (optionally after surface treatment such as grinding and/or polishing of the newly exposed substrate surface) to enable performance of another subsurface laser damage step according to block 524. If the instruction set associated with the substrate was modified to increase average laser power according to block 532, then the modified instruction set will be used for formation of subsurface damage in performance of the step described at block 524. This modified instruction set is preferably stored in a memory and associated with the particular substrate, such as in a record of a relational database including a substrate identifier and parameters for formation of subsurface laser damage within the substrate.

Following fracturing of the bonded assembly from the substrate at block 542, the bonded assembly may be transferred to one or more surface processing stations (according to block 546) to alter the substrate portion attached to the carrier. Examples of surface processing steps that may be performed include coarse grinding, edge grinding, fine grinding, and cleaning according to blocks 548, 550, 552, and 554, respectively. Thereafter, the processed substrate portion may be ready for epitaxial growth.

Representative Computer System Useable with Systems and Methods

Figure 54:
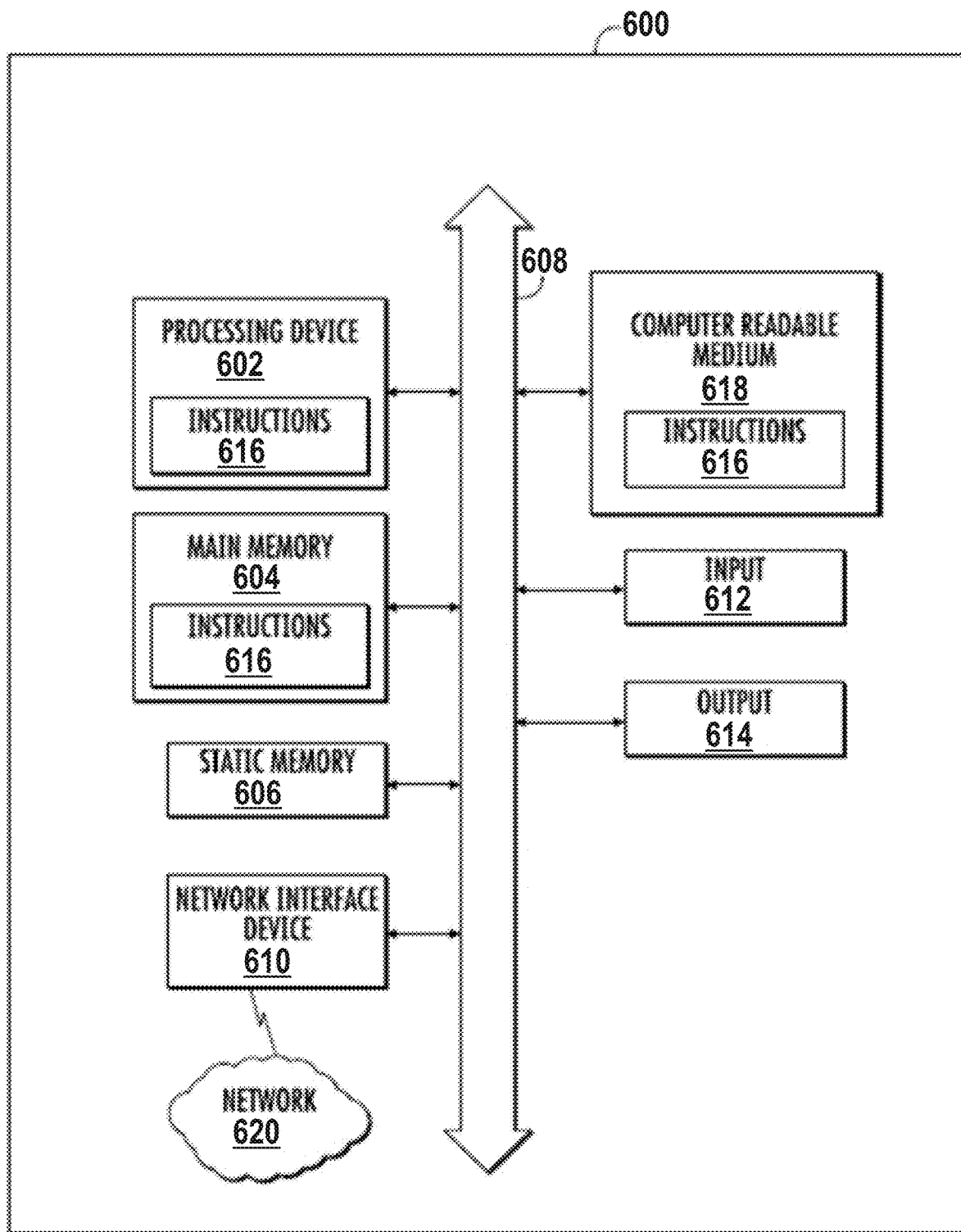
FIG. 54 is a schematic diagram of a generalized representation of a computer system that can be included in any component of the systems or methods disclosed herein.

FIG. 54 is a schematic diagram of a generalized representation of a computer system 600 (optionally embodied in a computing device) that can be included in any component of the systems or methods disclosed herein. In this regard, the computer system 600 is adapted to execute instructions from a computer-readable medium to perform these and/or any of the functions or processing described herein. In this regard, the computer system 600 in FIG. 54 may include a set of instructions that may be executed to program and configure programmable digital signal processing circuits for supporting scaling of supported communications services. The computer system 600 may be connected (e.g., networked) to other machines in a LAN, an intranet, an extranet, or the Internet. While only a single device is illustrated, the term "device" shall also be taken to include any collection of devices that individually or jointly execute a set (or multiple sets) of instructions to perform any one or more of the methodologies discussed herein. The computer system 600 may be a circuit or circuits included in an electronic board card, such as a printed circuit board (PCB), a server, a personal computer, a desktop computer, a laptop computer, a personal digital assistant (PDA), a computing pad, a mobile device, or any other device, and may represent, for example, a server or a user's computer.

The computer system 600 in this embodiment includes a processing device or processor 602, a main memory 604 (e.g., read-only memory (ROM), flash memory, dynamic random access memory (DRAM), such as synchronous DRAM (SDRAM), etc.), and a static memory 606 (e.g., flash memory, static random access memory (SRAM), etc.), which may communicate with each other via a data bus 608.

Alternatively, the processing device 602 may be connected to the main memory 604 and/or static memory 606 directly or via some other connectivity means. The processing device 602 may be a controller, and the main memory 604 or static memory 606 may be any type of memory.

The processing device 602 represents one or more general-purpose processing devices, such as a microprocessor, central processing unit, or the like. More particularly, the processing device 602 may be a complex instruction set computing (CISC) microprocessor, a reduced instruction set computing (RISC) microprocessor, a very long instruction word (VLIW) microprocessor, a processor implementing other instruction sets, or other processors implementing a combination of instruction sets. The processing device 602 is configured to execute processing logic in instructions for performing the operations and steps discussed herein.

The computer system 600 may further include a network interface device 610. The computer system 600 also may or may not include an input 612, configured to receive input and selections to be communicated to the computer system 600 when executing instructions. The computer system 600 also may or may not include an output 614, including but not limited to a display, a video display unit (e.g., a liquid crystal display (LCD) or a cathode ray tube (CRT)), an alphanumeric input device (e.g., a keyboard), and/or a cursor control device (e.g., a mouse).

The computer system 600 may or may not include a data storage device that includes instructions 616 stored in a computer readable medium 618. The instructions 616 may also reside, completely or at least partially, within the main memory 604 and/or within the processing device 602 during execution thereof by the computer system 600, the main memory 604 and the processing device 602 also constituting computer readable medium. The instructions 616 may further be transmitted or received over a network 620 via the network interface device 610.

While the computer readable medium 618 is shown in an embodiment to be a single medium, the term "computer-readable medium" should be taken to include a single medium or multiple media (e.g., a centralized or distributed database, and/or associated caches and servers) that store the one or more sets of instructions. The term "computer readable medium" shall also be taken to include any medium that is capable of storing, encoding, or carrying a set of instructions for execution by the processing device and that cause the processing device to perform any one or more of the methodologies of the embodiments disclosed herein. The term "computer readable medium" shall accordingly be taken to include, but not be limited to, solid-state memories, optical media, and magnetic media.

The embodiments disclosed herein include various steps. The steps of the embodiments disclosed herein may be executed or performed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product, or software, that may include a machine-readable medium (or computer readable medium) having stored thereon instructions which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes: a machine-readable storage medium (e.g., ROM, random access memory ("RAM"), a magnetic disk storage medium, an optical storage medium, flash memory devices, etc.); and the like.

Unless specifically stated otherwise and as apparent from the previous discussion, it is appreciated that throughout the description, discussions utilizing terms such as "analyzing," "processing," "computing," "determining," "displaying," or the like, refer to the action and processes of a computer system, or a similar electronic computing device, that manipulates and transforms data and memories represented as physical (electronic) quantities within registers of the computer system into other data similarly represented as physical quantities within the computer system memories or registers or other such information storage, transmission, or display devices.

The algorithms and displays presented herein are not inherently related to any particular computer or other apparatus. Various systems may be used with programs in accordance with the teachings herein, or it may prove convenient to construct more specialized apparatuses to perform the required method steps. The required structure for a variety of these systems is disclosed in the description above. In addition, the embodiments described herein are not described with reference to any particular programming language. It will be appreciated that a variety of programming languages may be used to implement the teachings of the embodiments as described herein.

Those of skill in the art will further appreciate that the various illustrative logical blocks, modules, circuits, and algorithms described in connection with the embodiments disclosed herein may be implemented as electronic hardware, instructions stored in memory or in another computer readable medium and executed by a processor or other processing device, or combinations of both. The components of the system described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends on the particular application, design choices, and/or design constraints imposed on the overall system. Skilled artisans may implement the described functionality in varying ways for each particular application, but such implementation decisions should not be interpreted as causing a departure from the scope of the present embodiments.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA), or other programmable logic device, a discrete gate or transistor logic, discrete hardware components, or any combination thereof designed to perform the functions described herein. Furthermore, a controller may be a processor. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The embodiments disclosed herein may be embodied in hardware and in instructions that are stored in hardware, and may reside, for example, in RAM, flash memory, ROM, Electrically Programmable ROM (EPROM), Electrically Erasable Programmable ROM (EEPROM), registers, a hard disk, a removable disk, a CD-ROM, or any other form of computer readable medium known in the art. A storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the embodiments may be combined. Those of skill in the art will also understand that information and signals may be represented using any of a variety of technologies and techniques. For example, data, instructions, commands, information, signals, bits, symbols, and chips, which may be referenced throughout the above description, may be represented by voltages, currents, electromagnetic waves, magnetic fields, particles, optical fields, or any combination thereof.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that any particular order be inferred.

It is contemplated that any or more features or characteristics of any one or more embodiments disclosed herein may be combined with those of other embodiments, unless specifically indicated to the contrary herein.

Technical benefits that may be obtained by one or more embodiments of the disclosure may include: enhanced reproducibility of manufacturing wafers of uniform thickness from a crystalline material substrate (e.g., ingot) by laser processing and subsequent fracture while avoiding unnecessary material loss; addressing variation in laser power requirements from substrate to substrate as well as at different depth positions in a single substrate when performing laser-assisted parting methods; enhanced detection of uncracked regions within a crystalline material substrate having subsurface laser damage; reduced crystalline material kerf losses compared to wire sawing; reduced processing time and increased throughput of crystalline material wafers and resulting devices compared to wire sawing; reduced laser processing time compared to prior laser-based methods; reduced forces required to effectuate fracture along laser damage regions; reduced need for post-separation surface smoothing to remove laser damage following separation; and/or reduced crystalline material bowing and breakage.

Those skilled in the art will recognize improvements and modifications to the preferred embodiments of the present disclosure. All such improvements and modifications are considered within the scope of the concepts disclosed herein and the claims that follow.

What is claimed is:

1. A crystalline material processing method comprising:
supplying emissions of a laser focused along a first average depth position within an interior of a crystalline material of a substrate, and effecting relative lateral movement between the laser and the substrate, to form subsurface laser damage having at least one subsurface laser damage pattern;
following formation of the at least one subsurface laser damage pattern, generating at least one image of a top surface of the substrate;
analyzing the at least one image to identify a condition indicative of presence of uncracked regions in the interior of the substrate; and
responsive to the analyzing, performing at least one of the following steps (i) or (ii):
(i) effecting relative movement between the laser and the substrate while supplying emissions of the laser focused within the interior of the substrate in at least the uncracked regions to form supplemental subsurface laser damage to supplement the at least one subsurface laser damage pattern along or proximate to the first average depth position, for formation of a first reduced thickness portion of the substrate;
(ii) changing an instruction set, associated with the substrate, for forming subsurface laser damage when producing subsurface laser damage patterns at a second average depth position, for formation of at least one additional reduced thickness portion of the substrate.

2. The crystalline material processing method of claim 1, being configured to perform both steps (i) and (ii) responsive to the analyzing.

3. The crystalline material processing method of claim 1, wherein step (i) comprises adjusting at least one of (a) average laser power, or (b) laser focusing depth relative to an exposed surface of the substrate, when producing the supplemental subsurface laser damage to supplement the at least one subsurface laser damage pattern and promote formation of additional cracks in the uncracked regions along or proximate to the first average depth position.

4. The crystalline material processing method of claim 1, wherein step (ii) comprises adjusting at least one of (a) average laser power, (b) laser focusing depth relative to an exposed surface of the substrate, or (c) number of laser damage formation passes, when producing subsurface laser damage patterns at the second average depth position and any subsequent average depth positions in the substrate.

5. The crystalline material processing method of claim 1, wherein the substrate comprises a generally round edge having a primary flat, and the generating of the at least one image comprises (a) illuminating the top surface with diffuse light generated by a light source arranged to a first lateral side of the substrate and arranged substantially perpendicular to the primary flat, and (b) capturing the at least one image with an imaging device arranged to an opposing second lateral side of the substrate.

6. The crystalline material processing method of claim 1, wherein:
the crystalline material comprises a hexagonal crystal structure; and
the generating of the at least one image comprises (a) illuminating the top surface with diffuse light generated by a light source arranged to a first lateral side of the substrate and arranged within ±5 degrees of perpendicular to a <11$\bar{2}$0> direction of the hexagonal crystal structure, and (h) capturing the at least one image with an imaging device arranged to a second lateral side of the substrate that opposes the first lateral side.

7. The crystalline material processing method of claim 1, wherein:
   the at least one subsurface laser damage pattern comprises a first subsurface laser damage pattern and a second subsurface laser damage pattern that is formed after the first subsurface laser damage pattern;
   the first subsurface laser damage pattern comprises a first plurality of substantially parallel lines and the second subsurface laser damage pattern comprises a second plurality of substantially parallel lines;
   lines of the second plurality of substantially parallel lines are interspersed among lines of the first plurality of substantially parallel lines; and
   at least some lines of the second plurality of substantially parallel lines do not cross any lines of the first plurality of substantially parallel lines.

8. The crystalline material processing method of claim 1, further comprising fracturing the crystalline material substantially along the at least one subsurface laser damage pattern to yield first and second crystalline material portions each having reduced thickness relative to the substrate, but substantially a same length and width as the substrate.

9. A crystalline material processing method comprising:
   supplying laser emissions focused within an interior of a crystalline material of a substrate, and effecting relative lateral movement between the laser and the substrate, to form a first pattern of subsurface laser damage sites distributed among non-overlapping first and second areas of the substrate;
   supplying laser emissions focused within the interior of the crystalline material of the substrate, and effecting relative lateral movement between the laser and the substrate, to form a second pattern of subsurface laser damage sites distributed among the non-overlapping first and second areas of the substrate, wherein at least some subsurface laser damage sites of the second pattern of subsurface laser damage sites do not cross subsurface laser damage sites of the first pattern of subsurface laser damage sites;
   detecting presence of a condition indicative of non-uniform doping of the crystalline material across at least a portion of a surface of the substrate, the non-uniform doping including at least one first doping region and at least one second doping region; and
   responsive to detection of the condition indicative of non-uniform doping of the crystalline material, altering laser power to provide laser emissions at a first average power when forming subsurface laser damage in a first doping region and provide laser emissions at a second average power that differs from the first average power when forming subsurface laser damage in a second doping region, during formation of the first pattern of subsurface laser damage sites and the second pattern of subsurface laser damage sites.

10. The crystalline material processing method of claim 9, wherein the substrate comprises a generally round edge having a primary flat, and wherein the detecting of presence of the condition indicative of non-uniform doping of the crystalline material comprises generating at least one image of the substrate, comprising (a) illuminating a top surface of the substrate with diffuse light generated by a light source arranged to a first lateral side of the substrate and arranged substantially perpendicular to the primary flat, and (b) capturing the at least one image with an imaging device arranged to an opposing second lateral side of the substrate.

11. The crystalline material processing method of claim 9, wherein:
   the crystalline material comprises a hexagonal crystal structure; and
   the detecting of presence of the condition indicative of non-uniform doping of the crystalline material comprises generating at least one image of the substrate, comprising (a) illuminating a top surface of the substrate with diffuse light generated by a light source arranged to a first lateral side of the substrate and arranged within +5 degrees of perpendicular to a <11$\bar{2}$0> direction of the hexagonal crystal structure, and (b) capturing the at least one image with an imaging device arranged to a second lateral side of the substrate that opposes the first lateral side.

12. The crystalline material processing method of claim 9, further comprising fracturing the crystalline material substantially along the first and second patterns of subsurface laser damage sites to yield first and second crystalline material portions each having reduced thickness relative to the substrate, but substantially a same length and width as the substrate.

* * * * *